(12) United States Patent
Nakamura et al.

(10) Patent No.: US 6,537,874 B2
(45) Date of Patent: Mar. 25, 2003

(54) METHOD FOR FABRICATING SEMICONDUCTOR DEVICE HAVING A CAPACITOR

(75) Inventors: Shunji Nakamura, Kawasaki (JP); Masatoshi Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/815,012

(22) Filed: Mar. 23, 2001

(65) Prior Publication Data

US 2002/0024085 A1 Feb. 28, 2002

(30) Foreign Application Priority Data

Aug. 31, 2000 (JP) ........................................ 2000-263517

(51) Int. Cl.$^7$ .......................................... H01L 21/8242
(52) U.S. Cl. ...................................... 438/253; 438/396
(58) Field of Search ................................ 438/238–240, 438/253–256, 381, 396–399

(56) References Cited

U.S. PATENT DOCUMENTS

| | | | | |
|---|---|---|---|---|
| 5,354,705 A | * | 10/1994 | Mathews et al. | 438/397 |
| 5,466,636 A | * | 11/1995 | Cronin et al. | |
| 5,518,948 A | * | 5/1996 | Walker | |
| 5,821,141 A | * | 10/1998 | Huang | 438/253 |
| 5,998,257 A | * | 12/1999 | Lane et al. | 438/253 |
| 6,153,510 A | * | 11/2000 | Ishibashi | 438/622 |
| 6,159,840 A | * | 12/2000 | Wang | 438/618 |
| 6,188,100 B1 | * | 2/2001 | Hermes | 257/309 |
| 6,359,307 B1 | * | 3/2002 | Wang et al. | 257/332 |

* cited by examiner

*Primary Examiner*—Jey Tsai
(74) *Attorney, Agent, or Firm*—Armstrong, Westerman & Hattori, LLP

(57) ABSTRACT

Insulation films 45, 56 having a contact hole 58 are formed on a substrate. A dummy plug 62 is formed in the contact hole 58. Insulation films 64, 66 are formed on the insulation film 56. An opening 70 for exposing at least a part of the dummy plug 62 is formed in the insulation films 64, 66. The dummy plug 62 is selectively removed through the opening 70. A storage electrode 72 is formed in the contact hole 58 and the opening 70. The insulation film 66 is selectively removed. A dielectric film 74 and a plate electrode are formed on the storage electrode 72. Whereby, without an extra support for supporting the storage electrode 72, the storage electrode 72 is prevented form falling down or peeling off, and defective contact and breakage of the lower structure due to disalignment can be precluded.

11 Claims, 49 Drawing Sheets

METHOD FOR FABRICATING SEMICONDUCTOR DEVICE HAVING A CAPACITOR

BACKGROUND OF THE INVENTION

The present invention relates to a semiconductor device fabrication technique, more specifically a semiconductor device including DRAM-type memory device, and a method for fabricating the same.

A DRAM is a semiconductor device which can be formed of one transistor and one capacitor. Various structures and fabrication methods have been conventionally studied for semiconductor devices of higher density and higher integration. Especially for a structure of a capacitor of a DRAM, which much influences higher integration, it is significant how to ensure a required storage capacitance without preventing higher integration of the device.

For higher integration, it is essential to reduce a memory cell area and to reduce also an area where a capacitor is to be formed. Then, it has been proposed that a column-shaped or a cylindrical capacitor structure is used so that the capacitor can have a surface area which is increased in the direction of the height, whereby a required storage capacitance can be ensured without increasing an area occupied by a region where the capacitor is formed.

A method for fabricating a conventional semiconductor device having a cylindrical capacitor structure will be explained with reference to FIGS. 41A–41C, 42A–42B, and 43A–43B. A method for fabricating a conventional semiconductor device having a column-shaped capacitor structure has the same basic fabrication process.

First, in the same way as in the method for fabricating a usual MOS transistor, a memory cell transistor including a gate electrode 102 and source/drain diffused layers 104, 106, and a peripheral circuit transistor including a gate electrode 108 and a source/drain diffused layer 110 are formed on a silicon substrate 100.

Next, a bit line 114 electrically connected respectively to the source/drain diffused layer 104 through a plug 112 and an interconnection layer 116 electrically connected to the source/drain diffused layer 110 through a plug 115 are formed on an inter-layer insulation film 118 covering the memory cell transistor and the peripheral circuit transistor. In the figure, the bit line 114 is indicated by the dotted line because the bit line 114 does not appear in the shown section.

Then, an inter-layer insulation film 120 is formed on the inter-layer insulation film 118 having the bit line 114 and the interconnection layer 116 formed thereon (FIG. 41A).

Next, a plug 124 electrically connected to the source/drain diffused layer 106 through a plug 122 is buried in the inter-layer insulation films 120, 118 (FIG. 41B).

Then, on the inter-layer insulation film 120 with the plug 124 buried in, an etching stopper film 126 of, e.g., a silicon nitride film, an inter-layer insulation film 128 of, e.g., a silicon oxide film, an etching stopper film 130 of, e.g., a silicon nitride film, an inter-layer insulation film 132 of, e.g., a silicon oxide film, and a hard mask 134 of, e.g., an amorphous silicon film are sequentially formed by, e.g., CVD method.

Then, the hard mask 134, the inter-layer insulation film 132, the etching stopper film 130, the inter-layer insulation film 128 and the etching stopper film 126 are patterned by the lithography and etching to form an opening 136 down to the plug 124 (FIG. 41C).

Then, a storage electrode 138 connected to the plug 124 is formed along the inside wall and the bottom of the opening 136 (FIG. 42A).

Next, with the etching stopper film 130 as a stopper, the inter-layer insulation film 132 is isotropically etched to expose the outside surface of the storage electrode 138 (FIG. 42B). The etching stopper film 130 and the inter-layer insulation film 128 function as a support for preventing the storage electrode 138 from falling down or peeling off in the steps following the etching step.

Then, a dielectric film of, e.g., $Ta_2O_5$ film or BST film is formed on the entire surface by, e.g., CVD method to form a capacitor dielectric film 140 of the dielectric film, covering the storage electrode 138.

Next, a conducting film is deposited on the entire surface by, e.g., CVD method and patterned to form a plate electrode 142 of the conducting film, covering the storage electrode 138 interposing the capacitor dielectric film 140 therebetween (FIG. 43A).

Thus, a capacitor including the storage electrode 138, the capacitor dielectric film 140 and the plate electrode 142 and connected electrically to the source/drain diffused layer 106 of a memory cell transistor is formed.

Then, a silicon oxide film is deposited on the entire surface by, e.g., CVD method, and the surface of the silicon oxide film is planarized to form an inter-layer insulation film 144 of the silicon oxide film.

Next, a contact hole 146 is formed by the lithography and etching through the inter-layer insulation film 144, the etching stopper film 130, the inter-layer insulation film 128, the etching stopper film 126 and the inter-layer insulation film 120.

Then, a plug 148 connected to the interconnection layer 116 is formed in the contact hole 146 (FIG. 43B).

Next, an interconnection layer (not shown) connected to the plug 148, etc. are formed.

Thus, a DRAM comprising memory cells each having one transistor and one capacitor is fabricated.

As described above, in the conventional method for fabricating the conventional semiconductor device, the etching stopper film 130 and the inter-layer insulation film 128 are provided to thereby prevent the storage electrode 138 from falling down or peeling off in the process, and the semiconductor device including the cylindrical capacitor can be fabricated.

On the other hand, a method which prevents the storage electrode 138 from peeling off without the use of the support has been proposed. Another conventional method for fabricating a semiconductor device, which uses no support for a storage electrode 138 will be explained with reference to FIGS. 44A–44B, 45A–45B, and 46A–46B.

First, in the same way as in the semiconductor device fabrication method shown in FIG. 41A, a memory cell transistor, a peripheral circuit transistor, a bit line 114, an interconnection layer 116, inter-layer insulation films 118, 120, etc. are formed on a silicon substrate 100 (FIG. 44A).

Then, an etching stopper film 126 of, e.g, a silicon nitride film is formed on the inter-layer insulation film 120 by, e.g., CVD method.

Next, the etching stopper film 126 is patterned by the lithography and etching to be removed in a region where a contact hole for connecting the plug 122 to a storage electrode 138 to be formed later is to be formed.

Next, an inter-layer insulation film 132 of, e.g., a silicon oxide film, and a hard mask 134 of, e.g., an amorphous silicon film are formed on the patterned etching stopper film 126 by, e.g., CVD method in the stated order.

Then, the hard mask 134 is patterned by the lithography and etching to remove the hard mask 134 in the region where the storage electrode 138 is to be formed (FIG. 44B).

Next, with the hard mask 134 as a mask and with the etching stopper film 126 as a stopper, the inter-layer insulation films 132, 120, 118 are anisotropically etched to form an opening 136 down to the plug 122 through the inter-layer insulation film 132, the etching stopper film 126, the inter-layer insulation films 120, 118 (FIG. 45A).

Then, the storage electrode 138 connected to the plug 122 is formed along the inside wall and bottom of the opening 136 (FIG. 45B).

Then, with the etching stopper film 126 as a stopper, the inter-layer insulation film 132 is isotropically etched to expose the outside surface of the storage electrode 138 (FIG. 46A).

The storage electrode 138 also functions as a plug for connection to the plug 122, and is formed, buried in the inter-layer insulation films 118, 120, whereby the storage electrode 138 is prevented from falling down or peeling off in the steps following the etching step. Accordingly, it is not necessary that the support is provided by the etching stopper film 130, the inter-layer insulation film 128, etc. as in the above-described semiconductor device fabrication method.

Then, in the same way as in the above-described semiconductor device fabrication method, a capacitor dielectric film 140, a plate electrode 142, an inter-layer insulation film 144, a plug 148, etc. are formed (FIG. 46B).

Thus, a DRAM comprising memory cells each having one transistor and one capacitor is fabricated.

As described above, in the method for fabricating said another conventional semiconductor device, the storage electrode is formed integral with the plug, which makes it unnecessary to additionally provide the support for the storage electrode. A thickness of the insulation film through which the plug 148 is passed can be smaller by a thickness of the etching stopper film 130 and the inter-layer insulation film 128. Accordingly, the steps of forming the insulation film can be omitted, and it is easy to open the contact hole 146 and bury a plug material forming the plug 148. The fabrication process can be accordingly simplified, and the fabrication cost can be low.

However, in using the above-described method for fabricating the semiconductor device shown in FIGS. 41A–41C, 42A–42B, and 43A–43B, it is necessary as described above to add the steps of forming the support for the storage electrode 138, and the contact hole 146 for the plug 148 to be buried in is deep, which increases the fabrication cost and makes its processing itself difficult.

In using the cylindrical storage electrode 138, because the plug 124 contacts an outside atmosphere through the thin storage electrode 138, the upper surface of the plug 124 is often oxidized through the storage electrode 138 when the substrate is exposed to the oxidizing atmosphere in the step of forming the capacitor dielectric film 140, which deteriorates contact characteristics between the storage electrode 138 and the plug 124.

In using the above-described conventional semiconductor device fabrication method shown in FIGS. 44A–44B, 45A–45B, and 46A–46B, the above-described problem of the semiconductor device shown in FIGS. 41A–41C, 42A–42B, and 43A–43B can be solved. However, disalignment in patterning the etching stopper film 126 or the hard mask 134 often causes defective contact of the storage electrode 138 to the plug 122 and breakage of the lower structure due to etching.

The storage electrode 138 is formed in the opening 136 formed with the hard mask as a mask, and as shown in FIG. 47, the pattern of the opening 136 is a flat shape extended in the direction of extension of the bit line 114. This makes the alignment difficult especially in the direction of extension of a word line (a gate electrode 102) in patterning the etching stopper film 126 and the hard mask 134.

When disalignment takes place in the direction of extension of the word line in patterning the hard mask 134 to overlap, as shown in FIG. 48, the opening pattern of the etching stopper film 126 over an edge of the opening pattern of the hard mask 134, the opening 136 is formed in the inter-layer insulation films 120, 118 in a width which is smaller than the pattern formed in the etching stopper film 126, because one of two sides of the opening 136 formed in the inter-layer insulation films 120, 118, which are extended in the direction of extension of the word line is defined by the etching stopper film 126 and the other of the two sides is defined by the hard mask 134. As a result, the micro-loading effect makes the etching difficult, and a contact area between the storage electrode 138 and the plug 122 is decreased. In a worst case, the storage electrode 138 and the plug 122 cannot contact each other (FIG. 49A). Especially in performing the etching in self-alignment with the bit line, the micro-loading effect is more influential because the opening 136 is tapered downward, contouring the etching stopper film formed on the side wall of the bit line.

These phenomena are true with the case that the patterning of the etching stopper film 126 is in the direction of extension of the word line.

When the contact has been successfully opened, but the inter-layer insulation film 132 is etched after the formation of the storage electrode 138, because the region where the etching stopper film 126 is absent is present below the inter-layer insulation film 132, the inter-layer insulation films 120, 118, etc. are etched concurrently with the etching of the inter-layer insulation film 132, which damages the below structure (FIG. 49B).

A semiconductor device structure and a method for fabricating the same which can prevent the storage electrode from falling down or peeling off without the presence of the support for the storage electrode, and which are free from the defective contact and the breakage of the lower structure by disalignment in forming the opening 136 have been expected in consideration of the above-described problems.

SUMMARY OF THE INVENTION

It is an object of the present invention to provide a semiconductor device and a method for fabricating the semiconductor device which can prevent the storage electrode from falling down or peeling off without the presence of the support for the storage electrode, and are free from the defective contact and the breakage of the lower structure by disalignment.

According to one aspect of the present invention, there is provided a semiconductor device comprising: a first insulation film formed on a substrate, the first insulation film having a contact hole down to the substrate; a first electrode including a contact part formed in the contact hole, and a projection part connected to only a part of the upper surface of the contact part and projected above the first insulation film, the contact part and the projection part being formed of the same conducting layer; a dielectric film formed on the first electrode; and a second electrode formed on the dielectric film and opposed to the first electrode.

According to another aspect of the present invention, there is provided a method for fabricating a semiconductor device comprising the steps of: forming on a substrate a first insulation film having a contact hole formed therein; forming a dummy plug in the contact hole; forming a second insulation film on the first insulation film with the dummy plug buried in; forming in the second insulation film an opening for exposing at least a part of the dummy plug; selectively removing the dummy plug through the opening; and forming in the contact hole and the opening a first electrode electrically connected to the substrate.

According to further another aspect of the present invention, there is provided a method for fabricating a semiconductor device comprising the steps of: forming on a substrate a first insulation film having a contact hole formed therein; forming on the first insulation film a second insulation film, leaving a void in the contact hole; forming in the second insulation film an opening down to the void; and forming in the contact hole and the opening a first electrode, electrically connected to the substrate.

According to further another aspect of the present invention, there is provided a method for fabricating a semiconductor device comprising the steps of: forming on a substrate a first insulation film having a contact hole formed therein; forming a dummy plug in the contact hole; forming a second insulation film on the first insulation film with the dummy plug buried in; forming in the second insulation film an opening for exposing at least a part of the dummy plug; selectively removing the dummy plug through the opening; and forming in the contact hole and the opening a conducting film, electrically connected to the substrate.

According to further another aspect of the present invention, there is provided a method for fabricating a semiconductor device comprising the steps of: forming on a substrate a first insulation film having a contact hole formed therein; forming on the first insulation film a second insulation film, leaving a void in the contact hole; forming in the second insulation film an opening down to the void; and forming in the contact hole and the opening a conducting film, electrically connected to the substrate.

A "substrate" used in the specification of the present application means not only a semiconductor substrate itself, such as a silicon substrate, but also a semiconductor substrate with transistors, an interconnection layer, insulation films, etc. formed on.

A "conducting film" includes not only electrodes, such as storage electrodes, but also interconnection layers, such as buried interconnections, etc.

As described above, according to the present invention, the dummy plug is formed in the lower inter-layer insulation film, the dummy plug is removed after the opening to be used in forming the storage electrode in the upper inter-layer insulation film has been formed, and the storage electrode is formed partially buried in the contact hole from which the dummy plug has been removed. Accordingly, without an extra support for supporting the storage electrode, the storage electrode is prevented form falling down or peeling off, and defective contact and breakage of the lower structure due to disalignment can be precluded.

DETAILED DESCRIPTION OF THE DRAWINGS

FIGS. 3A–3D, 4A–4C, 5A–5B, 6A–6B, 7A–7B, 8A–8D, 9A–9C, 10A–10B, 11A–11B, 12A–12B, 14A–14B, and 15A–15B are sectional views of the semiconductor device according to the first embodiment of the present invention in the steps of the method for fabricating the same, which show the method.

Figure 13:
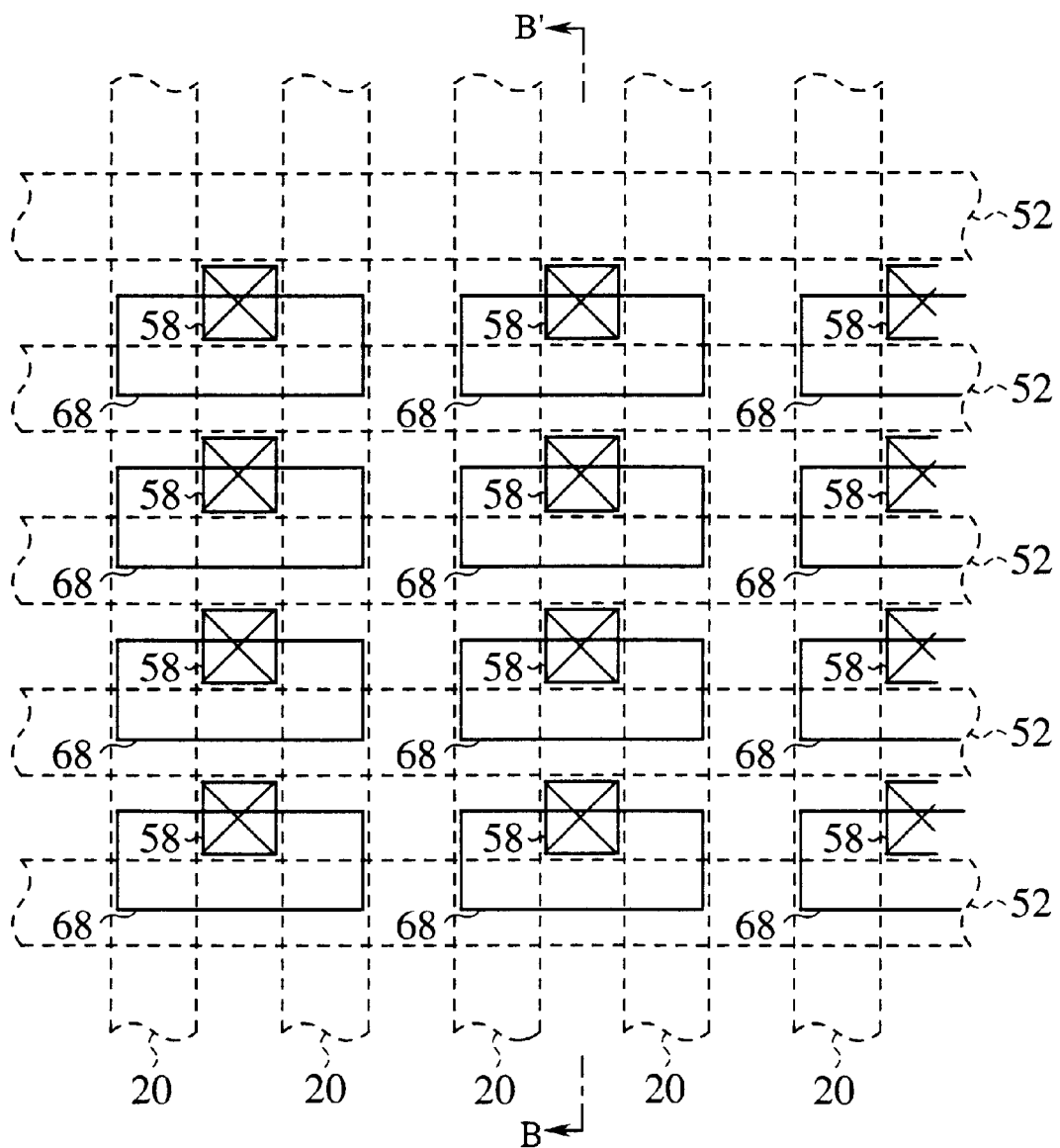

FIG. 13 is a plan view showing a pattern layout for a case of disalignment.

Figure 16A:
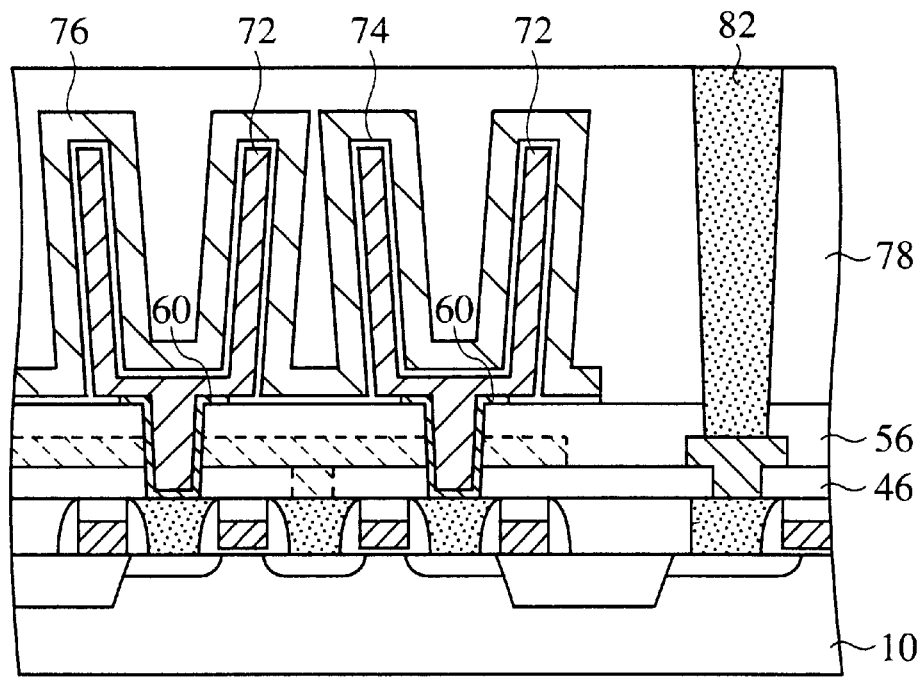
Figure 16B:
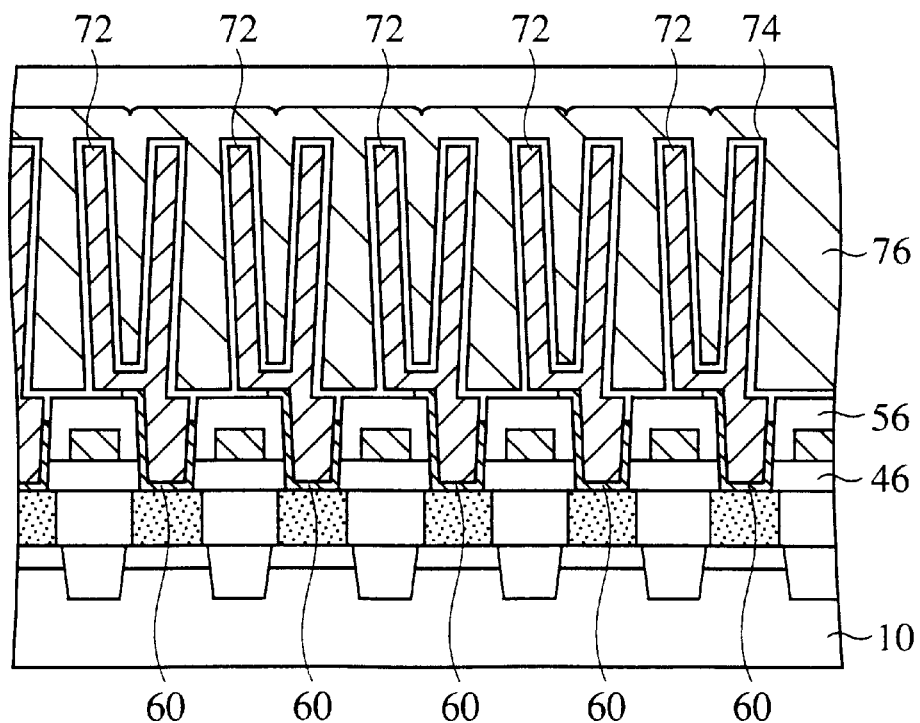

FIGS. 16A and 16B are diagrammatic sectional views of the semiconductor device according to a second embodiment of the present invention, which show a structure thereof.

FIGS. 17A–17B, 18A–18B, 19A–19B, 20A–20B, 21A–21B, 22A–22B, 23A–23B, and 24A–24B are sectional views of the semiconductor device according to the second embodiment of the present invention in the steps of the method for fabricating the same, which show the method.

Figure 25:
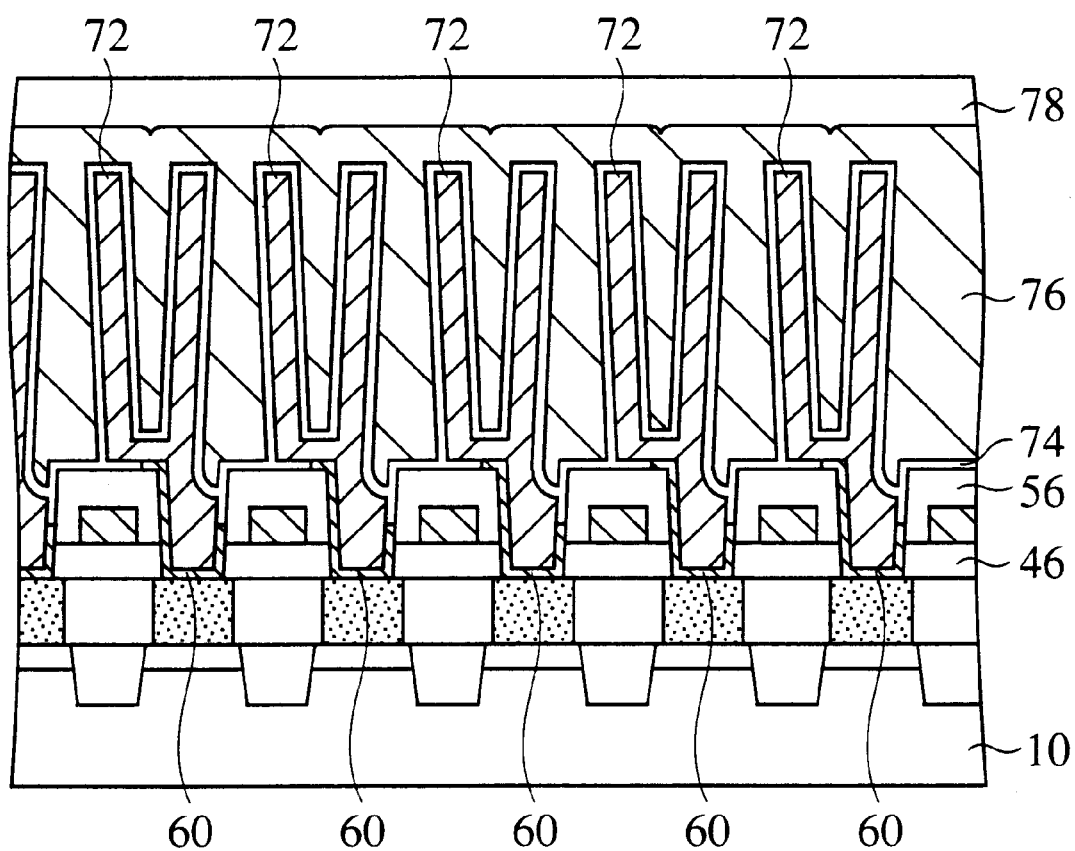

FIG. 25 is a diagrammatic sectional view of the semiconductor device according to a third embodiment of the present invention, which shows the structure thereof.

FIGS. 26A–26B, 27A–27B, 28A–28B, and 29A–29B are sectional views of the semiconductor device according to the third embodiment of the present invention in the steps of the method for fabricating the same, which show the method.

Figure 30A:
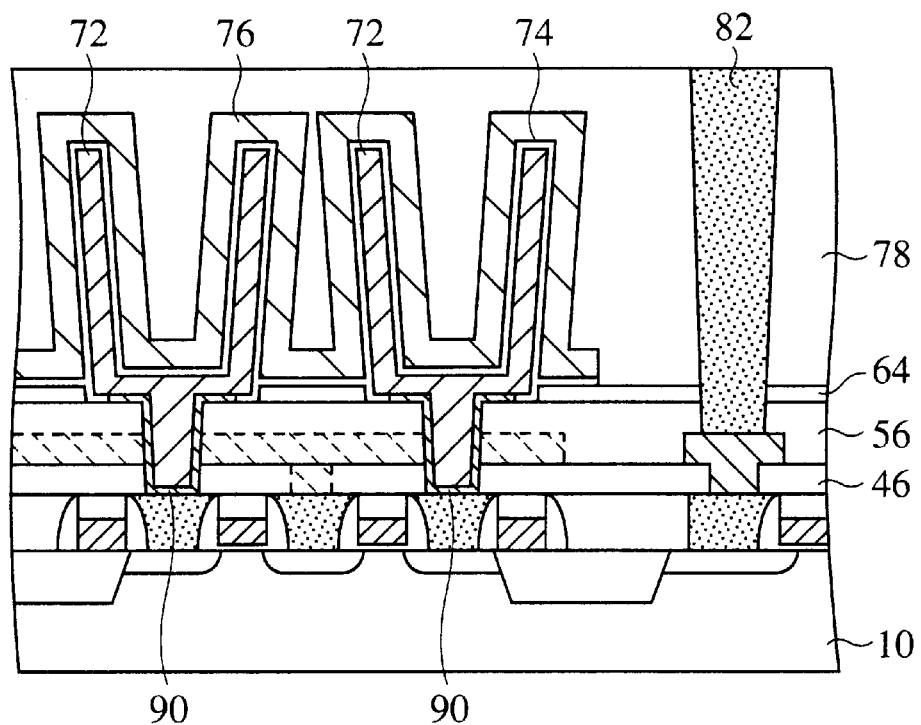
Figure 30B:
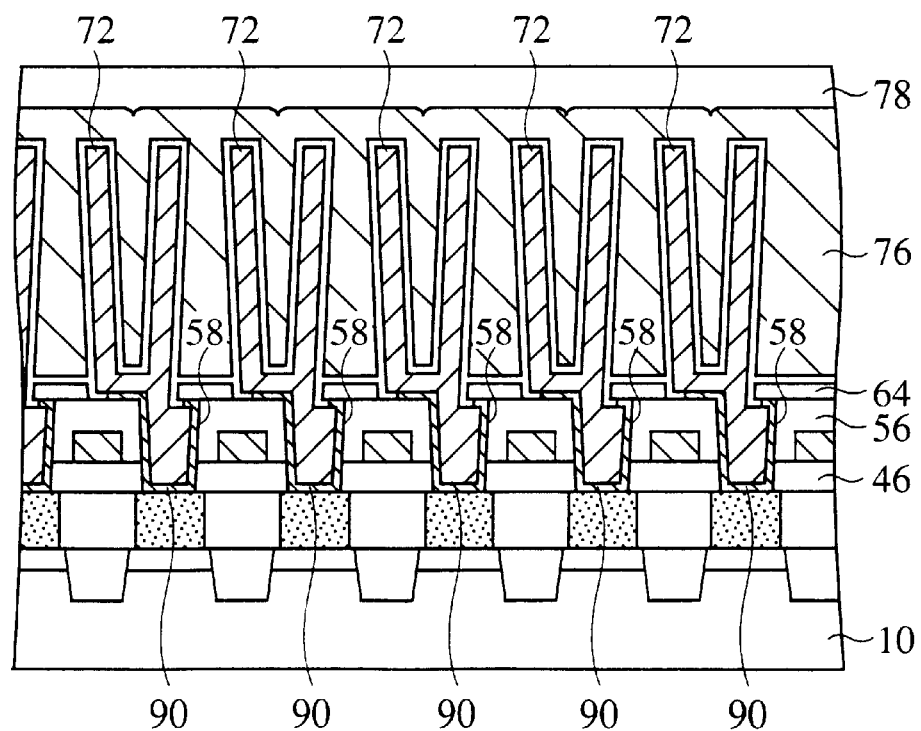

FIGS. 30A and 30B are diagrammatic sectional views of the semiconductor device according to a fourth embodiment of the present invention, which show a structure thereof.

FIGS. 31A–31B, 32A–32B, 33A–33B, and 34A–34B are sectional views of the semiconductor device according to the fourth embodiment of the present invention in the steps of the method for fabricating the same, which show the method.

Figure 35:
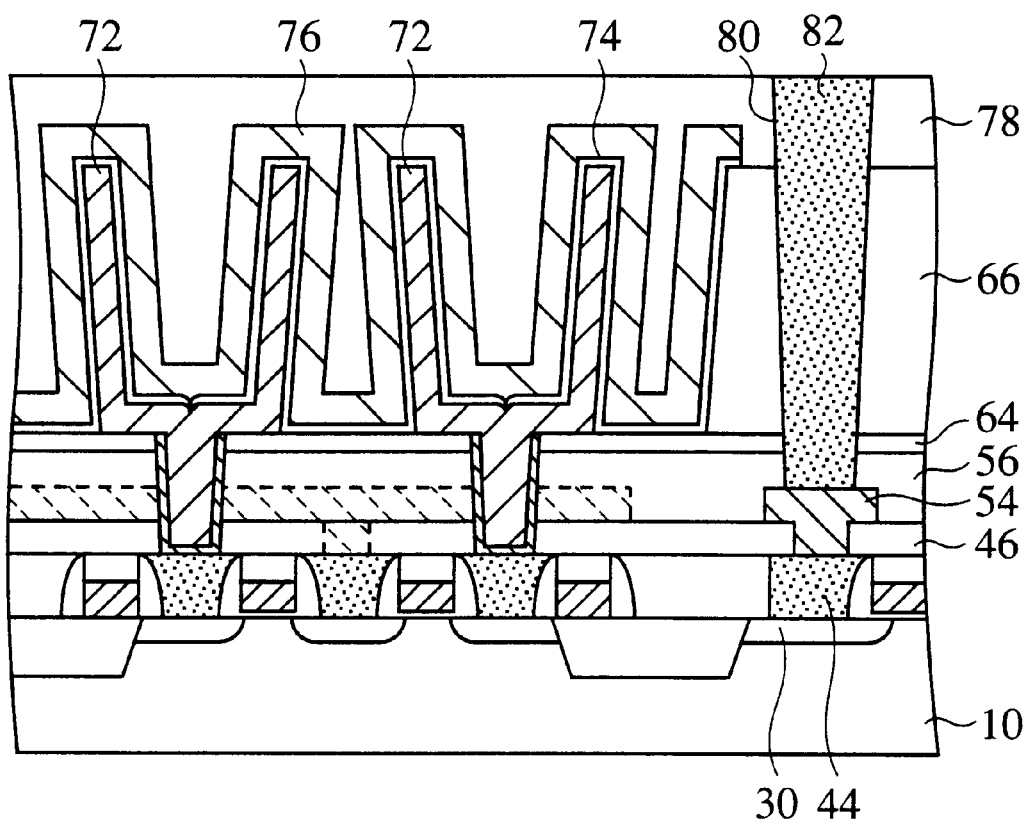

FIG. 35 is a diagrammatic sectional view of the semiconductor device according to a fifth embodiment of the present invention, which shows a structure thereof.

FIGS. 36A–36B and 37A–37B are sectional views of the semiconductor device according to the fifth embodiment of the present invention in the steps of the method for fabricating the same, which show the method.

FIGS. 38A–38B, 39A–39J, and 40 are diagrammatic sectional views of modifications of the semiconductor devices according to the embodiments of the present invention, which show structures thereof.

FIGS. 41A–41C, 42A–42B, and 43A–43B are sectional views of the conventional semiconductor device in the steps of the method for fabricating the same, which show the method.

FIGS. 44A–44B, 45A–45B, and 46A–46B are sectional views of another conventional semiconductor device in the steps of the method for fabricating the same, which show the method.

Figure 47:
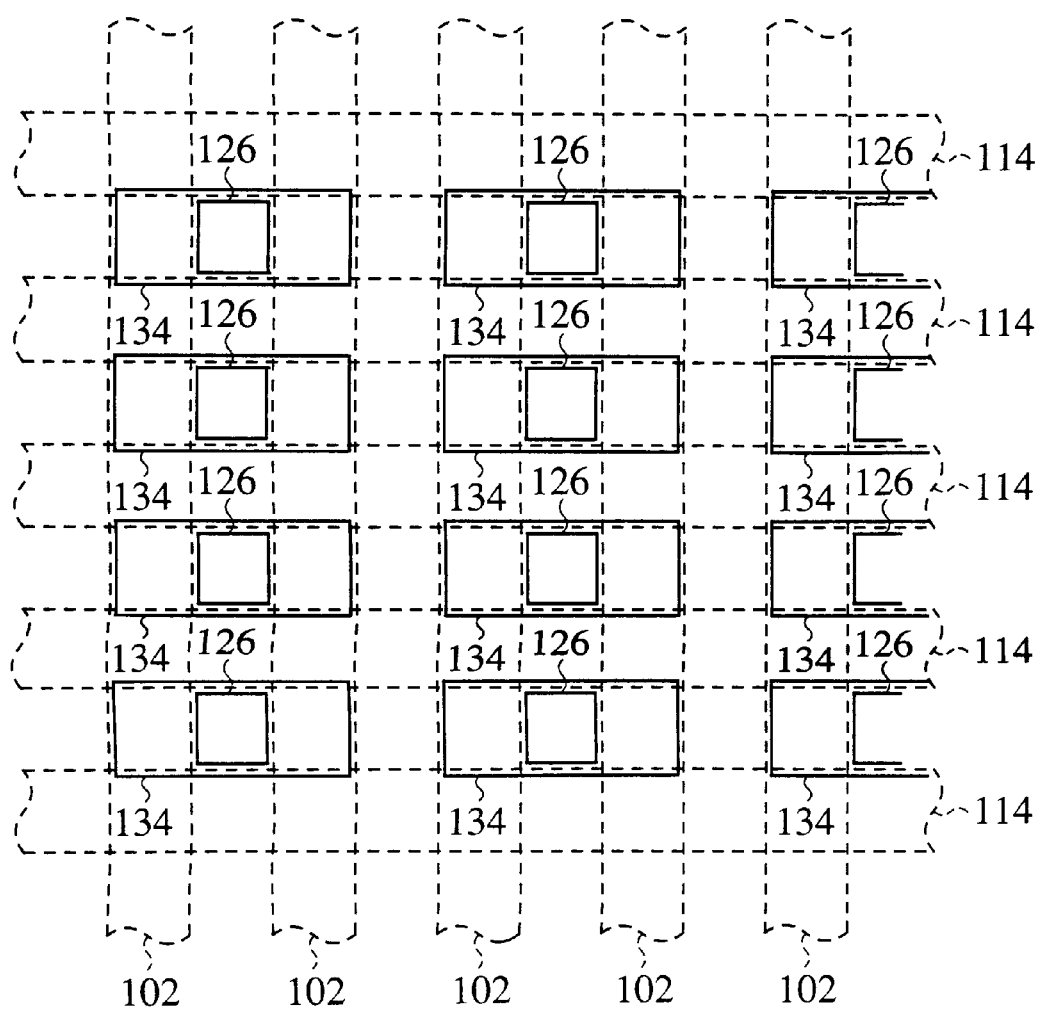

FIG. 47 is a plan layout view showing the method for fabricating the conventional semiconductor device.

Figure 48:
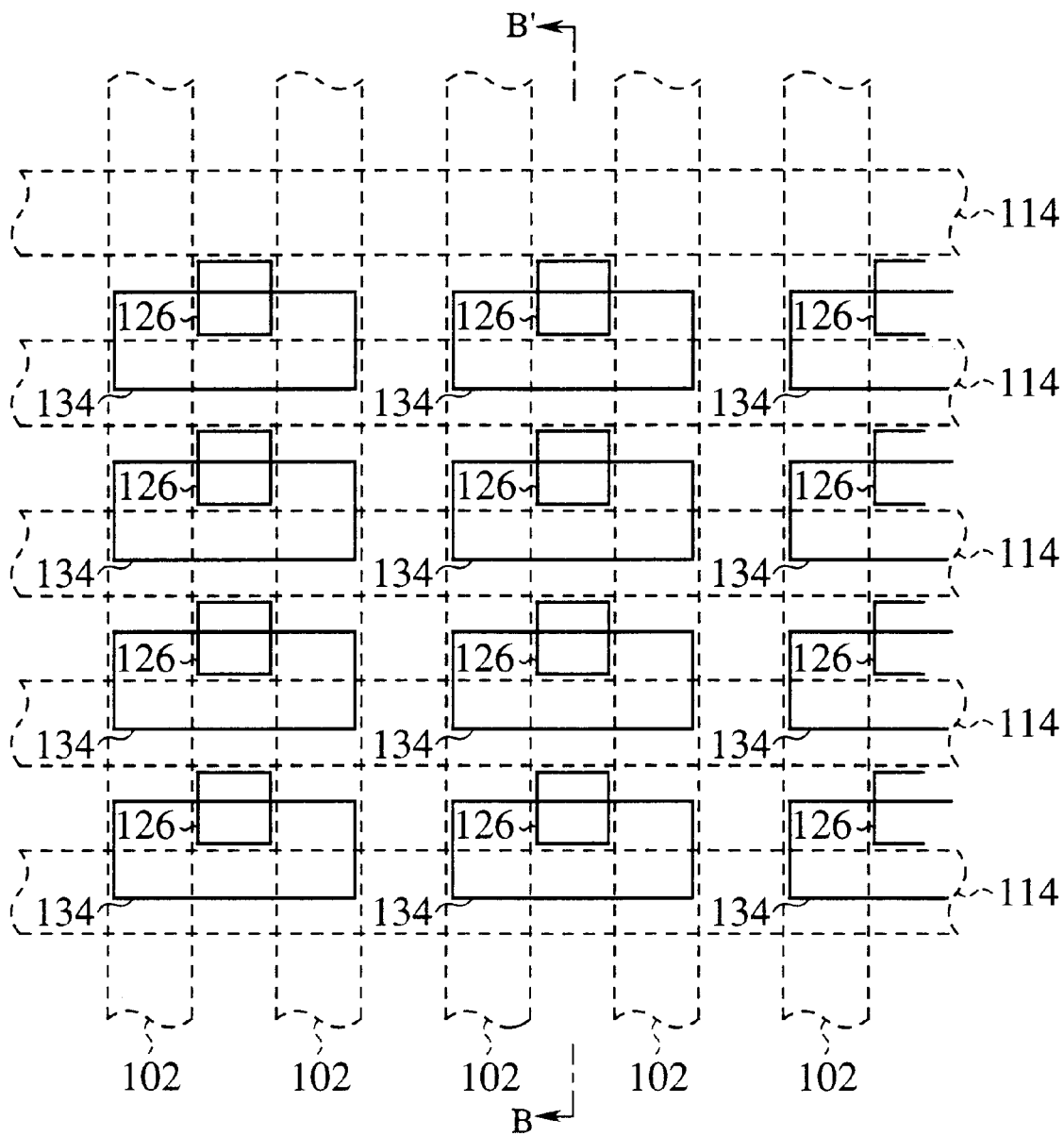

FIG. 48 is a plan layout view explaining the problems of the method for fabricating the conventional semiconductor device.

Figure 49A:
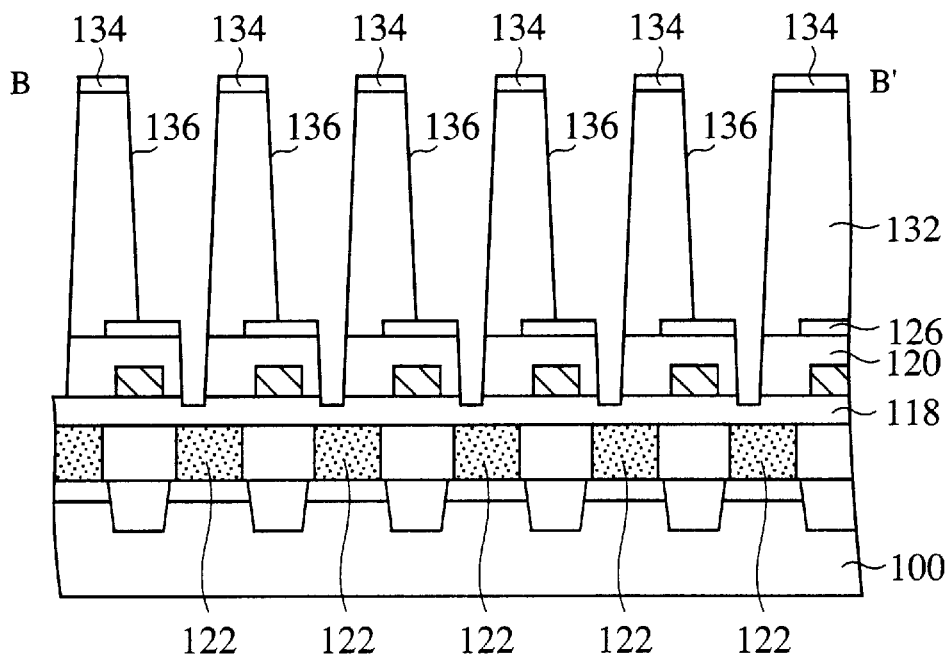
Figure 49B:
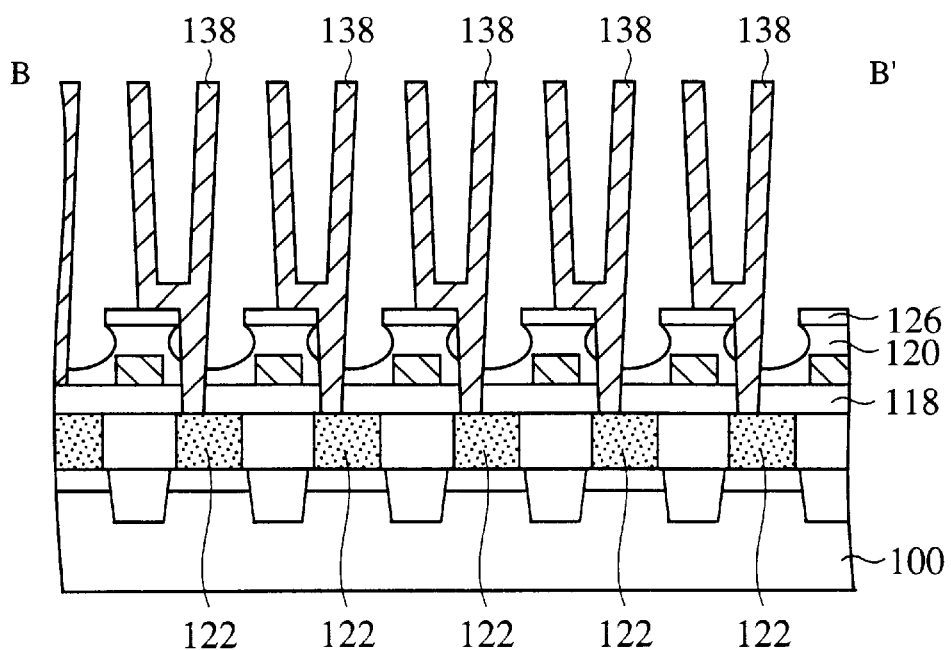

FIGS. 49A and 49B are diagrammatic sectional views explaining the problems of the method for fabricating the conventional semiconductor device.

DETAILED DESCRIPTION OF THE INVENTION

[A First Embodiment]

The semiconductor device and the method for fabricating the same according to a first embodiment of the present invention will be explained with reference to FIGS. 1, 2A–2B, 3A–3D, 4A–4C, 5A–5B, 6A–6B, 7A–7B, 8A–8D, 9A–9C, 10A–10B, 11A–11B, 12A–12B, 13, 14A–14B, and 15A–15B.

Figure 1:
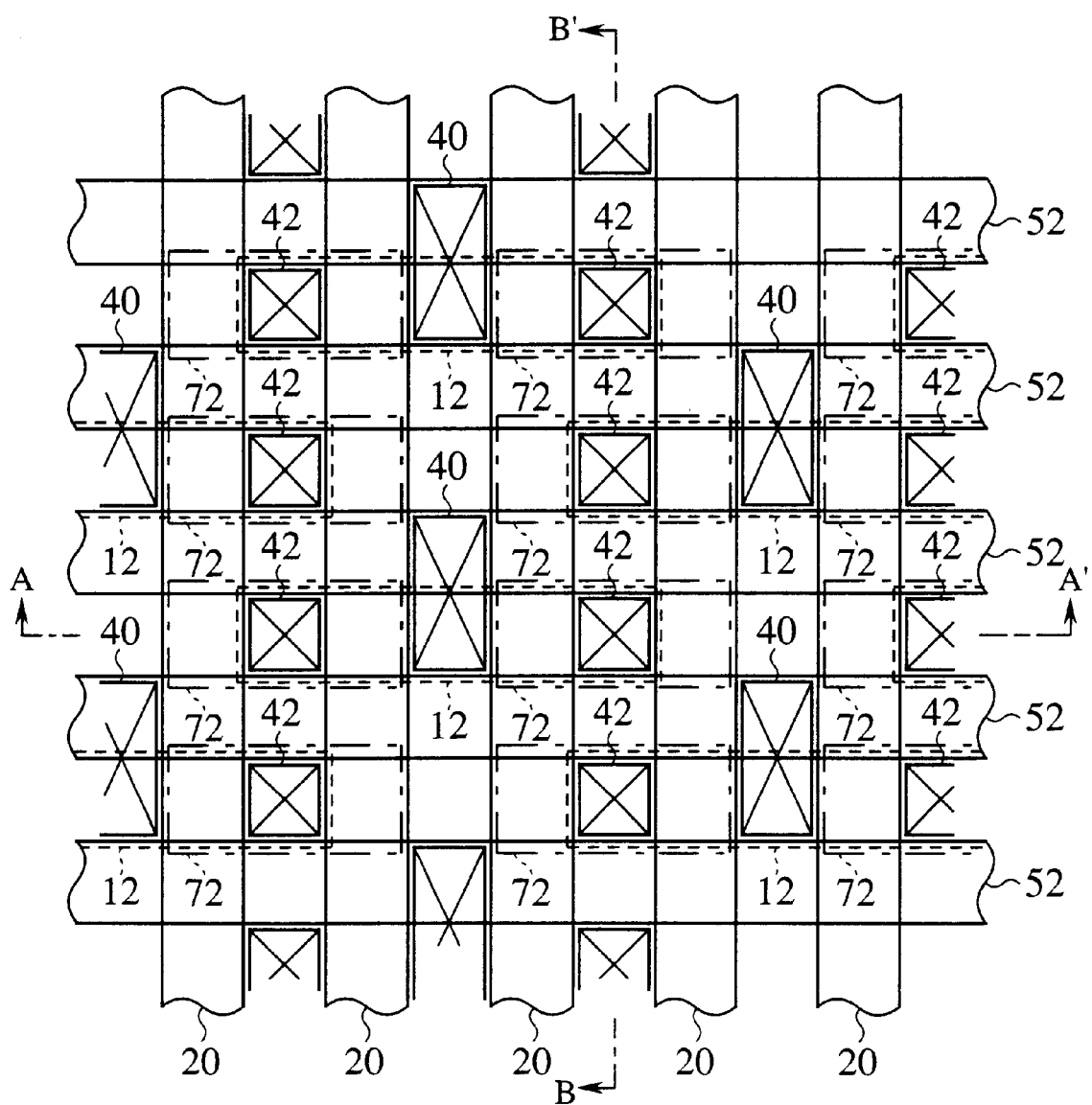
FIG. 1 is a plan view of the semiconductor device according to a first embodiment of the present invention, which shows a structure thereof.
Figure 2A:
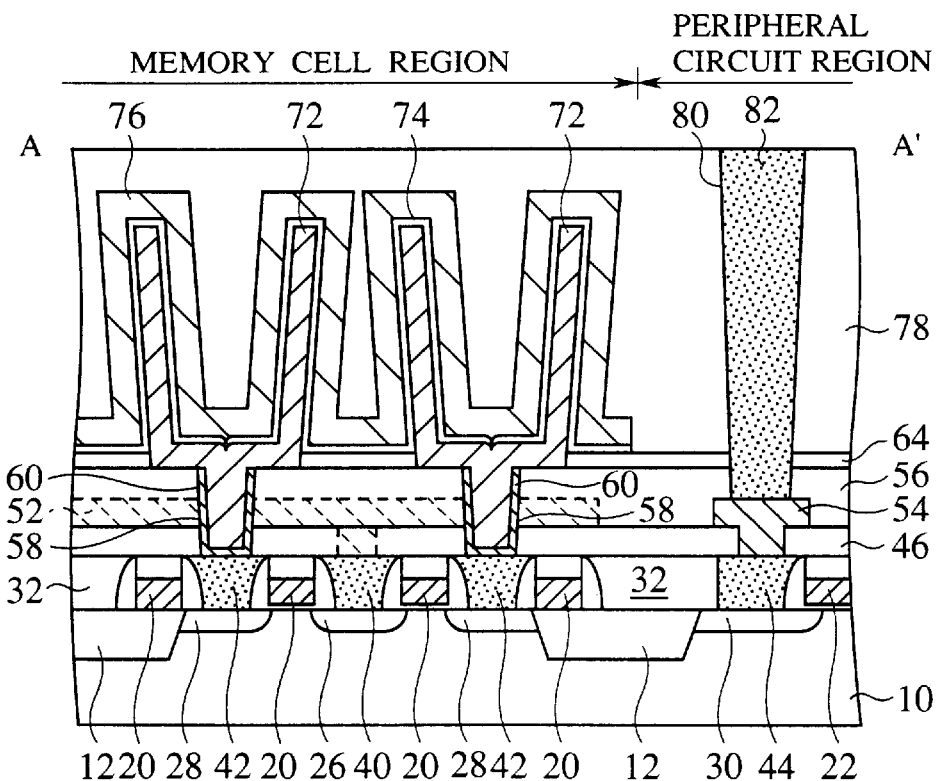
FIGS. 2A and 2B are diagrammatic sectional views of the semiconductor device according to the first embodiment of the present invention, which show the structure thereof.
Figure 2B:
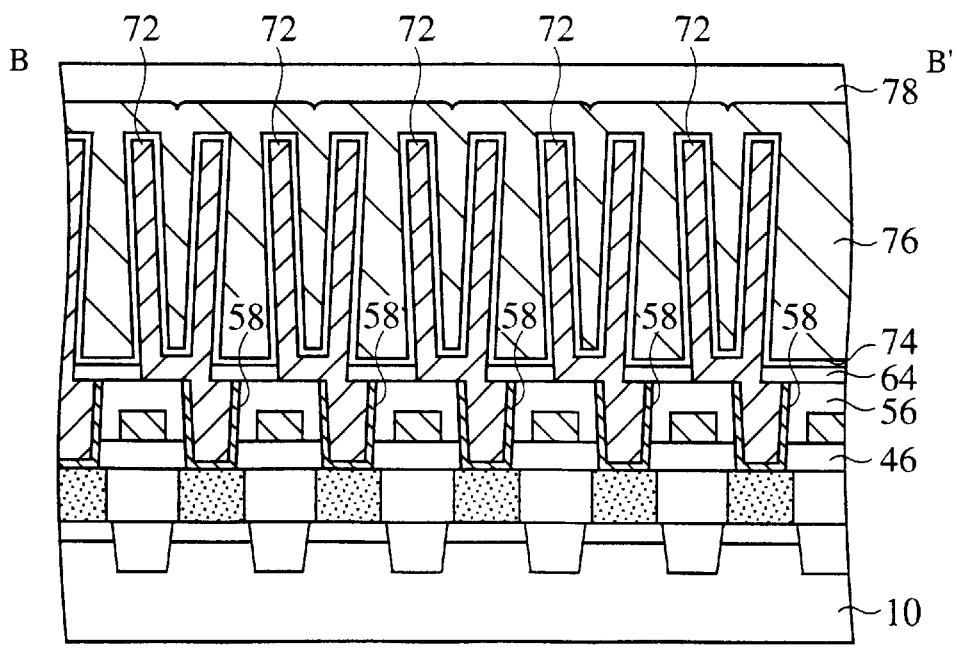

FIG. 1 is a plan view of the semiconductor device according to the present embodiment, which shows the structure thereof. FIGS. 2A and 2B are diagrammatic sectional views of the semiconductor device according to the present embodiment, which show the structure thereof. FIGS. 3A–3D, 4A–4C, 5A–5B, 6A–6B, 7A–7B, 8A–8D, 9A–9C, 10A–10B, 11A–11B, 12A–12B, 14A–14B, and 15A–15B are sectional views of the semiconductor device according to the present embodiment in the steps of the method for fabricating the same, which show the method. FIG. 13 is a plan view of a pattern layout for a case of disalignment.

First, the structure of the semiconductor device according to the present embodiment will be explained with reference to FIGS. 1 and 2A–2B. FIG. 1 is a plan view of a memory cell region. The left side of FIG. 2A corresponds to the sectional view along the line A-A' in FIG. 1. The left side of FIG. 2B corresponds to the sectional view along the line B-B' in FIG. 1. Each of the right sides of FIGS. 2A and 2B shows a peripheral circuit region.

As shown in FIG. 2A, a device isolation film 12 for defining device regions is formed on a silicon substrate 10. A memory cell transistor including a gate electrode 20 and source/drain diffused layers 26, 28, and a peripheral circuit transistor including a gate electrode 22 and a source/drain diffused layers 30 are formed in a device region. As shown in FIG. 1, the gate electrode 20 functions as a conducting film which functions as a word line. Inter-layer insulation films 32, 46 are formed on the silicon substrate 10 with the memory cell transistor and the peripheral circuit transistor formed on. On the inter-layer insulation film 46 there are formed a bit line 52 connected to the source/drain diffused layer 26 through a plug 40, and an interconnection layer 54 connected to the source/drain diffused layer 30. As shown in FIG. 1, a plurality of bit lines 52 are extended in a direction intersecting the word lines. An inter-layer insulation film 56 is formed on the inter-layer insulation film 46 with the bit line 52 and the interconnection layer 54 formed on. A cylindrical storage electrode 72 is formed on the inter-layer insulation film 56, connected with the source/drain diffused layer 28 through a barrier metal 60 formed in a contact hole 58 and the plug 42. A plate electrode 76 is formed on the storage electrode 72 interposing a capacitor dielectric film 74 therebetween. Thus, the storage electrode 72, the capacitor dielectric film 74 and the plate electrode 76 constitute a capacitor. An etching stopper film 64 and an inter-layer insulation film 78 are formed on the inter-layer insulation film 56 with the capacitor formed on. A contact hole 80 is formed down to the interconnection layer 54 in the inter-layer insulation film 78, the etching stopper film 64 and the inter-layer insulation film 56. A plug 82 is buried in the contact hole 80.

Thus, a DRAM comprising memory cells each having one transistor and one capacitor is fabricated.

As described above, the semiconductor device according to the present embodiment is the same as the conventional semiconductor device shown in FIGS. 44A–44B, 45A–45B, and 46A–46B in comprising the storage electrode 72 functioning as a plug buried in the inter-layer insulation films 46, 56. A main characteristic of the semiconductor device according to the present embodiment is that the contact hole 58 formed in the inter-layer insulation films 46, 56 has a constant diameter irrespective of the presence and absence of disalignment, and even when the disalignment as shown in FIG. 48 takes place, a part of the storage electrode 72 is buried in the contact hole 58 formed in the inter-layer insulation films 46, 56.

When characteristics of the shape of the storage electrode 72 are considered, the storage electrode 72 is divided, for the consideration, in the part buried in the inter-layer insulation films 46, 56 (a contact part) and in the part projected above the inter-layer insulation film 56 (a projection part), and the characteristics are that there is a region on the top of the contact part, where the projection part is absent and that there is a region at the bottom of the projection part, where the contact part is absent, and that the contact part and the projection part are formed of the same conducting layer. In other words, the storage electrode 72 has the contact part formed in the contact hole 58 and the projection part connected to only a part of the top of the contact part and projected beyond the inter-layer insulation film 56, and the contact part and the projection part are formed of the same conducting layer.

Such shape of the storage electrode 72 is attributed to the fabrication method characteristic of the present invention, which will be described later. Such structure prevents defective contact and breakage of the lower structure by etching, which are due to disalignment. The storage electrode 72 having a part buried in the inter-layer insulation films 46, 56 does not fall down or peel off in the fabrication process.

Next, the method for fabricating the semiconductor device according to the present embodiment will be explained with reference to FIGS. 3A–3D, 4A–4C, 5A–5B, 6A–6B, 7A–7B, 8A–8D, 9A–9C, 10A–10B, 11A–11B, 12A–12B, 13, 14A–14B, and 15A–15B. In FIGS. 3A–3D, 4A–4C, 5A–5B, 6A–6B, and 7A–7B, the right sides of the respective drawings show sectional views of the peripheral circuit in the steps of the method for fabricating the semiconductor device, and the left sides of the respective drawings show sectional views of the semiconductor device in the steps of the method for fabricating the semiconductor device along the line A-A' in FIG. 1. FIGS. 8A–8D, 9A–9C, 10A–10B, 11A–11B, 12A–12B, 14A–14B, and 15A–15B show the sectional views of the semiconductor device along the line B-B' of FIG. 1 in the steps of the method for fabricating the same.

First, the device isolation film 12 is formed on the primary surface of a semiconductor substrate 10 by, e.g., STI (Shallow Trench Isolation) method.

Then, a gate insulation films 14, 16 are formed by, e.g., thermal oxidation on a plurality of device regions defined by the device isolation film 12. The gate insulation film 14 is a gate insulation film for the memory cell transistor, and the gate insulation film 16 is a gate insulation film for the peripheral circuit transistor.

Next, a polycrystalline silicon film and a silicon nitride film, for example, are sequentially deposited on the entire surface by, e.g., CVD method. The deposited films are patterned to form the gate electrodes 20, 22 of the polycrystalline silicon film having the upper surface covered by the silicon nitride film 18. Here, the gate electrode 20 is a gate electrode of the memory cell transistor, and the gate electrode 22 is a gate electrode of the peripheral circuit transistor. The gate electrodes 20, 22 are not essentially formed of polycrystalline silicon film but may be formed of a polycide structure or polymetal structure, or a metal film or others.

Then, dopant ions are implanted with the gate electrodes 20, 22 as a mask to form the source/drain diffused layers 26, 28 in the silicon substrate 10 on both sides of the gate electrode 20 and to form an LDD region or an extension region in the silicon substrate 10 on both sides of the gate electrode 22.

Next, a silicon nitride film, for example, is deposited on the entire surface by, e.g., CVD method and is etched back to form a sidewall insulation film 24 of the silicon nitride film on the side walls of the gate electrodes 20, 22 and of the silicon nitride film 18.

Then, dopant ions are implanted with the gate electrode 22 and the sidewall insulation film 24 as a mask to form the heavily doped source/drain diffused layer 30 in the silicon substrate 10 on both sides of the gate electrode 22.

Figure 3A:
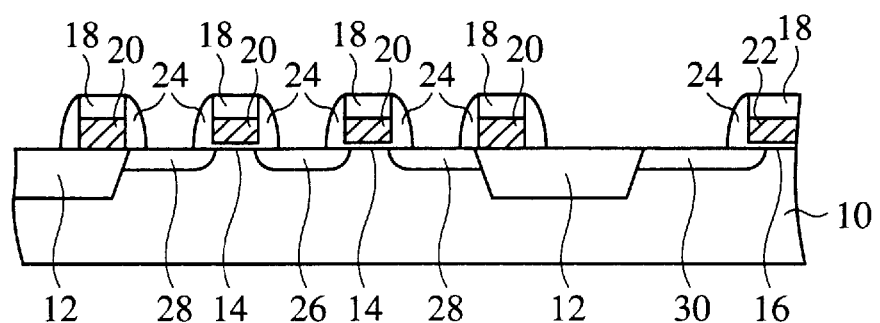
Figure 8A:
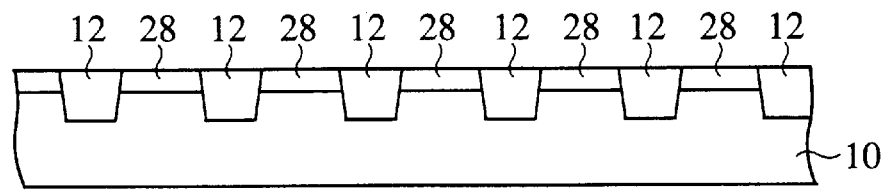

Thus, a memory cell transistor comprising the gate electrode 20, and the source/drain diffused layers 26, 28 formed in the silicon substrate 10 on both sides of the gate electrode 20 is formed in the memory cell region, and a peripheral circuit transistor comprising the gate electrode 22, and the source/drain diffused layer 30 formed in the silicon substrate 10 on both sides of the gate electrode 22 is formed (FIG. 3A, FIG. 8A).

Next, a silicon oxide film, for example, is deposited on the entire surface by, e.g., CVD method, and the surface of the silicon oxide film is polished by CMP (Chemical Mechanical Polishing) method or other means until the silicon nitride film 18 is exposed, to form the inter-layer insulation film 32 of the silicon oxide film having the surface planarized.

Figure 3B:
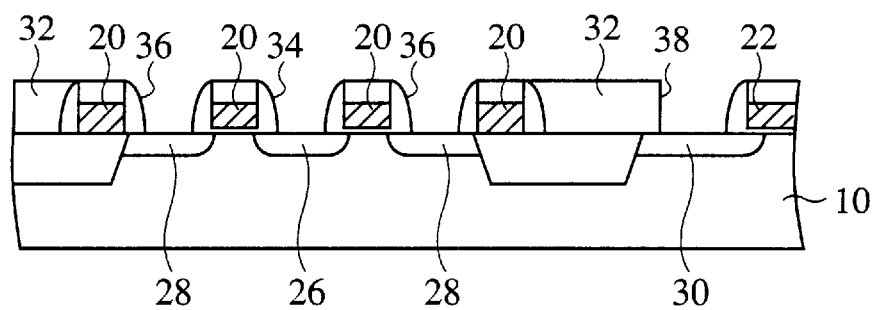
Figure 8B:
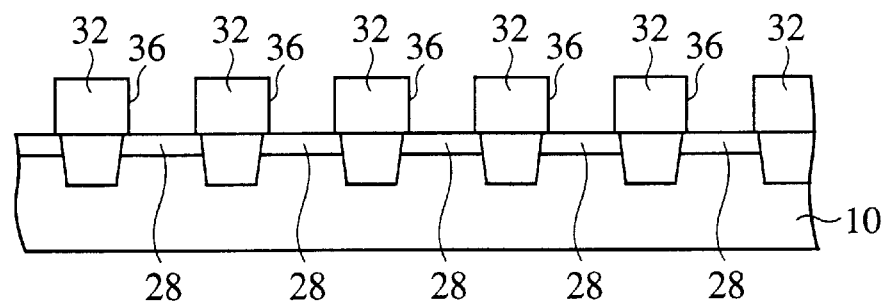

Next, the contact holes 34, 36, and 38 are formed respectively down to the source/drain diffused layer 26, down to the source/drain diffused layer 28 and down to the source/drain diffused layer 30 by self-alignment with the gate electrodes 20, 22 and the side wall insulation film 24 in the inter-layer insulation film 32 by the lithography and etching (FIG. 3B, FIG. 8B).

Figure 3C:
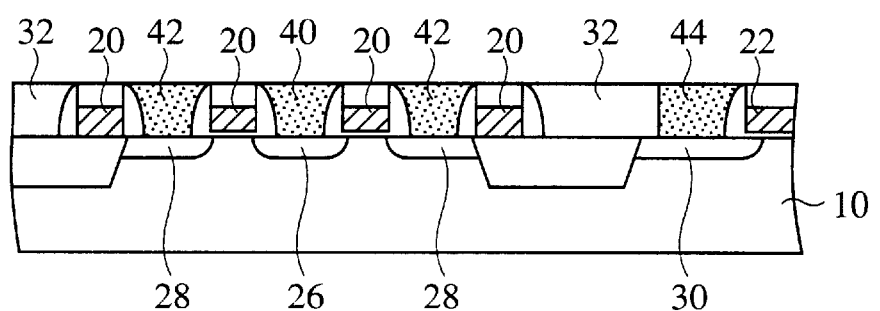
Figure 8C:
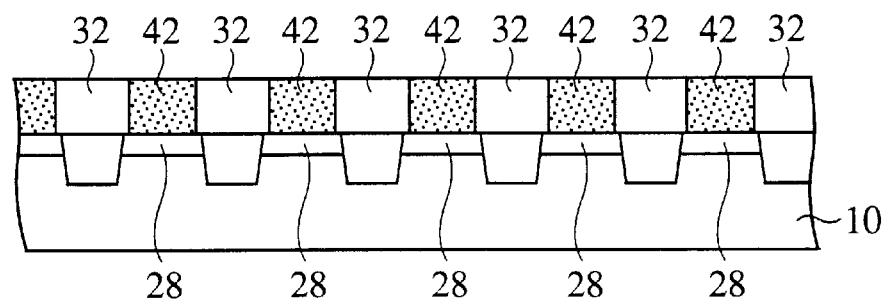

Next, the plugs 40, 42, and 44 are buried respectively in the contact holes 34, 36, and 38 formed in the inter-layer insulation film 32 (FIG. 3C, FIG. 8C). The plugs 40, 42, and 44 are formed of doped polycrystalline silicon by, e.g., depositing a polycrystalline silicon film by, e.g., CVD method and etching back the polycrystalline silicon film to be left only in the contact holes 34, 36, and 38, and then doping in the polycrystalline silicon film by ion implantation to make the polycrystalline silicon film less resistive.

Then, a 50–100 nm-thick silicon oxide film, for example, is deposited on the entire surface by, e.g., CVD method to form the inter-layer insulation film 46 of the silicon oxide film.

Figure 3D:
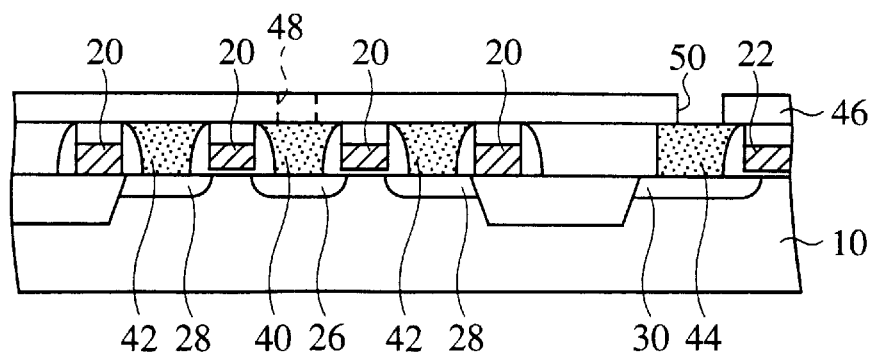
Figure 8D:
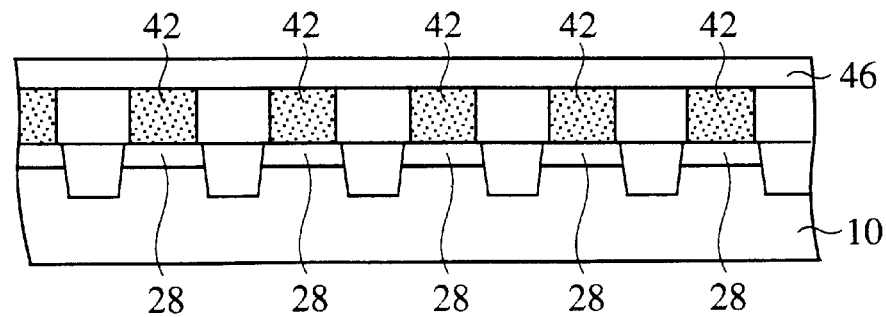

Next, the contact holes 48 and 50 are formed in the inter-layer insulation film 46 respectively down to the plug 40 and the plug 44 by the lithography and etching (FIG. 3D, FIG. 8D). The contact hole 48 down to the plug 40 does not appear in the section shown in FIG. 3D but is indicated by dotted lines in the following drawings so as to make clear its positional relationships with the other constituent members.

Next, a Ti (titanium) film, a TiN (titanium nitride) film and a W (tungsten) film are sequentially deposited on the entire surface by, e.g., CVD method and patterned to form the bit line 52 connected to the source/drain diffused layer 26 through the plug 40, and the interconnection layer 54 connected to the source/drain diffused layer 30 through the plug 44.

Figure 4A:
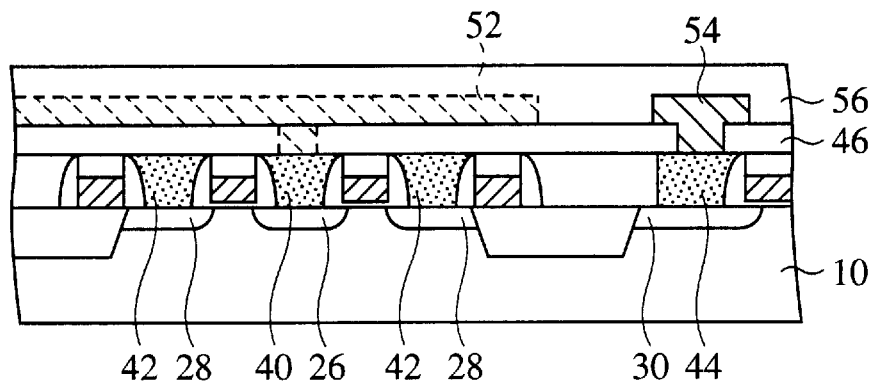
Figure 9A:
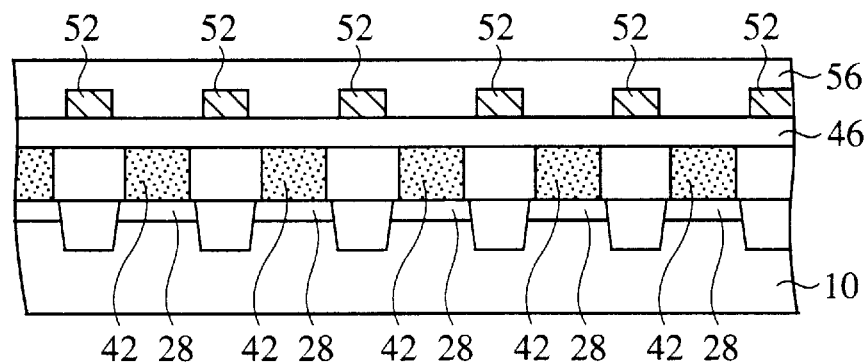

Then, a 500 nm-thick silicon oxide film, for example, is deposited on the entire surface by, e.g., CVD method, and the surface of the silicon oxide film is polished by CMP method to form the inter-layer insulation film 56 of the silicon oxide film having the surface planarized (FIG. 4A, FIG. 9A). Although the bit line 52 does not appear in the section shown in FIG. 4A, the bit line 52 is indicated by dotted lines in the following drawings so as to make clear its positional relationships with the other constituent members.

The contact hole 58 is formed in the inter-layer insulation films 46, 56 down to the plug 42 by the lithography and etching. It is possible that a stopper film of silicon nitride film or others is formed covering the bit line 52, and the contact hole 58 is opened by self alignment with the bit line 52.

Then, a 10 nm-thick Ti film, a 20 nm-thick TiN film and a 500 nm-thick W film, for example, are deposited on the entire surface by, e.g., CVD method.

Figure 4B:
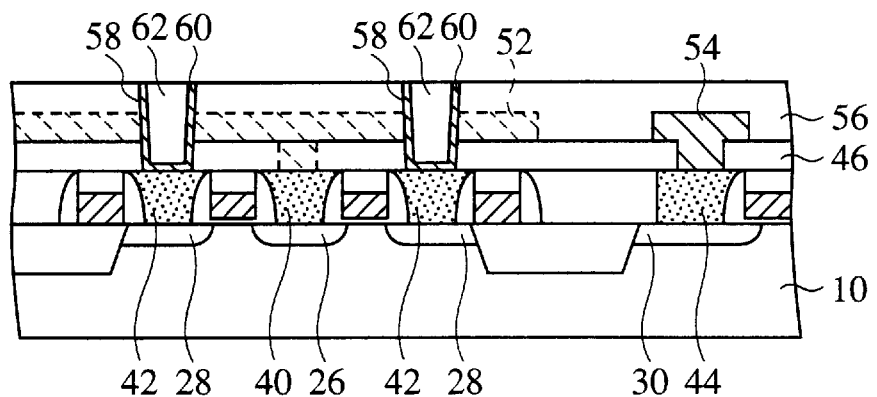
Figure 9B:
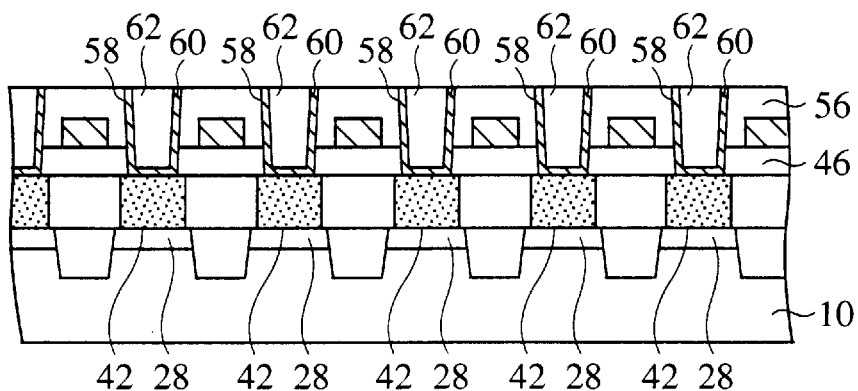

Then, the Ti film, the TiN film and the W film are flatly removed by CMP or etching back until the surface of the inter-layer insulation film 56 is exposed, to bury the Ti film, the TiN film and the W film in the contact hole 58. Thus, a barrier metal 60 formed of the Ti film and the TiN film is formed on the inside wall and the bottom of the contact hole 58, and the dummy plug 62 formed of the W film is buried in the contact hole 58 with the barrier metal 60 formed therein (FIG. 4B, FIG. 9B).

A material forming the dummy plug 62 is provided by a material which can ensure etching selectivity with respect to a material forming the barrier metal 60 and the inter-layer insulation film 56. Other than W, a conducting material, such as Al (aluminum), Ti, Cu (copper), C (carbon) or others, or an insulation film having a higher etching rate than the inter-layer insulation film 56, such as SOG (Spin On Glass) film, BPSG (Boro-Phospho-Silicate Glass) film, BSG (Boro-Silicate Glass) film or others can be used. An organic film can be also used in a case that a general process temperature can be low.

A material forming the barrier metal is provided by a material which is not reactive with a material of the dummy plug 62 and a lower electrode material, etc., and has good adhesion to the storage electrode 72 to be formed later. Other than TiN film, WN (tungsten nitride) film, NbN (niobium nitride) film, TiSi (titanium silicide) film, WSi (tungsten silicide), CoSi (cobalt silicide) film, others can be used.

For lower contact resistance with respect to the lower electrode, as in the semiconductor device according to the present embodiment, a multi-layer structure (e.g., TiN+Ti, WN+Ti) having a contact metal sandwiched between the above-described barrier metal material and a lower electrode may be used. In the present specification, the barrier metal 60 includes such contact metal interposed between the barrier material and the below electrode, and the barrier metal 60 is shown as a whole in the drawings.

It is possible that a material forming the usual electrode plug is selected as a material forming the barrier metal 60 and the dummy plug 62 so as to form the usual electrode plug in the peripheral circuit region concurrently with forming the barrier metal 60 and the dummy plug 62.

Then, an about 40 nm-thick silicon nitride film, for example, is deposited on the entire surface by, e.g., CVD method to form the etching stopper film 64 of the silicon nitride film.

Next, a 700 nm-thick silicon oxide film, for example, is deposited on the etching stopper film 64 by, e.g., CVD method to form the inter-layer insulation film 66 of the silicon oxide film.

Then, a 50 nm-thick amorphous silicon film is deposited on the inter-layer insulation film 66 by, e.g., CVD method to form the hard mask 68 of the amorphous silicon film.

The hard mask 68 is formed in consideration that a photoresist film could not singly provide sufficient masking in etching the thick inter-layer insulation film 66, and is not essentially necessary in a case that the photoresist film is sufficiently resistant to the etching.

Figure 4C:
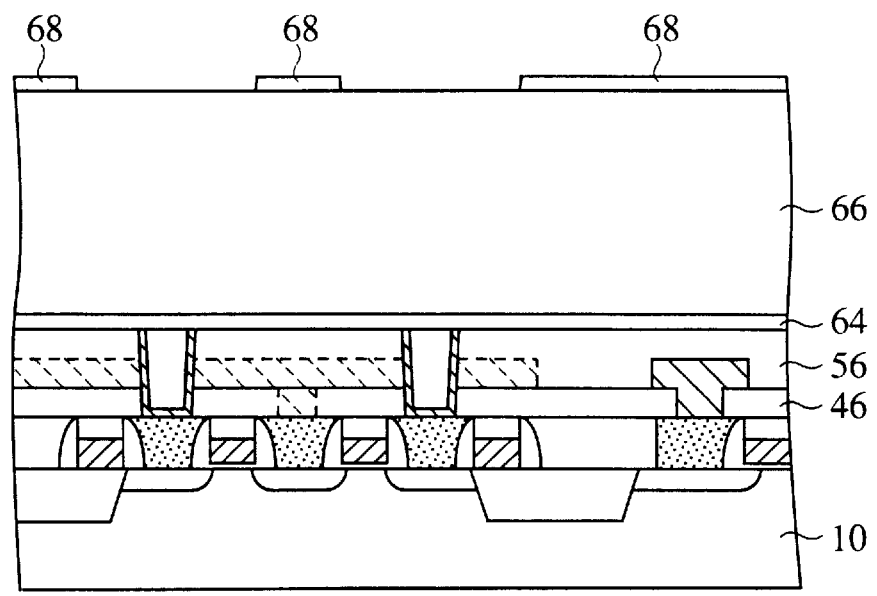
Figure 9C:
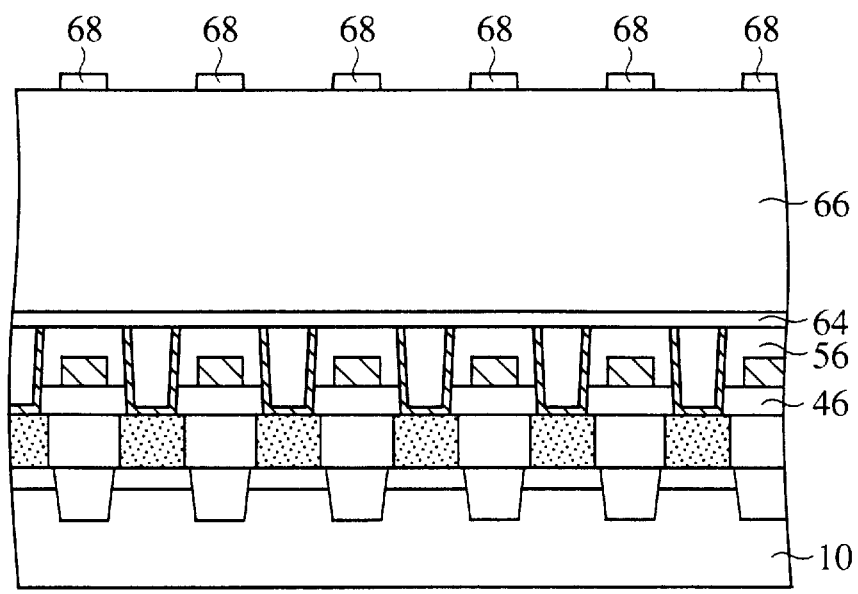

Then, the hard mask 68 in a region for the storage electrode 72 to be formed in is removed by the lithography and etching (FIG. 4C, FIG. 9C).

Figure 5A:
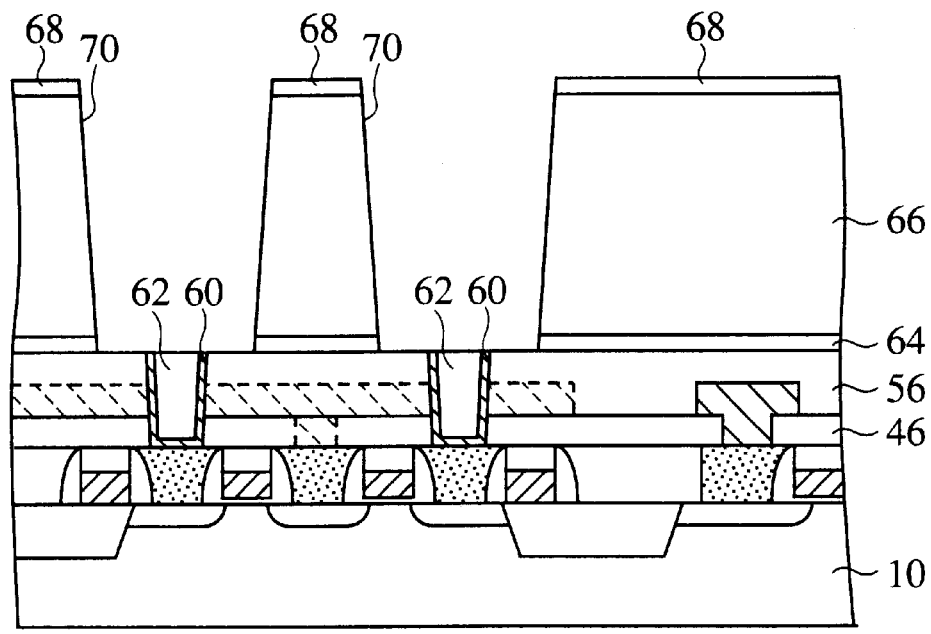
Figure 10A:
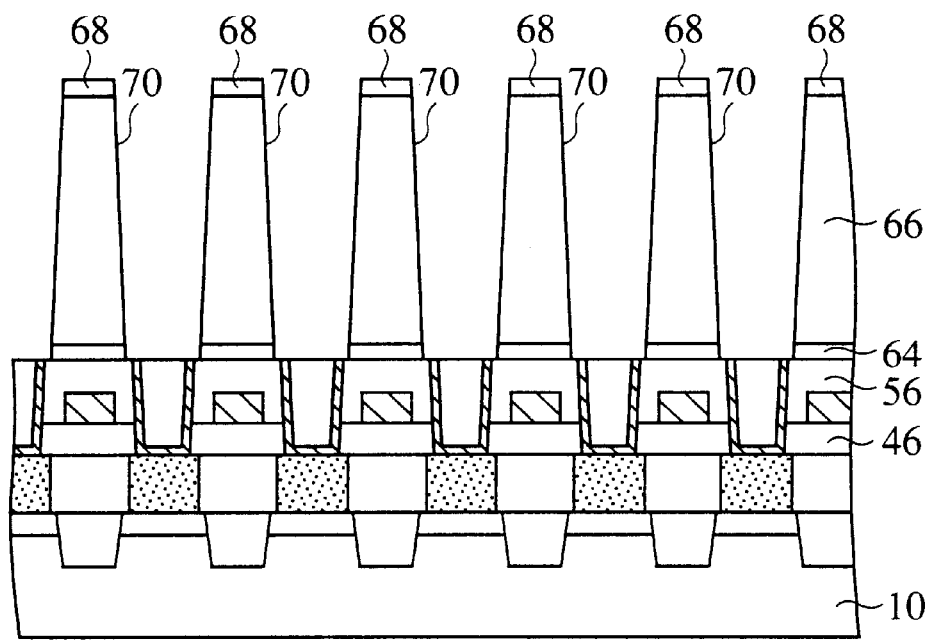

Next, with the hard mask 68 as a mask, the inter-layer insulation film 66 and the etching stopper film 64 are anisotropically etched to form the opening 70 through the inter-layer insulation film 66 and the etching stopper film 64 for exposing the dummy plug 62 (FIG. 5A, FIG. 10A).

Figure 5B:
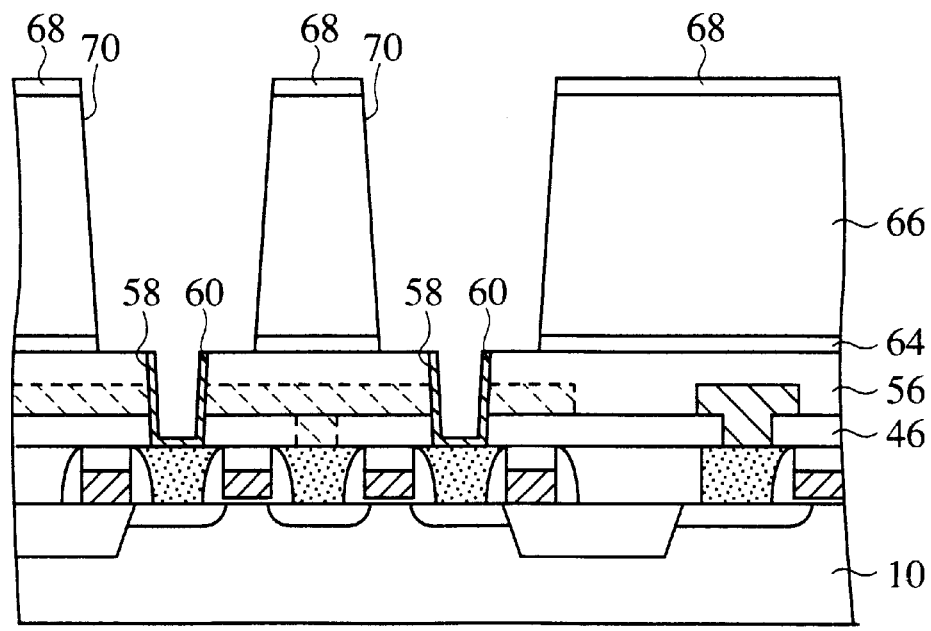
Figure 10B:
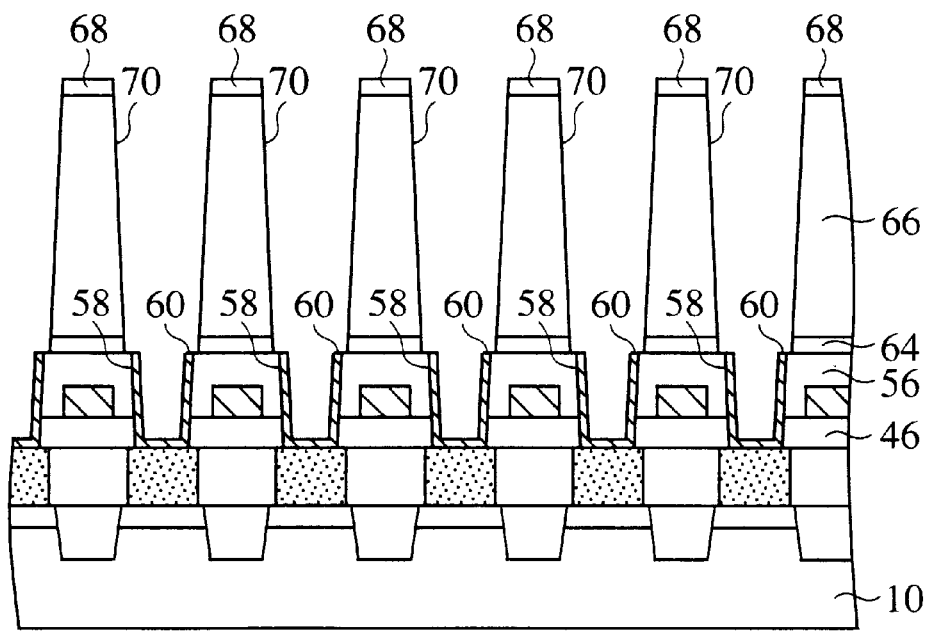

Next, the dummy plug 62 is selectively removed by isotropic etching, as of wet etching or others. By using the isotropic etching, the dummy plug 62 is etched first at the part exposed in the contact hole 58 and can be gradually all removed. Such etching leaves the barrier metal 60 only on the inside wall and the bottom of the contact hole 58 (FIG. 5B, FIG. 10B).

In a case that the dummy plug 62 is formed of W film, isotropic dry etching using $CF_4+O_2+Cl_2$ gas, for example, can selectively remove the dummy plug 62 without removing the inter-layer insulation films 56, 66, the etching stopper film 64 and the barrier metal 60. The dummy plug 62 can be selectively removed by, e.g., wet etching using diluted hydrochloric acid in a case that the dummy plug 62 is formed of Al, Ti or Cu, by, e.g., about 400° C. low-temperature oxygen annealing in a case that the dummy plug 62 is formed of C, and by etching using, e.g., vapor HF in a case that the dummy plug 62 is formed of SOG, BPSG or BSG.

Next, a 30 nm-thick Ru film is deposited on the entire surface by, e.g., CVD method.

Then, an SOG film (not shown), for example, is deposited on the entire surface by, e.g., spin coating method. The SOG film will function as an inside protection film for protecting a region inside the storage electrode 72 when the storage electrode 72 is formed by polishing in a later step, and in place of SOG film, a photoresist film, for example, may be used.

Figure 6A:
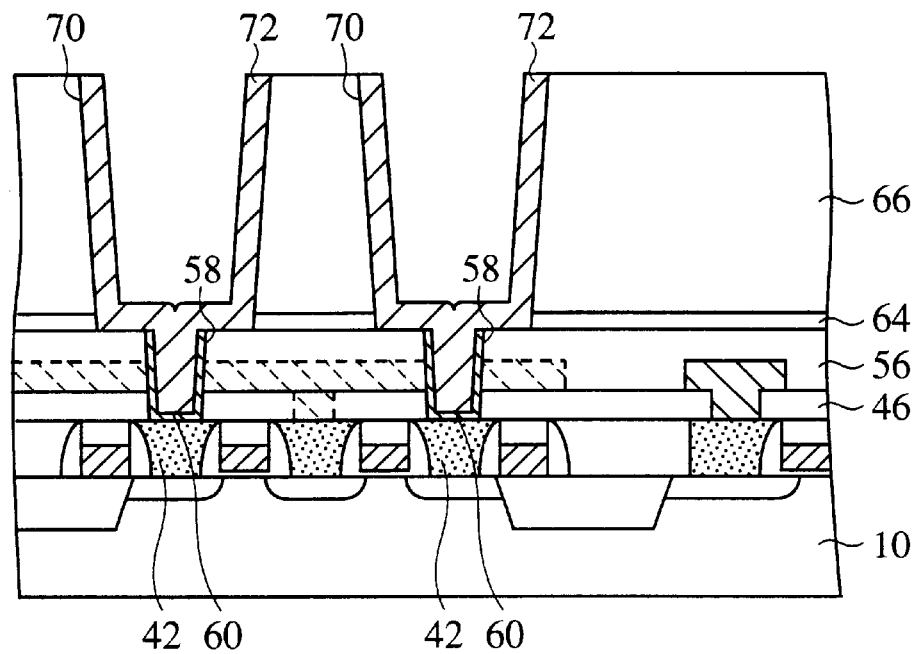
Figure 11A:
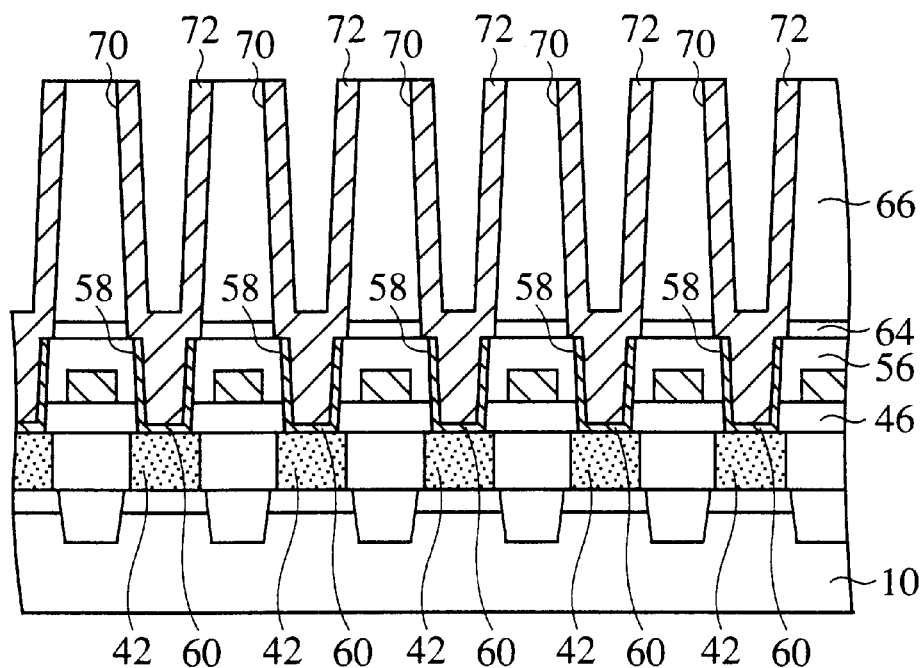

Next, the SOG film, the Ru film and the hard mask 68 are removed flatly by, e.g., CMP method until the inter-layer insulation film 66 is exposed on the surface. Thus is formed the storage electrode 72 formed of the Ru film, formed on the inside wall and the bottom of the opening 70 and buried in the contact hole 58, and electrically connected to the plug 42 through the barrier metal 60 (FIG. 6A, FIG. 11A). The storage electrode 72 has a lower part supported by the inter-layer insulation films 46, 56 and the etching stopper film 64, whereby the storage electrode is kept from falling down or peeling off in the later steps.

A conducting film forming the storage electrode 72 is suitably selected in accordance with compatibility with the capacitor dielectric film 74 to be later formed. For example, in a case that the capacitor dielectric film 74 is as of $Ta_2O_5$, the storage electrode 72 can be formed of Ru, RuOx (ruthenium oxide), W, WN, TiN or others. In a case that the capacitor dielectric film 74 is as of BST (BaSrTiOx) or ST (SrTiOx), the storage electrode 72 can be formed of Pt (platinum), Ru, RuOx, W, SRO ($SrRuO_8$) or others. In a case that the dielectric film 74 is as of ON ($SiO_2$/SiN) film or others, the storage electrode 72 can be formed of doped polycrystalline silicon or others. In a case that the capacitor dielectric film 74 is as of PZT, the storage electrode 72 can be formed of Pt or others. In a case that a dielectric film as of TiOx (titanium oxide), SiN (silicon nitride), $Al_2O_3$ (alumina), SBT (SrBiTiOx) or others is used, a suitable conducting film may be selected in accordance with compatibility with a dielectric film.

Figure 6B:
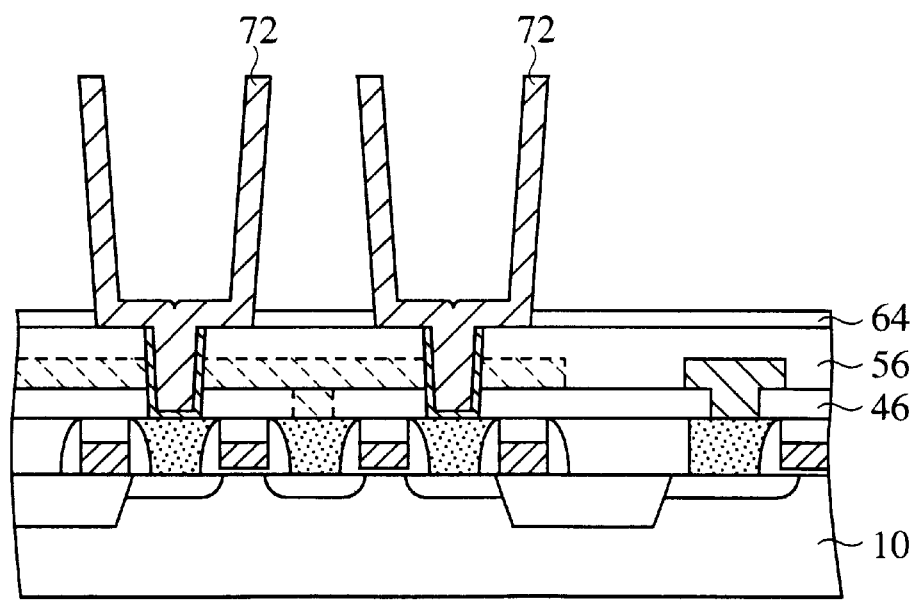
Figure 11B:
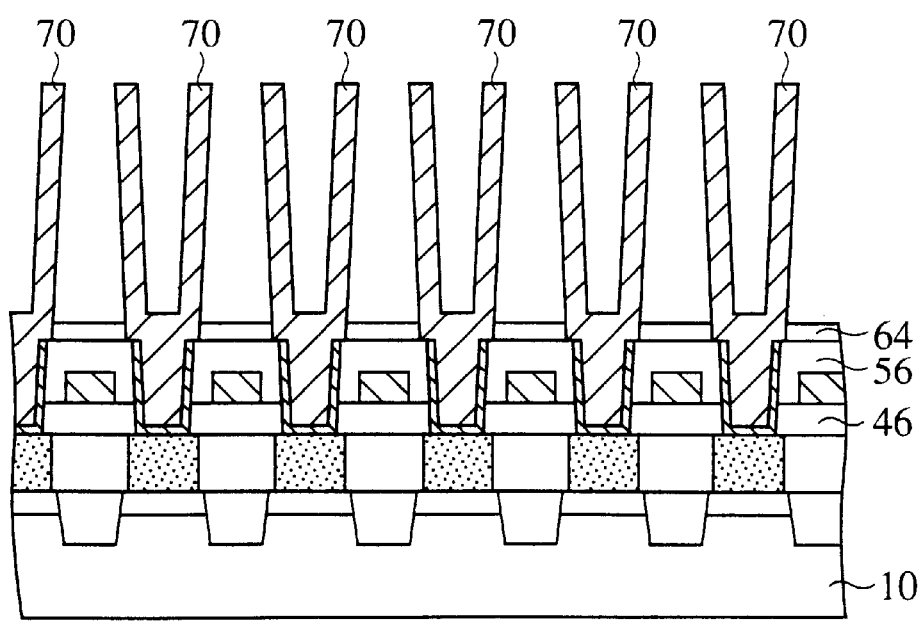

Then, the inter-layer insulation film 66 is selectively etched with the etching stopper film 64 as a stopper by isotropic etching, as of wet etching using an aqueous solution of hydrofluoric acid to expose the outside surface of the storage electrode 72 (FIG. 6B, FIG. 11B). At this time, the etchant never intrudes into the layers below the etching stopper film 64 to break the below structure because all the underside of the inter-layer insulation film 66 is in contact with the etching stopper film 64.

Although not shown, a surface protection film of the SOG film used in forming the storage electrode 72 is removed concurrently with or before the etching.

Then, a 10–30 nm-thick $Ta_2O_5$ film or BST film, for example, is deposited on the entire surface by, e.g., CVD method to form the capacitor dielectric film 74 of $Ta_2O_5$ or BST.

Figure 7A:
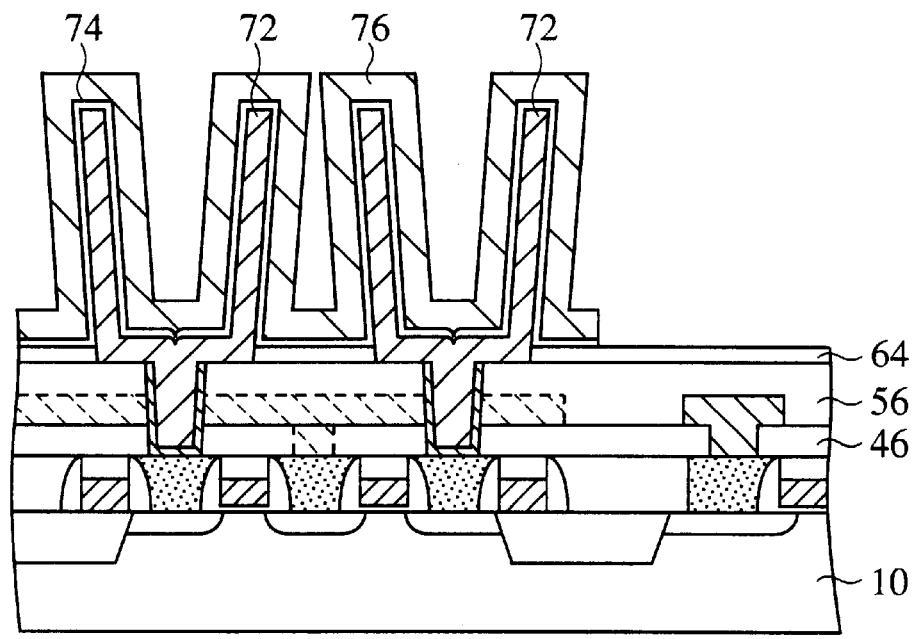
Figure 12A:
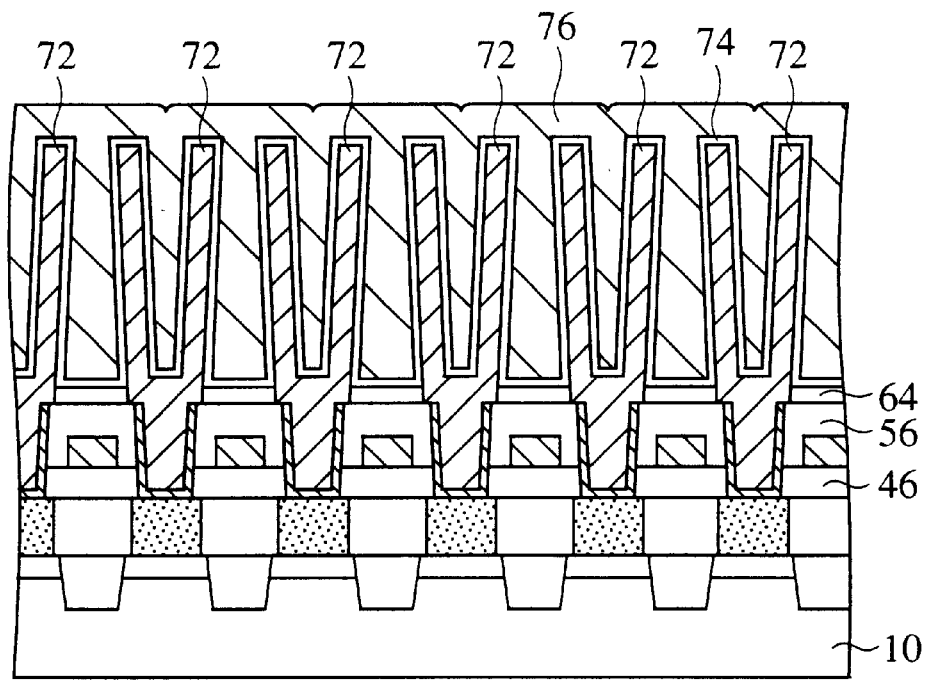

Next, a 50–300 nm-thick Ru film, for example, is deposited on the entire surface by, e.g., CVD method and is patterned by the lithography and etching to form the plate electrode 76 of the Ru film (FIG. 7A, FIG. 12A).

Then, a 900 nm-thick silicon oxide film, for example, is deposited on the entire surface by, e.g., CVD method, and the surface of the silicon oxide film is polished by CMP method to form the inter-layer insulation film 78 of the silicon oxide film having the surface planarized.

Next, the contact hole 80 down to the interconnection layer 54 through the inter-layer insulation film 78, the etching stopper film 64 and the inter-layer insulation film 56 is formed by the lithography and etching.

Figure 7B:
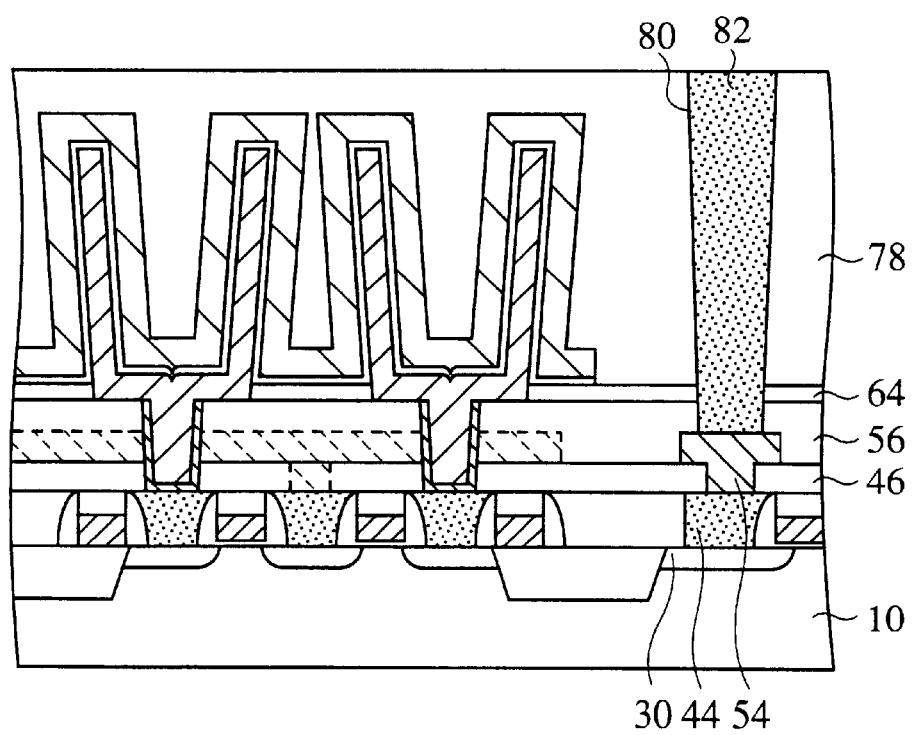
Figure 12B:
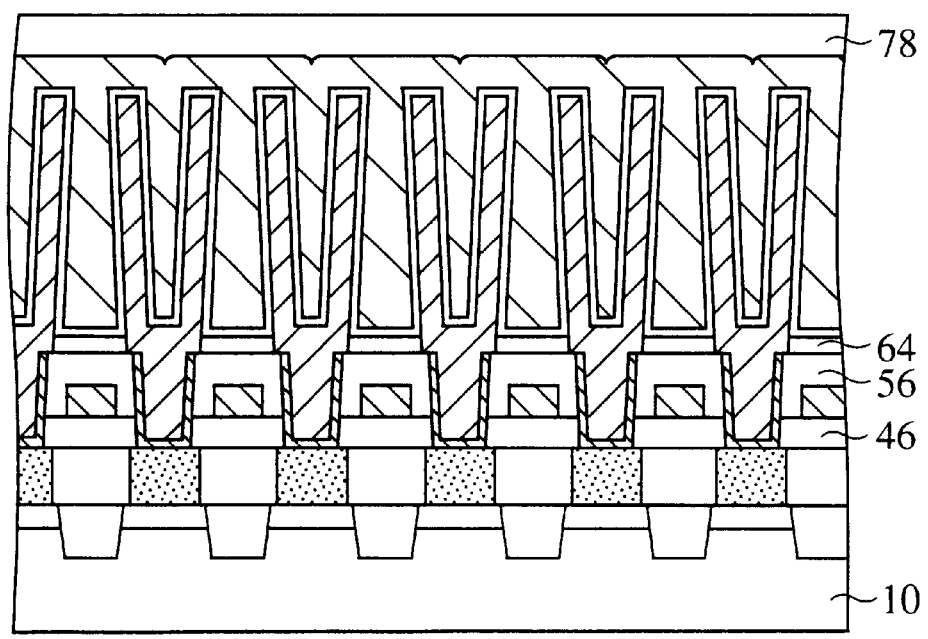

Then, a conducting film is deposited and is removed flatly until the surface of the inter-layer insulation film 78 is exposed, to form the plug 82 buried in the contact hole 80 and connected to the interconnection layer 54 (FIG. 7B, FIG. 12B).

Thus, a DRAM comprising memory cells each having one transistor and one capacitor is fabricated.

Then, a case that in the method for fabricating the semiconductor device according to the present embodiment, disalignment takes place in the direction of extension of the word line in the lithography step for patterning the hard mask 68 will be explained below.

Figure 14A:
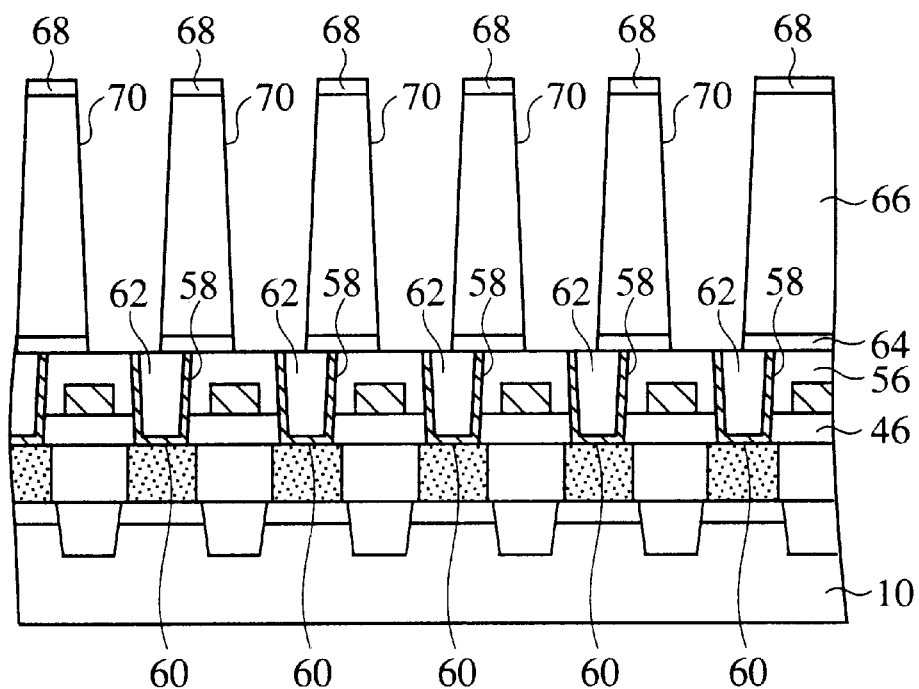

When the pattern of the hard mask 68 disaligns in the direction of extension of the word line (gate electrode 20) and has the plane layout shown in FIG. 13, in the step of forming the opening 70 shown in FIG. 10A, only parts of the barrier metal 60 and of the dummy plug 62 are exposed at the bottom of the opening 70 (FIG. 14A).

Figure 14B:
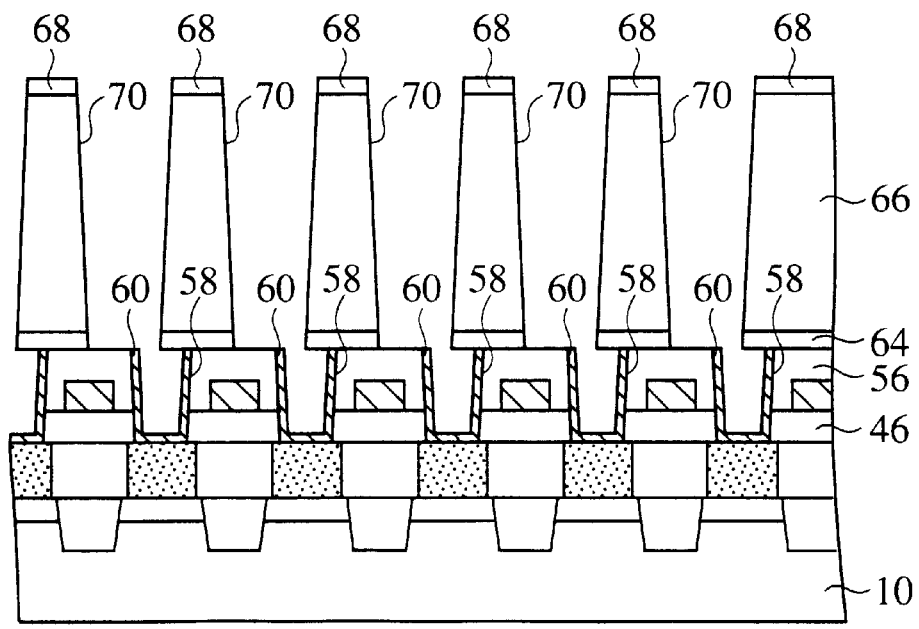

Then, when the dummy plug 62 is removed in the same way as in the step shown in FIG. 10B, all the dummy plug 62 in the contact hole 58 is removed, and the barrier metal 60 formed along the inside wall and the bottom of the contact hole 58 is exposed inside the opening 70 (FIG. 14B).

Figure 15A:
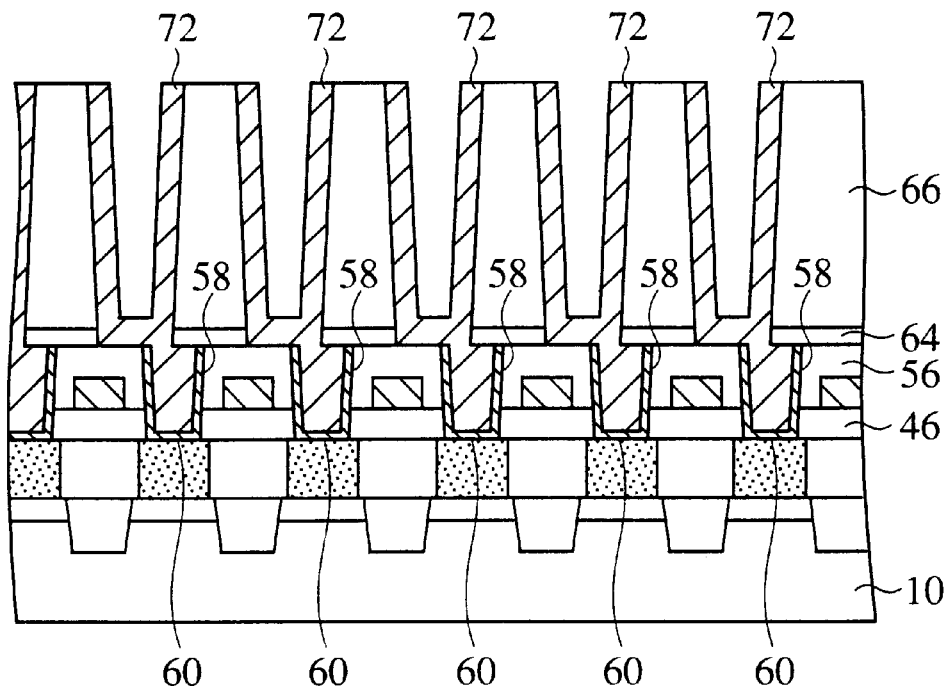

Next, in the step shown in FIG. 11A, a material forming the storage electrode 72 is grown by a film forming process, such as CVD method or others, which is good in forming surface coating, to thereby fill the contact hole 58 with the barrier metal 60 formed in with the material forming the storage electrode 72 while forming the storage electrode 72 along the side wall and bottom of the opening 70 (FIG. 15A).

Thus, the storage electrode 72 has a lower part supported by the inter-layer insulation films 46, 56 and the etching stopper film 64, whereby the storage electrode 72 is prevented from falling down or peeling off in later steps.

Figure 15B:
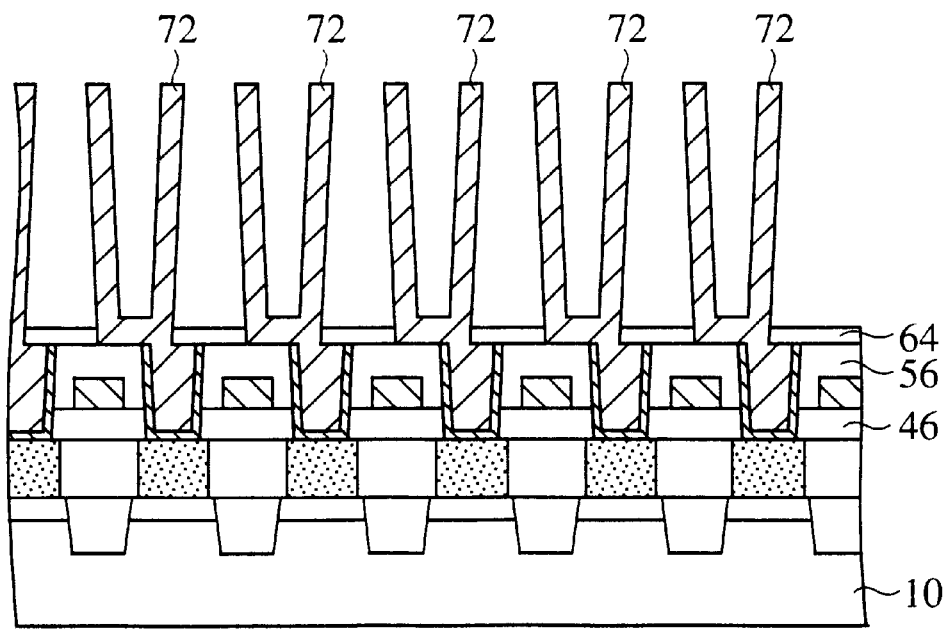

The inter-layer insulation film 66 and the etching stopper film 64 are processed in the same pattern and has all the underside in contact with the etching stopper film 64, whereby even when the inter-layer insulation film 66 is etched after the storage electrode 72 has been formed, the etchant does not ooze the lower layers below the etching stopper film 64 to resultantly destroy the below structure (FIG. 15B).

The contact hole 58 in the inter-layer insulation films 46, 56 is formed before the opening 70 is formed, whereby disalignment of the hard mask 68 neither decreases an open width of the contact hole 58 nor makes it impossible to open the contact hole 58.

As described above, according to the present embodiment, the dummy plug is formed in the lower inter-layer insulation film, then the dummy plug is removed after the opening to be used in forming the storage electrode is formed in the upper inter-layer insulation film, and the storage electrode is formed with a part thereof buried in the contact hole from which the dummy electrode has been removed, whereby peeling and fall of the storage electrode can be prevented without an extra support for the storage electrode, and furthermore, defective contact and breakage of the lower structure due to the disalignment can be prevented.

In comparison with the conventional semiconductor device shown in FIGS. 41A–41C, 42A–42B, and 43A–43B to 43, the present embodiment requires no support for the storage electrode. Accordingly, the opening for the storage electrode to be buried in, and the contact hole for forming the contact plug for the peripheral circuits can be allowed to be shallower by a dimension of the support. Furthermore, a number of the fabrication steps can be small by a number of steps for forming the support. Such advantageous effects can be produced.

Furthermore in comparison with the conventional semiconductor device shown in FIGS. 44A–44B, 45A–45B, and 46A–46B, although a number of fabrication steps is a little increased, the contact hole in the lower inter-layer insulation film, and the opening in the upper inter-layer insulation film do not have to be concurrently formed. Accordingly, the etching is easy, and defective contact and breakage of the lower structure due to disalignment can be prevented. Such advantageous effects can be produced.

[A Second Embodiment]

The semiconductor device and the method for fabricating the same according to a second embodiment of the present invention will be explained with reference to FIGS. 16A–16B, 17A–17B, 18A–18B, 19A–19B, 20A–20B, 21A–21B, 22A–22B, 23A–23B, and 24A–24B. The same members of the present embodiment as those of the semiconductor device and the method for fabricating the same according to the first embodiment are represented by the same reference numbers not to repeat or to simplify their explanation.

FIGS. 16A–16B are diagrammatic sectional views of the semiconductor device according to the present embodiment, which show a structure thereof. FIGS. 17A–17B, 18A–18B, 19A–19B, 20A–20B, 21A–21B, 22A–22B, 23A–23B, and 24A–24B are sectional views of the semiconductor device according to the present embodiment in the steps of the method for fabricating the same, which show the method.

First, the structure of the semiconductor device according to the present embodiment will be explained with reference to FIGS. 16A and 16B. FIG. 16A is the sectional view along the line A-A' of FIG. 1. FIG. 16B is the sectional view along the line B-B' of FIG. 1.

As shown in FIGS. 16A and 16B, the basic structure of the semiconductor device according to the present embodiment is the same as that of the semiconductor device according to the first embodiment shown in FIGS. 2A and 2B. The method for fabricating the semiconductor device according to the present embodiment is different from the method for fabricating the semiconductor device according to the first embodiment in that in the former, a barrier metal 60 is left also on an inter-layer insulation film 56, and the barrier metal 60 finally has an accordingly different configuration. That is, in the semiconductor device according to the present embodiment, a part of the barrier metal 60 is extended over the inter-layer insulation film 56 (see FIG. 16A), and disalignment often forms a region where the barrier metal 60 is not formed on an upper end of a contact hole 58 (see FIG. 16B).

Next, the method for fabricating the semiconductor device according to the present embodiment will be explained with reference to FIGS. 17A–17B, 18A–18B, 19A–19B, 20A–20B, 21A–21B, 22A–22B, 23A–23B, and 24A–24B. In the following explanation, the method for fabricating the semiconductor device according to the present embodiment will be explained with reference to the sectional views of the semiconductor device in a case that disalignment has taken place in the direction of extension of a word line. FIGS. 17A–17B, 18A–18B, 19A–19B, and 20A–20B show, on the right sides, sectional views of a peripheral circuit region in the steps of the fabrication method and, on the left sides, the sectional views of the semiconductor device along the line A-A' of FIG. 1 in the steps of the fabrication method. FIGS. 21A–21B, 22A–22B, 23A–23B, and 24A–24B show the sectional views of the semiconductor device along the line B-B' of FIG. 1 in the steps of the fabrication method.

First, in the same way as in, e.g., the method for fabricating the semiconductor device according to the first embodiment shown in FIGS. 3A to 4A and FIGS. 8A to 9A, a memory cell transistor, a peripheral circuit transistor, a bit line 52, inter-layer insulation films 46, 56, etc. are formed.

Next, a contact hole 58 is formed in the inter-layer insulation films 46, 56 down to the plug 42 by the lithography and etching.

Then, a 5–10 nm-thick Ti film, for example, a 5–20 nm-thick TiN film, for example, and a 500 nm-thick W film, for example, are deposited on the entire surface by, e.g., CVD method.

Figure 17A:
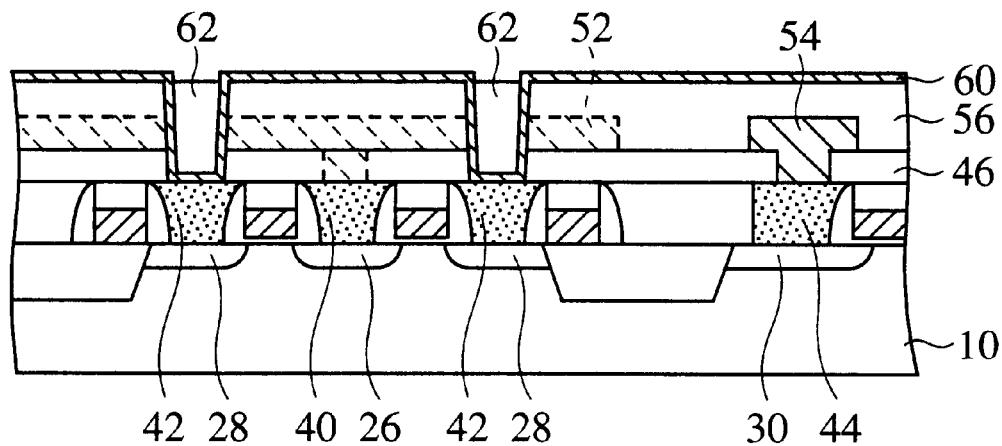
Figure 21A:
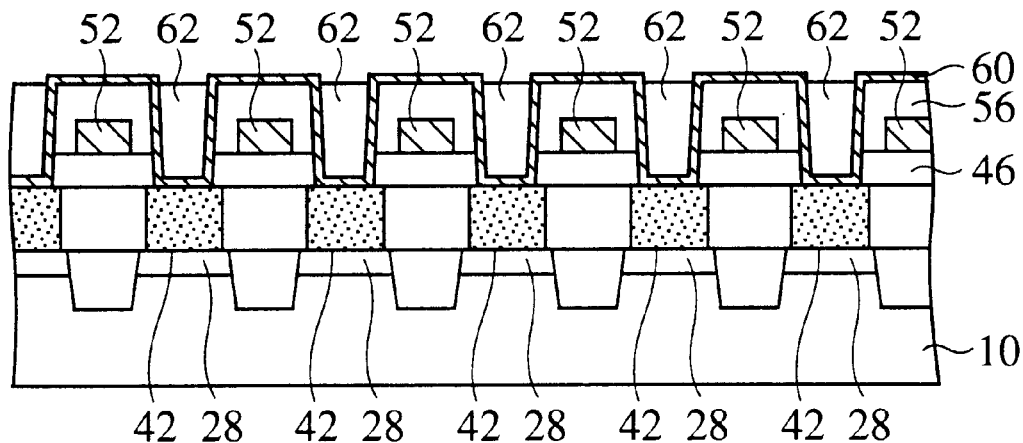

Then, the W film is flatly removed by CMP method or etching back until the surface of the TiN film is exposed. Thus, the barrier metal 60 of the Ti film and the TiN film is formed on the inter-layer insulation film 56 and along the inside wall and the bottom of the contact hole, and a dummy plug 62 of the W film is formed selectively buried in the contact hole with the barrier metal 60 formed therein (FIG. 17A, FIG. 21A). At this time, concurrently with forming the barrier metal 60 and the dummy plug 62, a usual electrode plug may be formed of the TiN film and the W film in the peripheral circuit region.

The barrier metal 60 extended over the inter-layer insulation film 56 functions also as the etching stopper film 64 of the semiconductor device and the method for fabricating the same according to the first embodiment.

Then, a 700 nm-thick silicon oxide film, for example, is deposited on the entire surface by, e.g., CVD method to form an inter-layer insulation film 66 of the silicon oxide film.

Next, a 50 nm-thick amorphous silicon film, for example, is deposited on the inter-layer insulation film 66 by, e.g., CVD method to form a hard mask 68 of the amorphous silicon film.

Figure 17B:
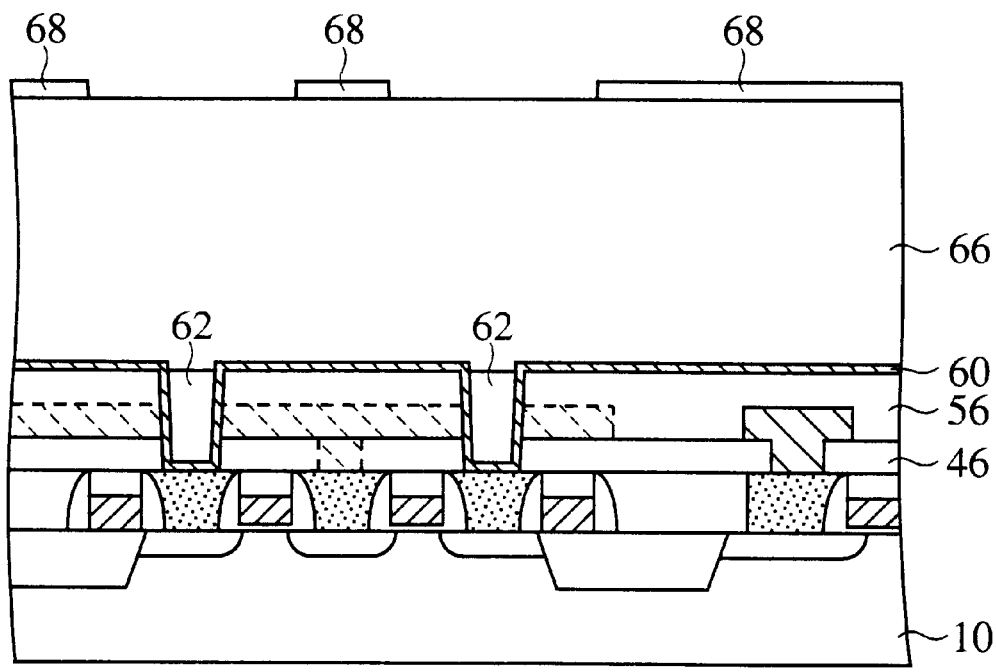
Figure 21B:
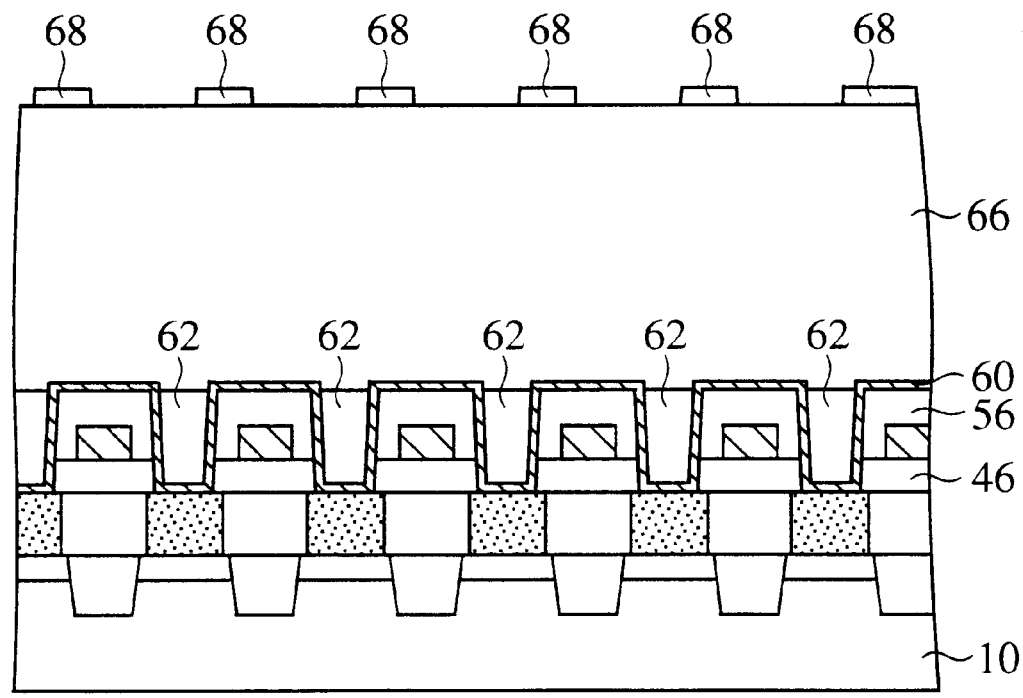

Then, the hard mask in the region for the storage electrode 72 to be formed in is removed by the lithography and etching (FIG. 17B, FIG. 21B).

Figure 18A:
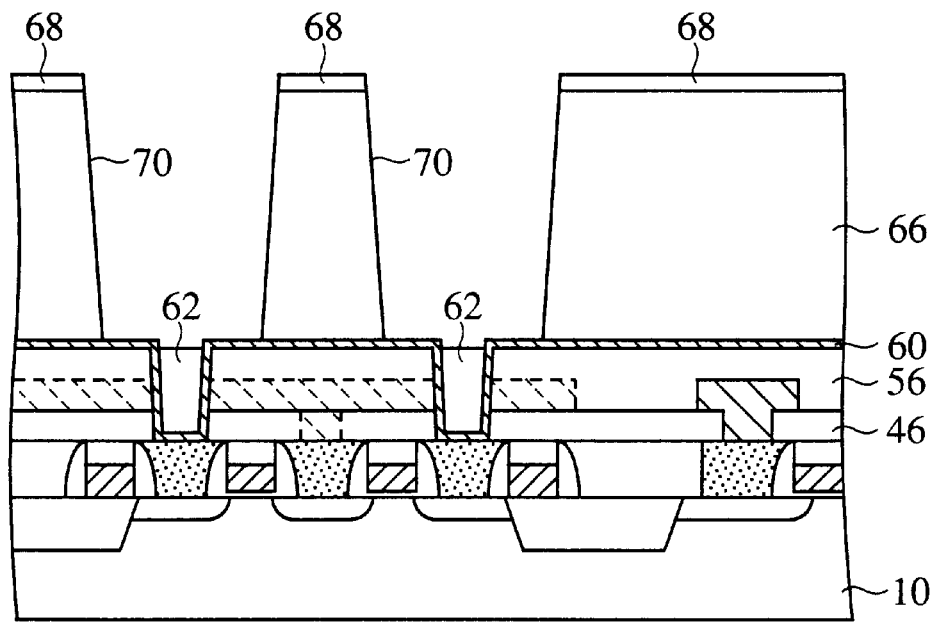
Figure 22A:
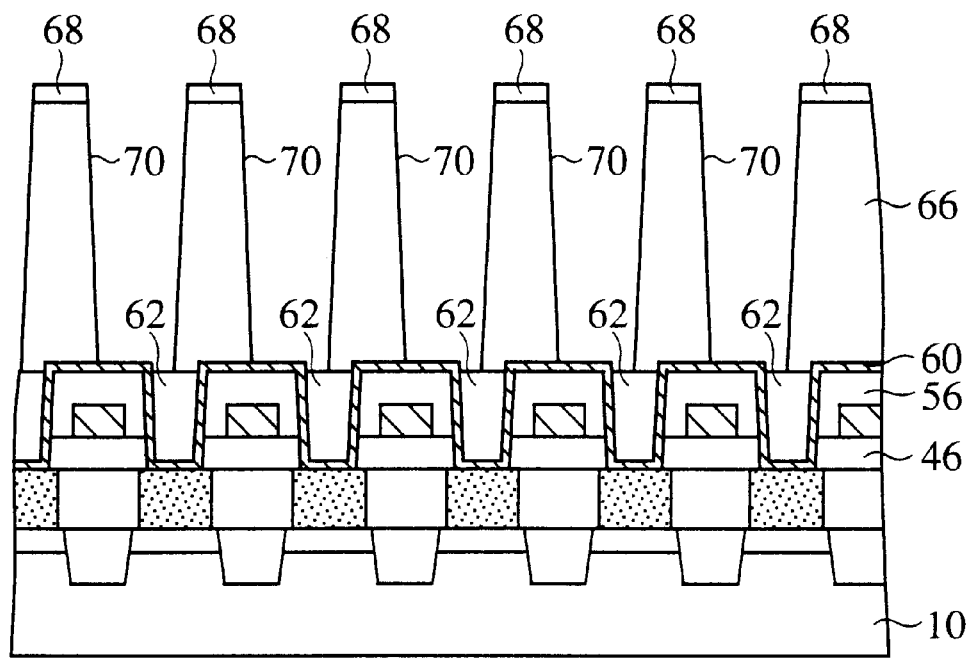

Then, with the hard mask 68 as a mask and the barrier metal 60 and the dummy plug 62 as a stopper, the inter-layer insulation film 66 is anisotropically etched to form an opening 70 exposing the dummy plug 62 through the inter-layer insulation film 66 (FIG. 18A, FIG. 22A).

Figure 18B:
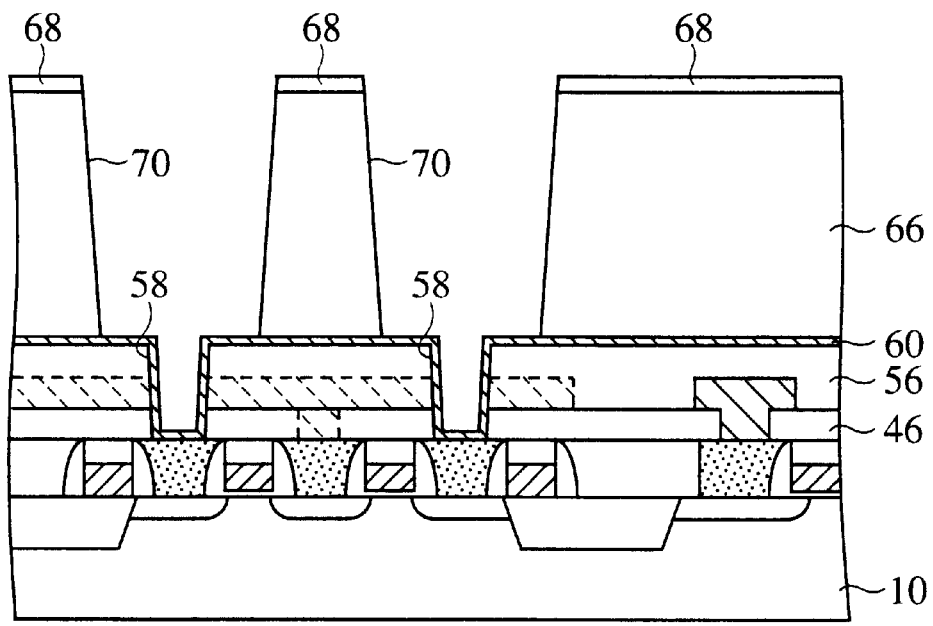
Figure 22B:
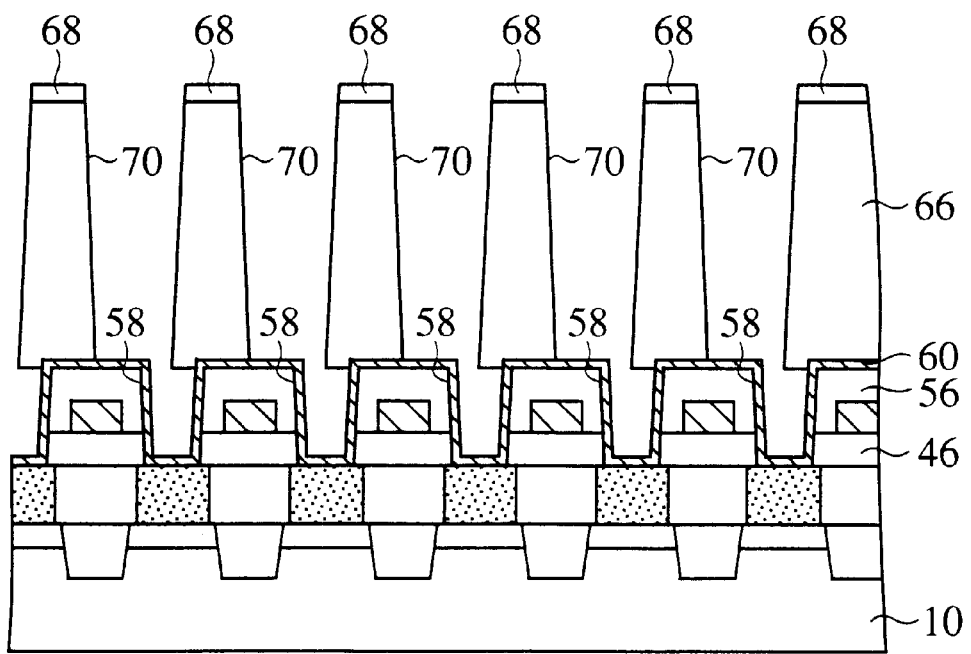

Next, the dummy plug 62 is selectively removed by isotropic etching, as of wet etching. By using isotropic etching, even when disalignment takes place, that of the dummy plug 62 exposed in the opening 70 is first etched, and gradually all the dummy plug in the contact hole 58 can be removed. By this etching, the barrier metal 60 along the inside wall and the bottom of the contact hole 58 is left in the contact hole 58 (FIG. 18B, FIG. 22B).

Figure 19A:
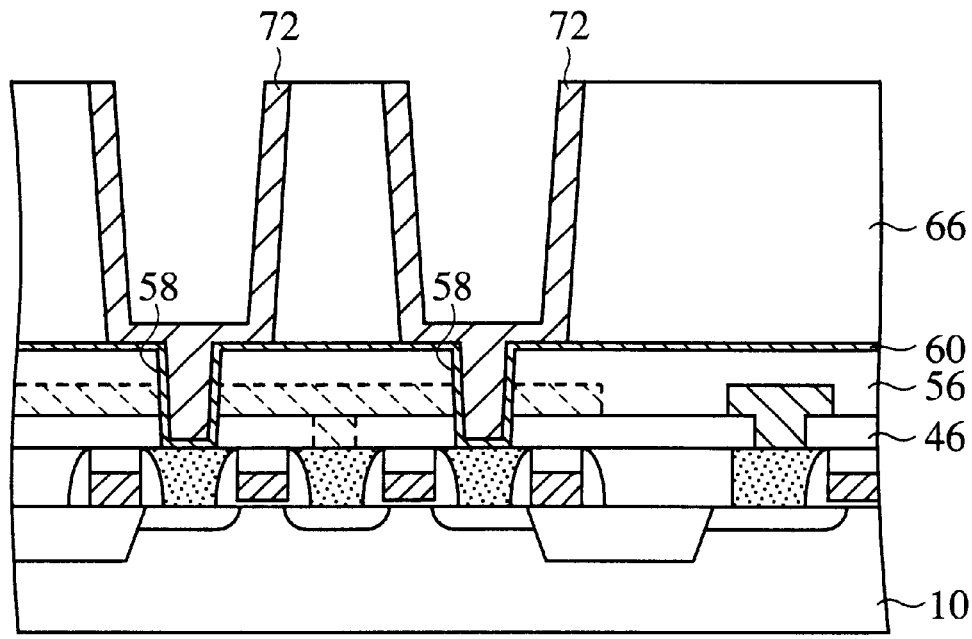
Figure 23A:
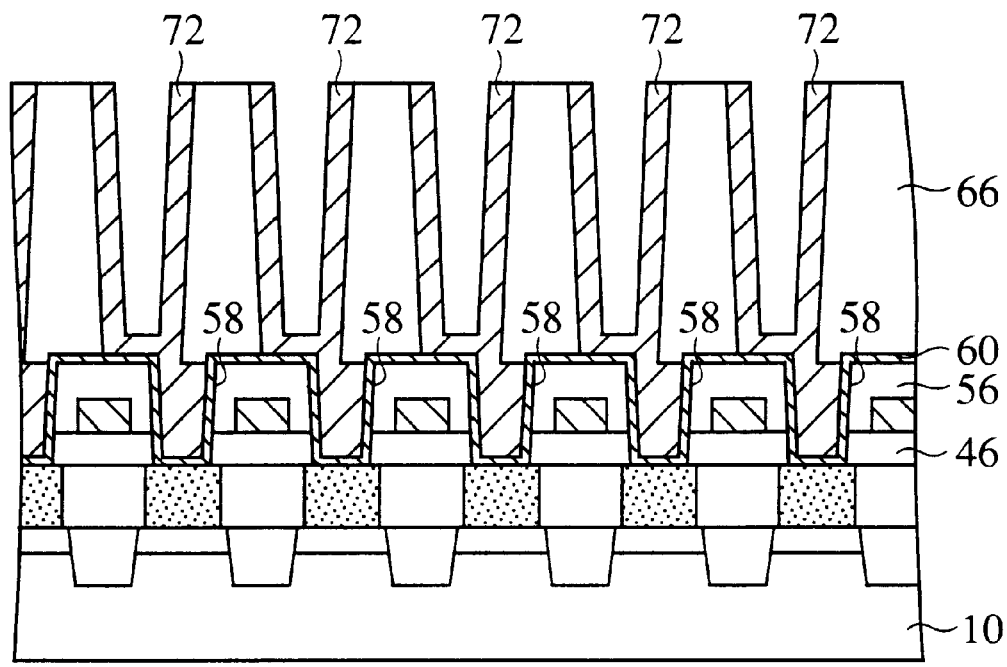

Then, in the same way as in, e.g., the method for fabricating the semiconductor device according to the first embodiment shown in FIGS. 6A–11A, the storage electrode 72 of Ru film is formed on the inside wall and bottom of the opening 70 and buried in the contact hole through the barrier metal 60 and electrically connected to the plug 42 (FIG. 19A, FIG. 23A). The storage electrode 72 has a lower part supported by the inter-layer insulation films 46, 56, whereby the storage electrode 72 can be prevented from falling down or peeling off in later steps.

Figure 19B:
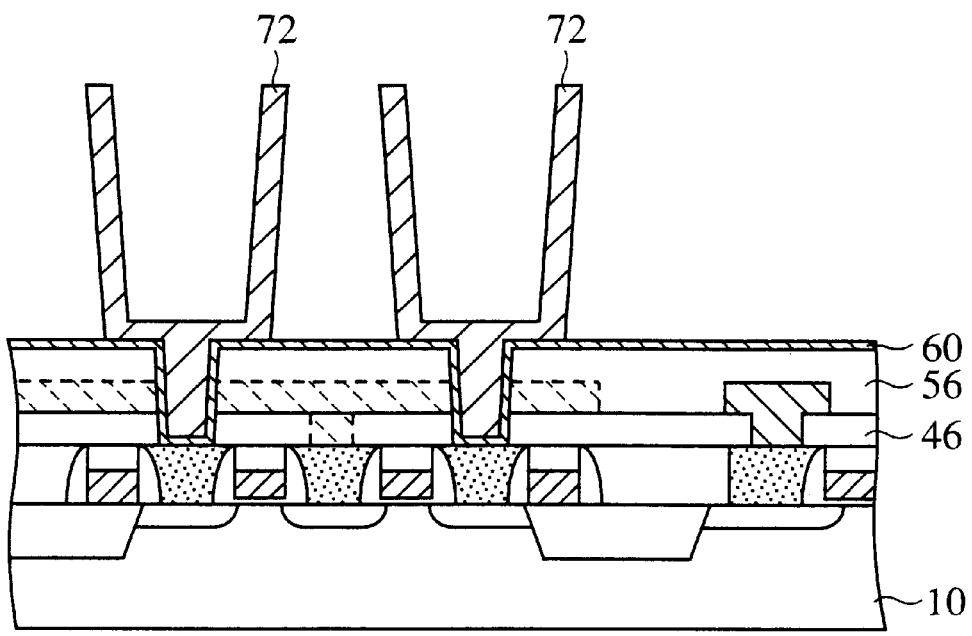
Figure 23B:
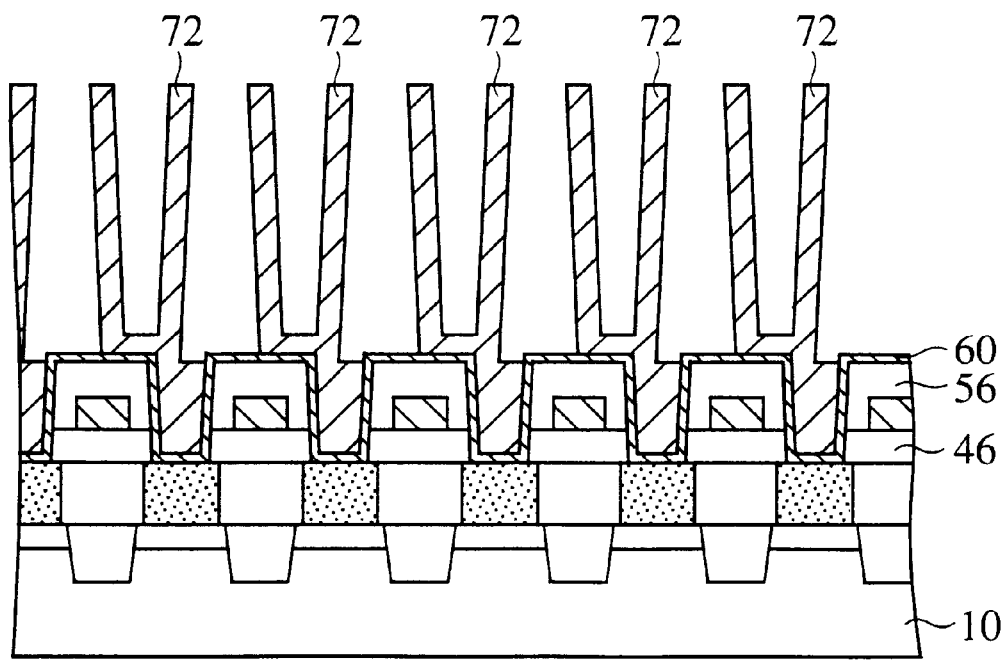

Next, the inter-layer insulation film 66 is selectively etched with the barrier metal 60 as a stopper by isotropic etching, as of wet etching or others using an aqueous solution of hydrofluoric acid, to expose the outside surface of the storage electrode 72 (FIG. 19B, FIG. 23B). At this time, all the underside of the inter-layer insulation film 66 is in contact with the barrier metal 60, whereby the etchant does not intrude into the layers below the barrier metal 60 to break the lower structure.

Figure 20A:
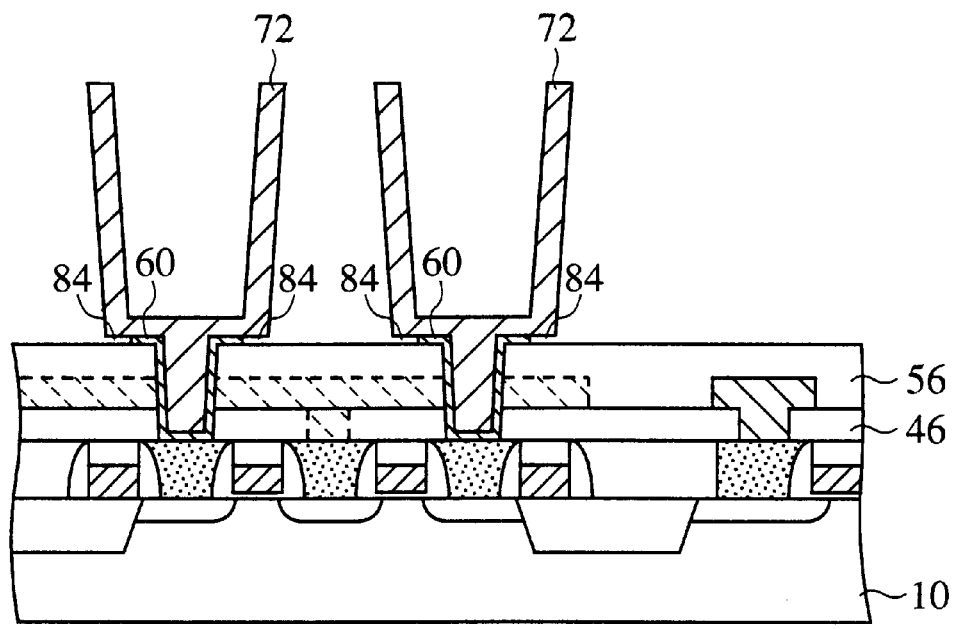
Figure 24A:
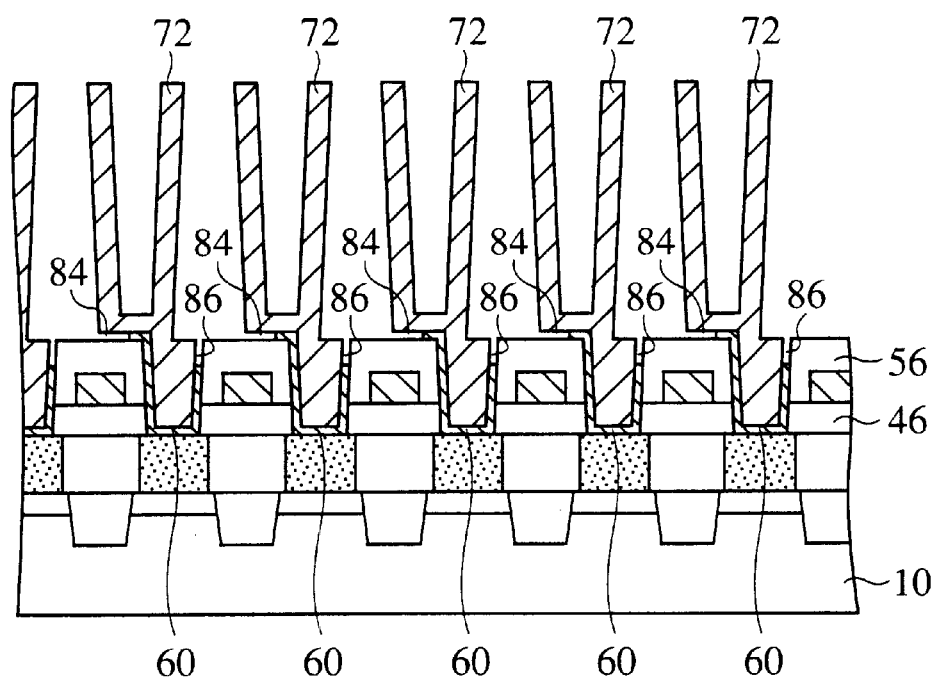

Then, the barrier metal 60 is etched with an aqueous solution containing, e.g., sulfuric acid and hydrogen peroxide selectively with respect to the storage electrode 72 and the inter-layer insulation film 56 (FIG. 20A, FIG. 24A). This etching is in consideration of removing the barrier metal extended over the peripheral circuit region and possible poor compatibility of the barrier metal 60 with a capacitor dielectric film 74 which will be formed later, and preferably etches the barrier metal 60 until a gap 84 is formed between the inter-layer insulation film 56 and the storage electrode 72. In a region where disalignment has taken place, this etching forms a gap 86 where the barrier metal 60 is not formed (see FIG. 24A).

It is not necessary to etch the barrier metal 60 until a gap is formed in a case that the contact between the barrier metal 60 and the capacitor dielectric film 74 causes no characteristics deterioration of the capacitor. A technique for preventing capacitor characteristics deterioration by using compatibility between the barrier metal (adhesion layer) and the capacitor dielectric film is detailed in the specification of Japanese Patent Application No. 315370/1998 filed by the applicant of the present application.

Figure 20B:
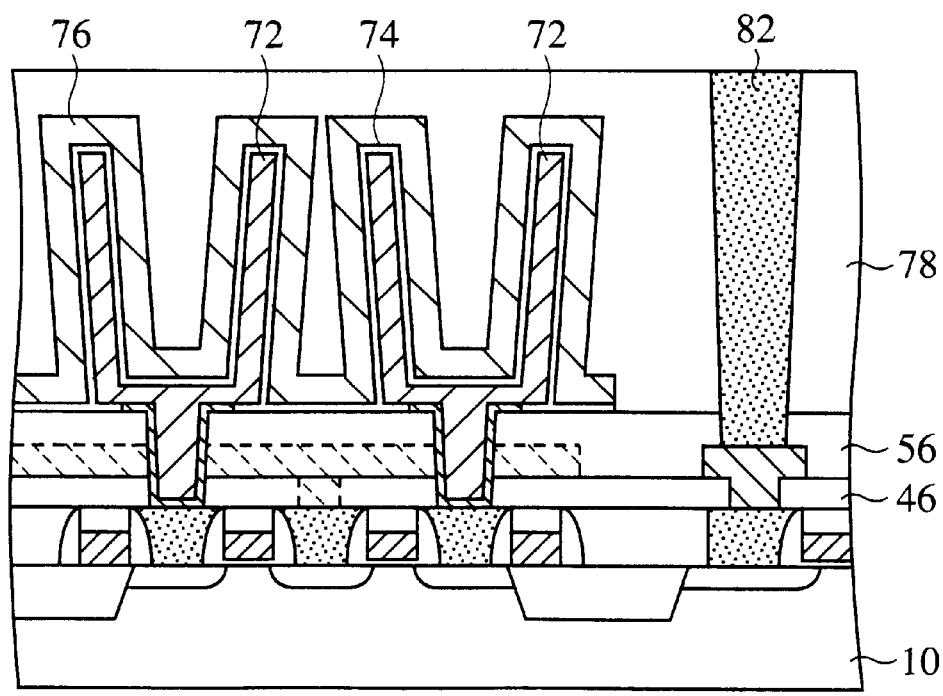
Figure 24B:
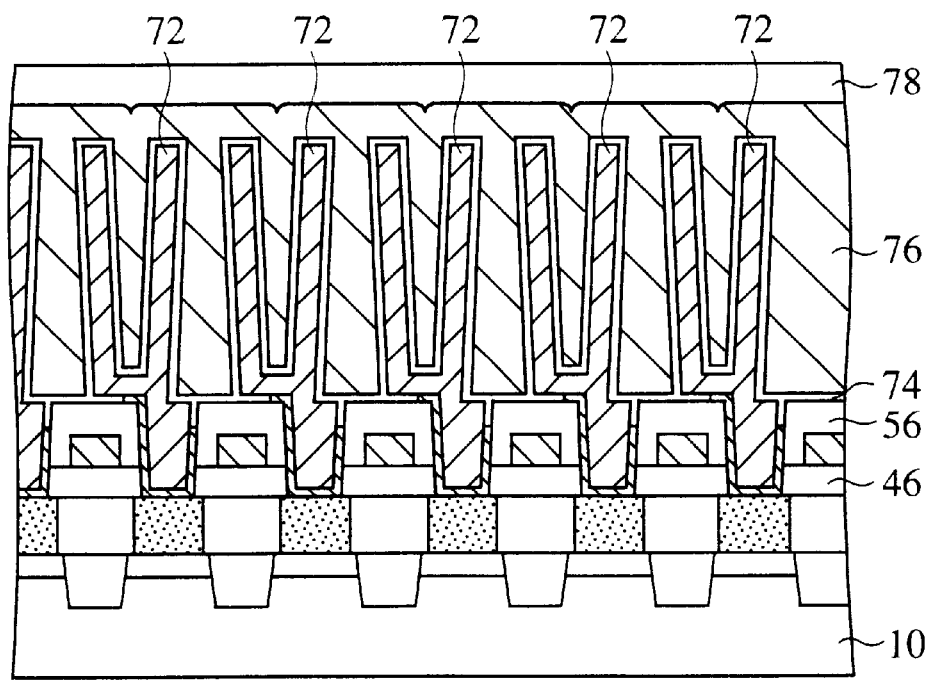

Then, in the same way as in, e.g., the method for fabricating the semiconductor device according to the first embodiment shown in FIGS. 7A to 7B and FIGS. 12A to 12B, the capacitor dielectric film 74, a plate electrode 76, an inter-layer insulation film 78, a plug 82, etc. are formed (FIG. 20B, FIG. 24B).

Thus, a DRAM comprising memory cells each having one transistor and one capacitor is fabricated.

As described above, according to the present embodiment, the dummy plug is formed in the lower inter-layer insulation film, the dummy plug is removed after the opening to be used in forming the storage electrode is formed in the upper inter-layer insulation film, and the storage electrode is formed with a part thereof buried in the contact hole, whereby without an extra support for supporting the storage electrode, the storage electrode is prevented from peeling off and falling down, and defective contact and breakage of the lower structure due to disalignment can be prevented.

In the semiconductor device according to the present embodiment, the barrier metal functions as the etching stopper film, whereby a number of fabrication steps can be smaller in comparison with that of the method for fabricating the semiconductor device according to the first embodiment.

[A Third Embodiment]

The semiconductor device and the method for fabricating the same according to a third embodiment of the present invention will be explained with reference to FIGS. 25, 26A–26B, 27A–27B, 28A–28B, and 29A–29B. The same members of the present embodiment as those of the semiconductor device and the method for fabricating the same according to the first and the second embodiments are represented by the same reference numbers not to repeat or to simplify their explanation.

FIG. 25 is a diagrammatic sectional view of the semiconductor device according to the present embodiment, which shows a structure thereof. FIGS. 26A–26B, 27A–27B, 28A–28B, and 29A–29B are sectional views of the semiconductor device according to the present embodiment in the steps of the method for fabricating the same, which show the method.

First, the structure of the semiconductor device according to the present embodiment will be explained with reference to FIG. 25. FIG. 25 is the sectional view along the line B-B' in FIG. 1.

As shown in FIG. 25, the semiconductor device according to the present embodiment has the same basic structure as the semiconductor device according to the second embodiment shown in FIGS. 16A and 16B. The method for fabricating the semiconductor device according to the present embodiment is characterized mainly in that a dummy plug 62 is not formed. This characteristic makes the final structure of the semiconductor device according to the present embodiment accordingly different from that of the semiconductor device according to the second embodiment. That is, in the semiconductor device according to the present embodiment, when disalignment takes place, an inter-layer insulation film 78 is often formed, extended over a side wall portion (an upper end portion of a contact hole 58) of an inter-layer insulation film 56.

Figure 26A:
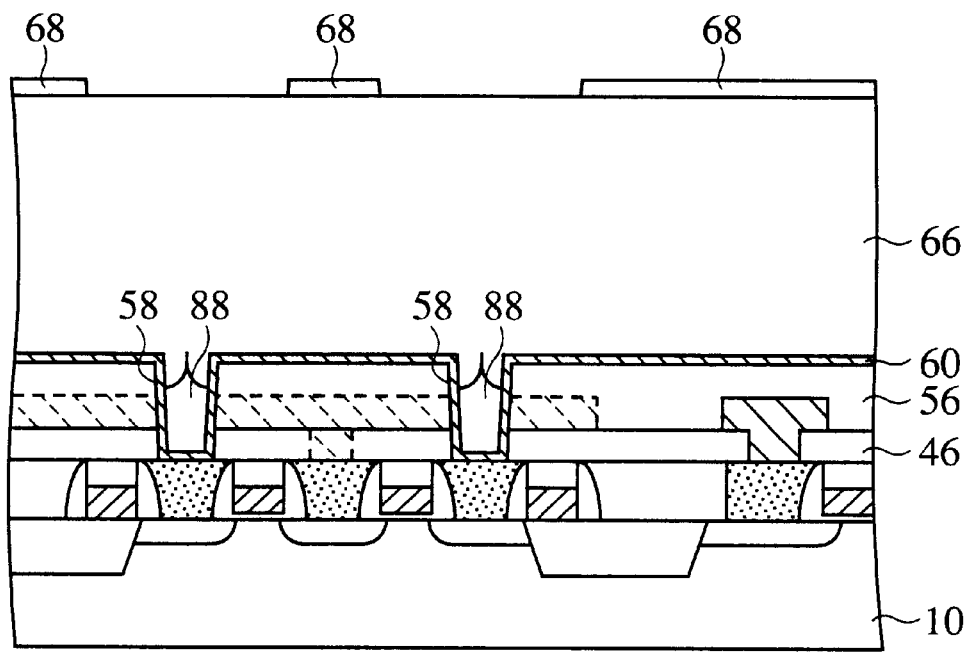
Figure 26B:
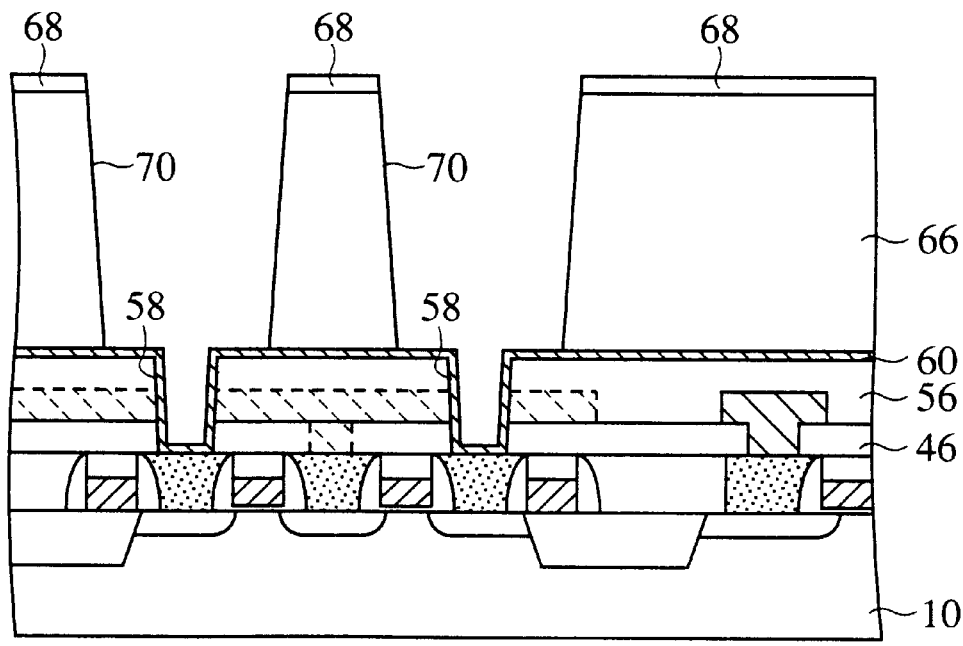

Then, the method for fabricating the semiconductor device according to the present embodiment will be explained with reference to FIGS. 26A–26B, 27A–27B, 28A–28B, and 29A–29B. In the following explanation, the method for fabricating the semiconductor device according to the present embodiment will be explained with reference to sectional views in which disalignment has taken place in the direction of extension of a word line. FIGS. 26A and 26B show, on the right sides, sectional views of a peripheral circuit region in the steps of the fabrication method and, on the left sides, the sectional views of the semiconductor device along the line A-A' of FIG. 1 in the steps of the fabrication method. FIGS. 27A–27B, 28A–28B, and 29A–29B show the sectional views of the semiconductor device along the line B-B' of FIG. 1 in the steps of the fabrication method.

First, in the same way as in, e.g., the method for fabricating the semiconductor device according to the first embodiment shown in FIGS. 3A to 4A and FIGS. 8A to 9A, a memory cell transistor, a peripheral circuit transistor, a bit line 52, inter-layer insulation films 46, 56, etc. are formed.

Next, a contact hole 58 is formed in the inter-layer insulation films 46, 56 down to the plug 42 by the lithography and etching.

Then, a 5–10 nm-thick Ti film, for example, and a 5–20 nm-thick TiN film, for example, are deposited on the entire surface by, e.g., CVD method. Thus, the barrier metal 60 of the Ti film and the TiN film is formed.

Next, a 700 nm-thick silicon oxide film, for example, is deposited on the entire surface by, e.g., CVD method to form the inter-layer insulation film 66 of the silicon oxide film. At this time, the inter-layer insulation film 66 is deposited under deposition conditions which make the surface coverage poor at least at the initial stage of the film deposition.

For good coverage, generally, a low deposition temperature, a low gas supply rate and a deposition pressure as low as possible are set. For poor coverage, oppositely a high deposition temperature and a deposition pressure as high as possible are set. Conditions for leaving a void 88 in the contact hole 58 depend also on an aspect ratio of the contact hole 58. Smaller aspect ratios make it more difficult to form the void 88 in the bottom of the contact hole 58. Larger aspect ratios make it easier to form the void 88. Accordingly, in depositing the inter-layer insulation film 66, deposition conditions must be set in consideration of these points.

For example, when an open diameter of the contact hole 58 is below about 0.2 μm, and an aspect ratio is above 2, the inter-layer insulation film 66 is formed, for example, at a deposition temperature of 400° C. and by the use of $SiH_4$+$O_2$ as a deposition gas, whereby the void 88 can be left in the contact hole 58.

Conditions for poor surface coverage are used to thereby make it difficult for the deposition to enter the contact hole 58, whereby the inter-layer insulation film 66 can be deposited, leaving the void 88 in the contact hole 58. In a region where disalignment has taken place, the inter-layer insulation film 66 is formed on an upper end portion of the contact hole, i.e., extended over a side wall portion of the inter-layer insulation film 56.

Next, a 50 nm-thick amorphous silicon film, for example, is deposited on the inter-layer insulation film 66 by, e.g., CVD method to form the hard mask 68 of the amorphous silicon film.

Figure 27A:
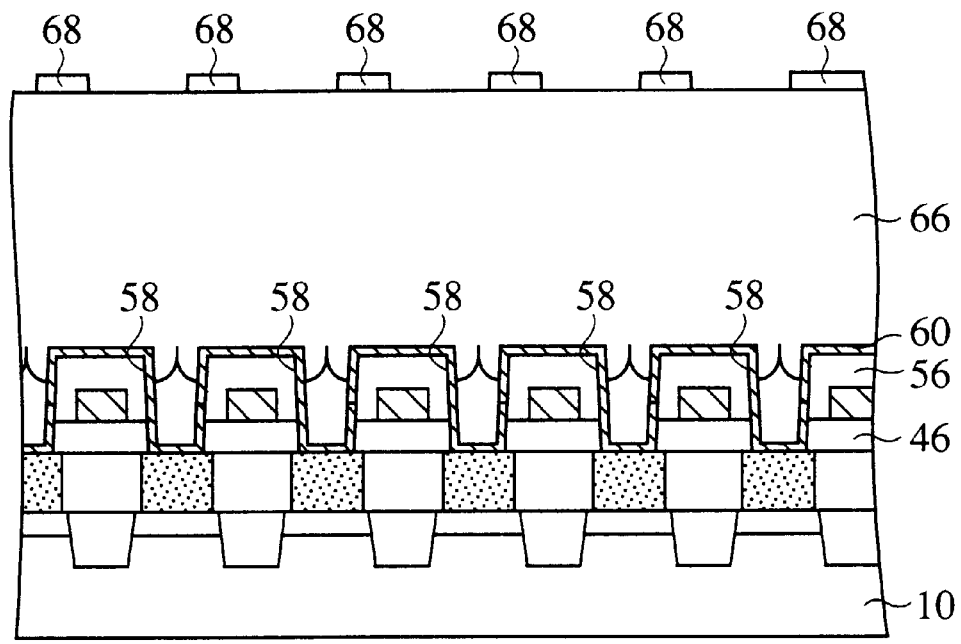

Then, the hard mask 68 in the region for the storage electrode 72 to be formed in is removed by the lithography and etching (FIG. 26A, FIG. 27A).

Figure 27B:
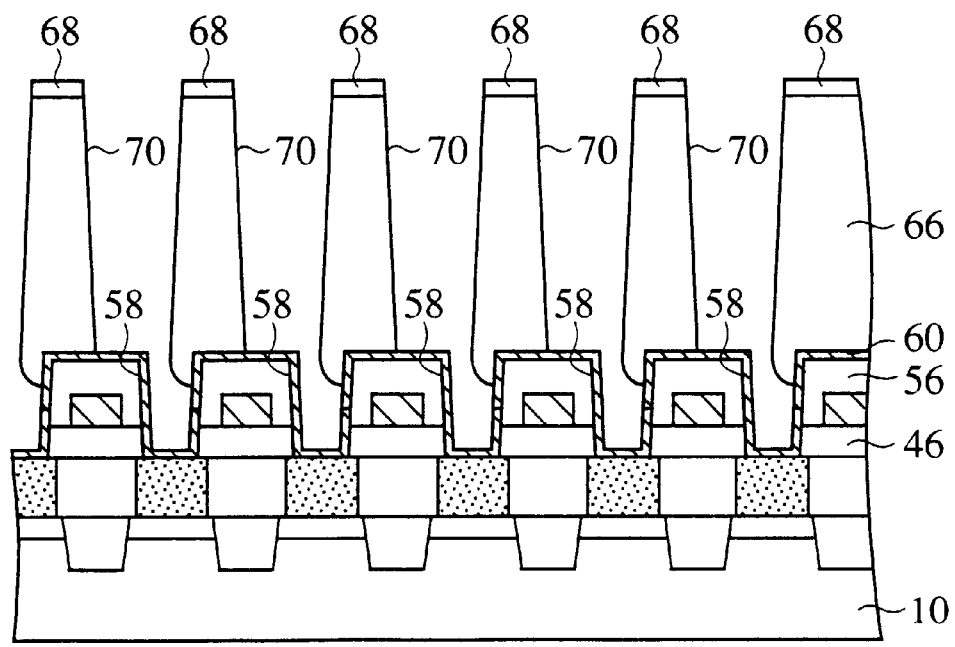

Next, with the hard mask 68 as a mask and the barrier metal 60 as a stopper, the inter-layer insulation film 66 is anisotropically etched. At this time, the barrier metal 60 formed on the inside wall and the bottom of the contact hole, in which no dummy plug is present, is exposed in the opening 70 (FIG. 26B, FIG. 27B).

Figure 28A:
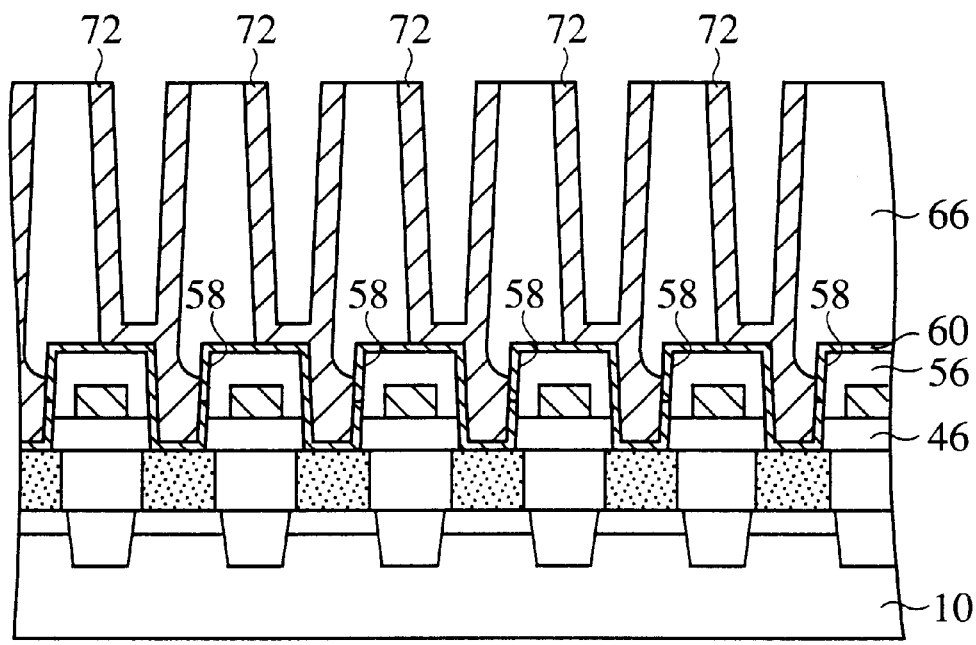

Then, in the same way as in, e.g., the method for fabricating the semiconductor device according to the first embodiment shown in FIG. 6A and FIG. 11A, the storage electrode 72 of Ru film is formed along the inside wall and the bottom of the opening 70, buried in the contact hole 50 and electrically connected to the plug 42 (FIG. 28A). The storage electrode 72 has a lower part supported by the inter-layer insulation films 46, 56, whereby the storage electrode 72 can be prevented from falling down or peeling off in later steps.

The sectional views of the semiconductor device according to the present embodiment along the direction extension of a bit line 52 in the following steps are the same as those of the semiconductor device according to the second embodiment in the steps of the method for fabricating the same shown in FIGS. 19A to 20B.

Figure 28B:
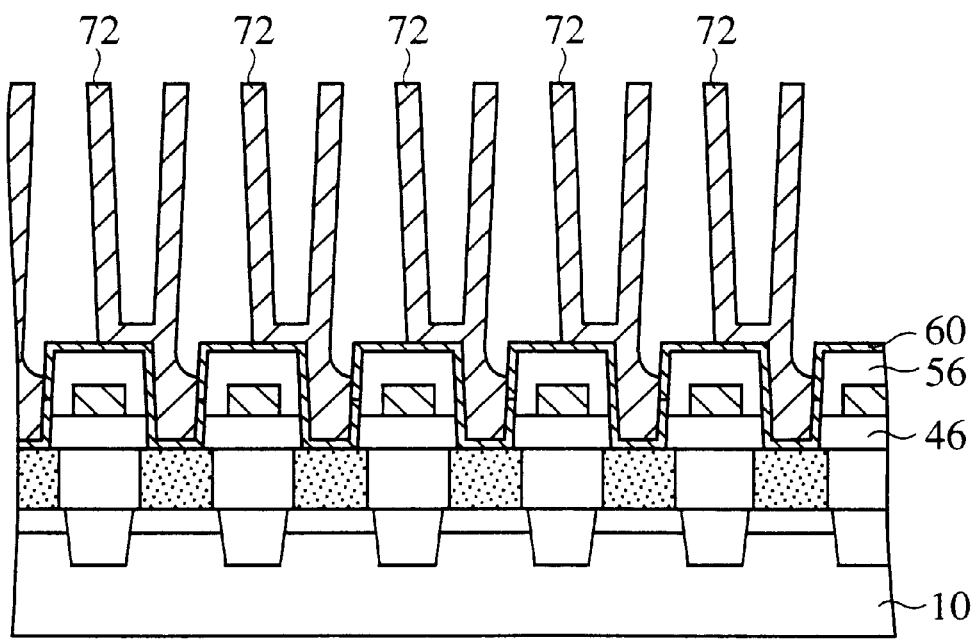

Then, the inter-layer insulation film 66 is selectively etched with the barrier metal 60 as a stopper by isotropic etching, as of wet etching using an aqueous solution of hydrofluoric acid, to expose the outside surface of the storage electrode 72 (FIG. 28B). At this time, because all the underside of the inter-layer insulation film 66 is in contact with the barrier metal 60, the etchant never intrudes into the layers below the barrier metal 60 to break the below structure.

Then, the barrier metal 60 is etched with an aqueous solution containing, e.g., sulfuric acid and hydrogen peroxide selectively with respect to the storage electrode 72 and the inter-layer insulation film 56. This etching is in consideration of removing the barrier metal 60 extended over the peripheral circuit region and possible poor compatibility of the barrier metal 60 with a capacitor dielectric film 74 which will be formed later, and preferably, the barrier metal 60 is etched until a gap 84 is formed between the inter-layer insulation film 56 and the storage electrode 72. In a region where disalignment has taken place, this etching forms a gap 86 where the barrier metal 60 is not formed (see FIG. 29A).

Figure 29A:
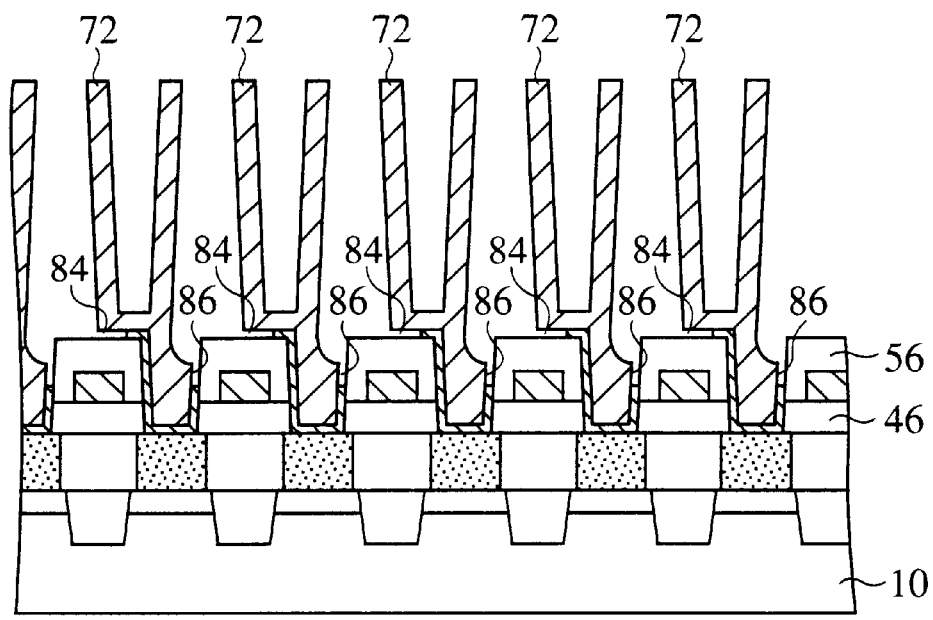
Figure 29B:
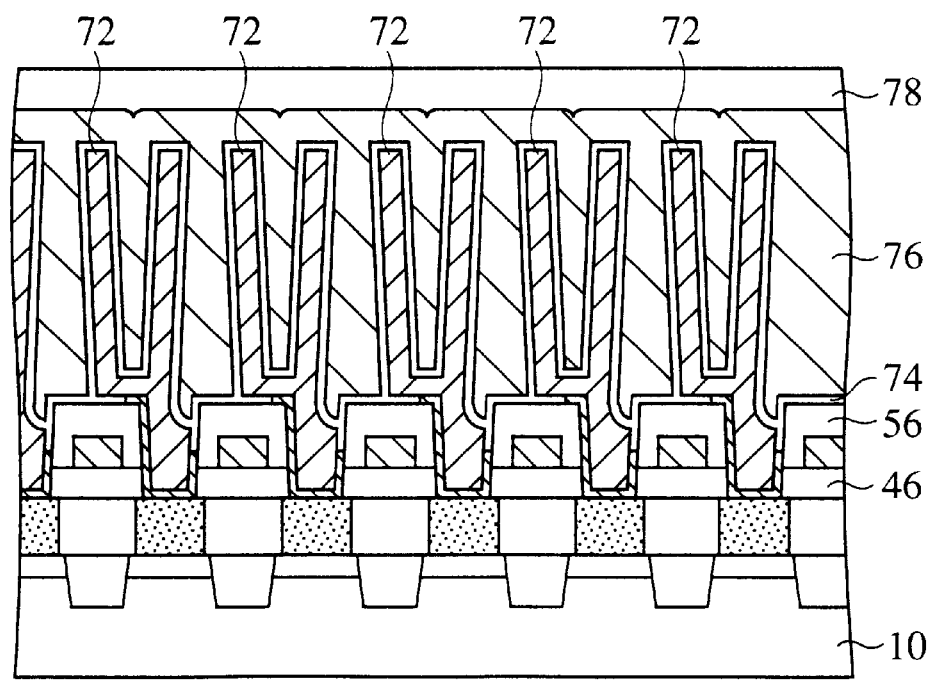

Then, in the same way as in, e.g., the method for fabricating the semiconductor device according to the first embodiment shown in FIGS. 7A to 7B and FIGS. 12A to 12B, the capacitor dielectric film 74, a plate electrode 76, an inter-layer insulation film 78, a plug 82, etc. are formed (FIG. 29B).

Thus, a DRAM comprising memory cells each having one transistor and one capacitor is fabricated.

As described above, according to the present embodiment, a void in place of the dummy plug is formed in the lower inter-layer insulation film, the opening is formed in communication with the void, and the storage electrode is formed, partially buried in the void, whereby without providing an extra support for supporting the storage electrode, the storage electrode can be prevented from falling down or peeling off, and defective contact and breakage of the below structure due to disalignment can be precluded.

The method for fabricating the semiconductor device according to the present embodiment does not require a film forming step for forming the dummy plug, and a CMP step or an etching back step for selectively burying the dummy plug in the contact hole, which provides an advantageous effect that the fabrication process can be shortened, and fabrication costs can be low.

[A Fourth Embodiment]

The semiconductor device and the method for fabricating the same according to a fourth embodiment of the present invention will be explained with reference to FIGS.

30A–30B, 31A–31B, 32A–32B, 33A–33B, and 34A–34B. The same members of the present embodiment as those of the semiconductor device and the method for fabricating the same according to the first to the third embodiments are represented by the same reference numbers not to repeat or to simplify their explanation.

FIGS. 30A and 30B are diagrammatic sectional views of the semiconductor device according to the present embodiment, which show the structure thereof. FIGS. 31A–31B, 32A–32B, 33A–33B, and 34A–34B are sectional views of the semiconductor device according to the present embodiment in the steps of the method for fabricating the same, which show the method.

First, the structure of the semiconductor device according to the present embodiment will be explained with reference to FIGS. 30A and 30B. FIG. 30A is the sectional view along the line A-A' in FIG. 1. FIG. 30B is the sectional view along the line B-B' in FIG. 1.

As shown in FIGS. 30A and 30B, the semiconductor device according to the present embodiment has the same basic structure as that of the semiconductor device according to the first embodiment shown in FIGS. 2A and 2B. The semiconductor device according to the present embodiment is characterized mainly in that in place of leaving the barrier metal 60 on the inside wall and the bottom of the contact hole 58, an adhesion layer 90 is formed for increasing adhesion between inter-layer insulation films 46, 56 and an etching stopper film 64, and a storage electrode 72. The adhesion layer 90 is used in place of the barrier metal 60, whereby a part of the adhesion layer 90 is extended over the inter-layer insulation film 56 (see FIG. 30A), and when disalignment takes place, a region where the adhesion layer 90 is extended over the storage electrode 72 in the contact hole 58 is formed (see FIG. 30B).

The barrier metal 60 of the first to the third embodiments and the adhesion layer 90 of the present embodiment basically have the same function, and their different names make no sense. They are called by the different names for convenience only because they are formed in fabrication steps different from each other.

Next, the method for fabricating the semiconductor device according to the present embodiment will be explained with reference to FIGS. 31A–31B, 32A–32B, 33A–33B, and 34A–34B. The method for fabricating the semiconductor device according to the present embodiment will be explained with reference to sectional views in which disalignment has taken place in the direction of extension of a word line. In FIGS. 31A–31B and 32A–32B, the right sides of the respective drawings show sectional views of the peripheral circuit in the steps of the method for fabricating the semiconductor device, and the left sides of the respective drawings show sectional views of the semiconductor device in the steps of the method for fabricating the same along the line A-A' in FIG. 1. 33A–33B, and 34A–34B show the sectional views of the semiconductor device in the steps of the method for fabricating the same along the line B-B' of FIG. 1.

First, in the same way as in, e.g., the method for fabricating the semiconductor device according to the first embodiment shown in FIGS. 3A to 5B and FIGS. 8A to 10B, the opening 70 is formed in the inter-layer insulation film 66 and the etching stopper film 64, and the dummy plug 62 is selectively removed.

Figure 31A:
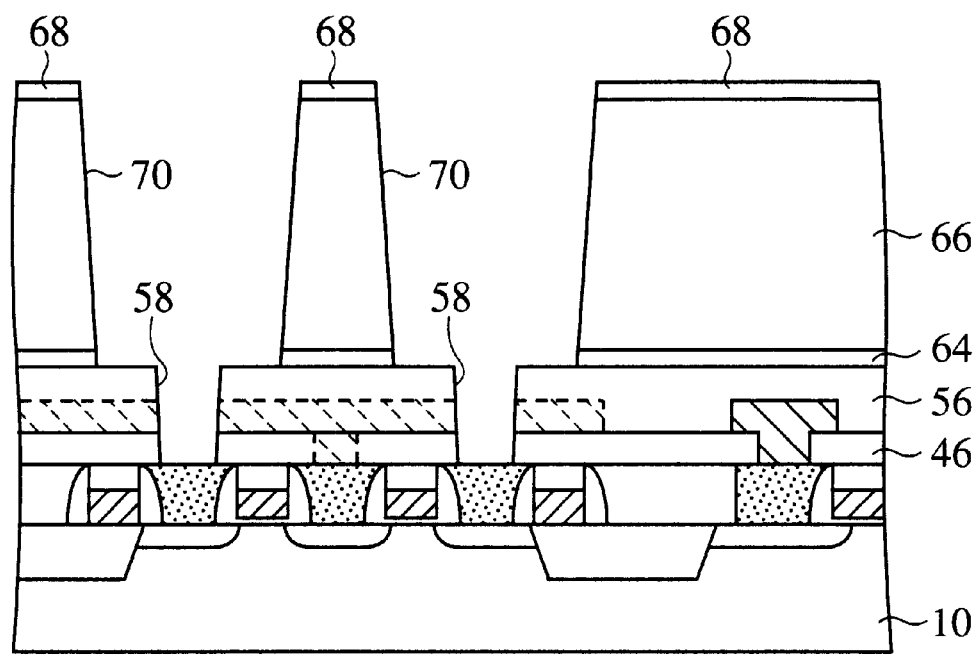
Figure 33A:
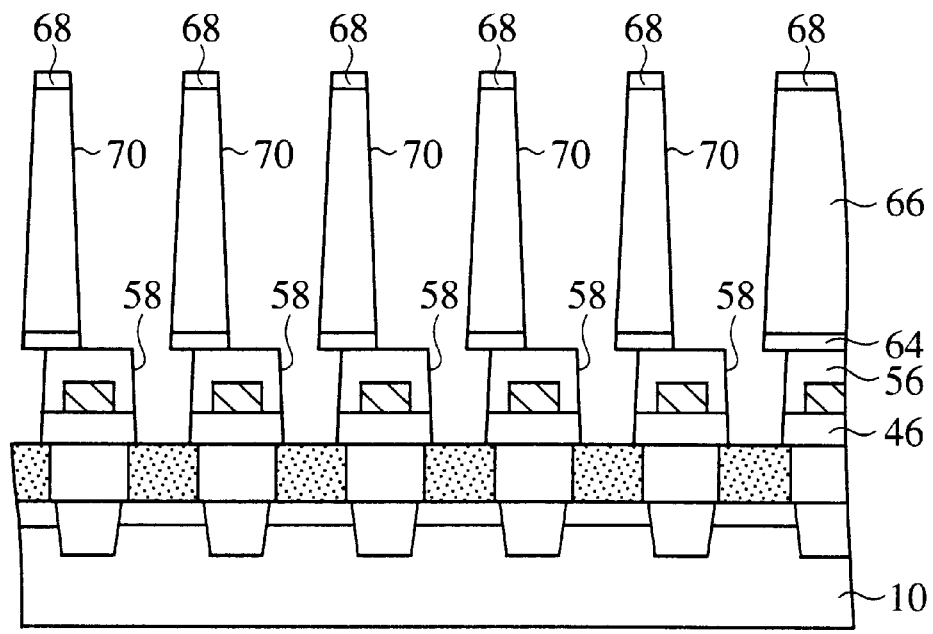

Then, the barrier metal 60 in the contact hole 58 is removed (FIG. 31A, FIG. 33A). It is possible that the barrier metal 60 is not formed in the steps of FIG. 4B and FIG. 9B, but the dummy plug 62 alone is formed in the contact hole 58, and only the dummy plug 62 is removed in the previous step.

Then, a 5–10 nm-thick Ti film, for example, a 5–20 nm-thick TiN film, for example, and a 30 nm-thick Ru film, for example, are deposited on the entire surface by CVD method. The Ru film is to form the storage electrode 72, and Ti film and the TiN films is to form an adhesion layer 90 for increasing adhesion between the storage electrode 72 and the plug 42 or between the storage electrode 72, and the etching stopper film 64 and the inter-layer insulation films 46, 56.

The adhesion layer 90 is formed of a conducting film having good adhesion between the storage electrode 72 and the plug 42 or between the storage electrode, and the etching stopper film 64 and the inter-layer insulation films 46, 56. For example, when the storage electrode 72 is formed of Ru, Pt, W, SRO ($SrRuO_3$) or others, the adhesion layer 90 can be formed of TiN, WN, a multi layer film, as of Ti+TiN, Ti+WN or others. In the present embodiment, the storage electrode 72 is formed of Ru film, and the adhesion layer 90 is formed of Ti film and TiN film. It is preferable that compatibility between the adhesion layer 90 and the capacitor film is good, but eve when the compatibility between these films is poor, deterioration of capacitor characteristics can be prevented by the means which will be described later.

Figure 31B:
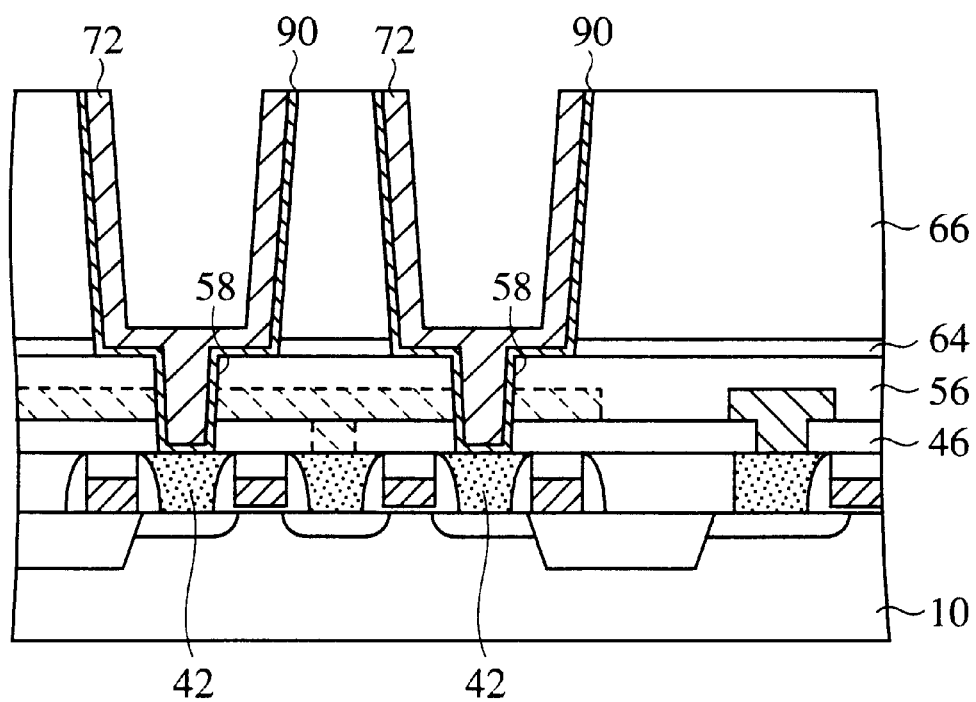
Figure 33B:
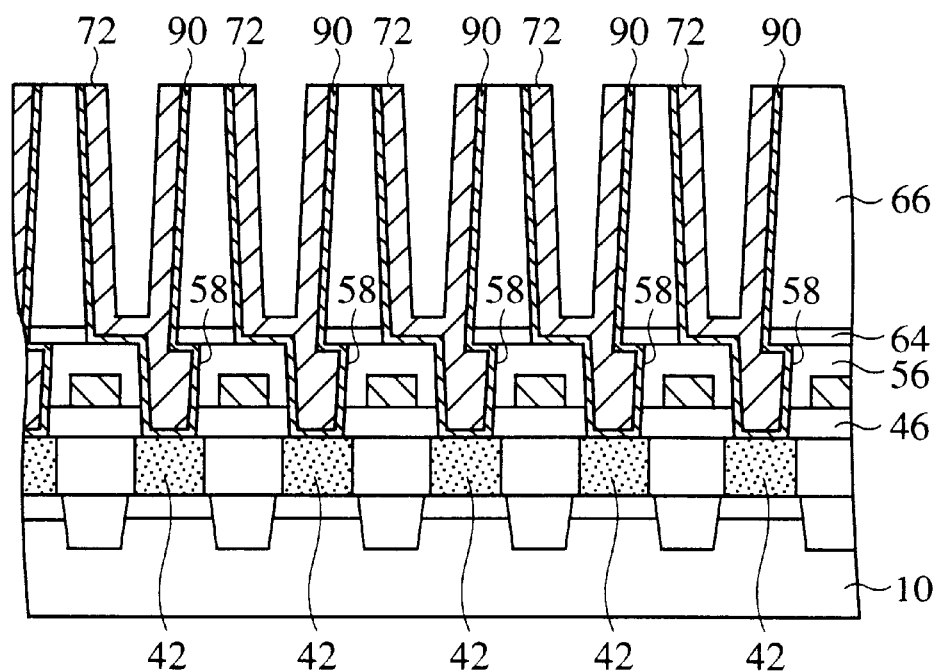

Next, in the same way as in, e.g., the method for fabricating the semiconductor device according to the first embodiment shown in FIGS. 6A and 11A, the storage electrode 72 of Ru film is formed on the inside wall and bottom of the opening 70 interposing the adhesion layer 90 therebetween, buried in the contact hole 58 interposing the adhesion layer 90 therebetween and electrically connected to the plug 42 (FIG. 31B, FIG. 33B). The storage electrode 72 has a lower part supported by the inter-layer insulation films 46, 56 and the etching stopper film 64, whereby the storage electrode 72 can be prevented from falling down or peeling off in later steps.

Figure 32A:
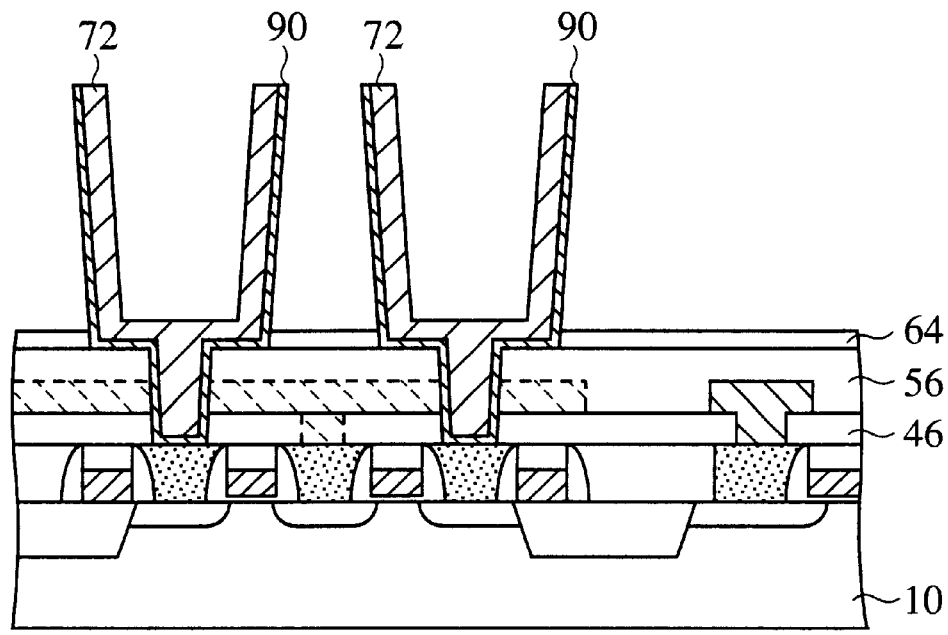
Figure 34A:
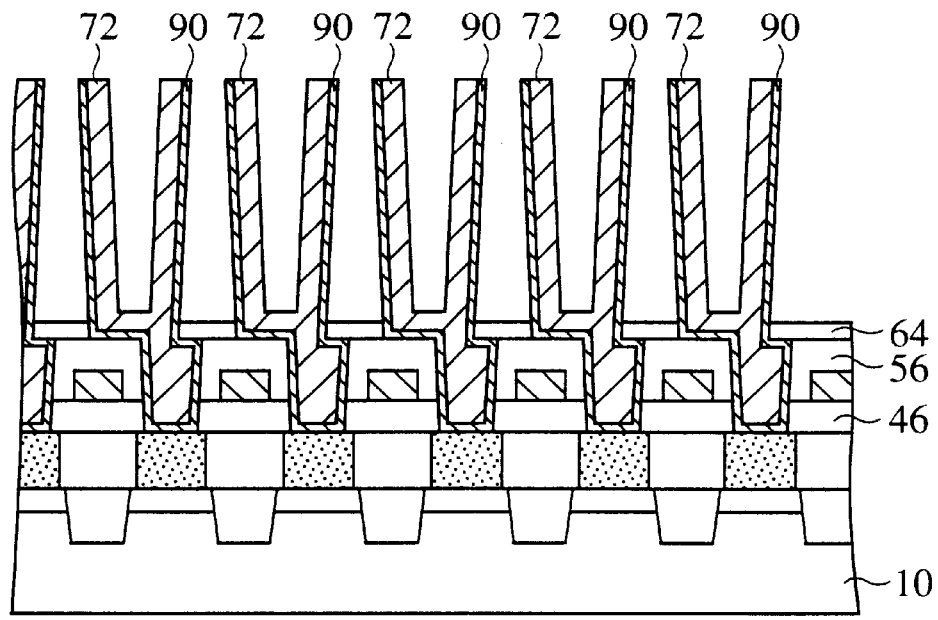

Then, by isotropic etching, as of wet etching or others using an aqueous solution of hydrofluoric acid, the inter-layer insulation film 66 is selectively removed with the etching stopper film 64 as a stopper to expose the outside surface of the storage electrode 72 (FIG. 32A, FIG. 34A). At this time, in etching the inter-layer insulation film 66, the etchant does not intrude into the lower layers below the etching stopper film 64 to break the below structure, because all the underside of the inter-layer insulation film 66 is in contact with the etching stopper film 64, and adhesion between the adhesion layer 90 and the etching stopper film 64, etc. is good.

Figure 32B:
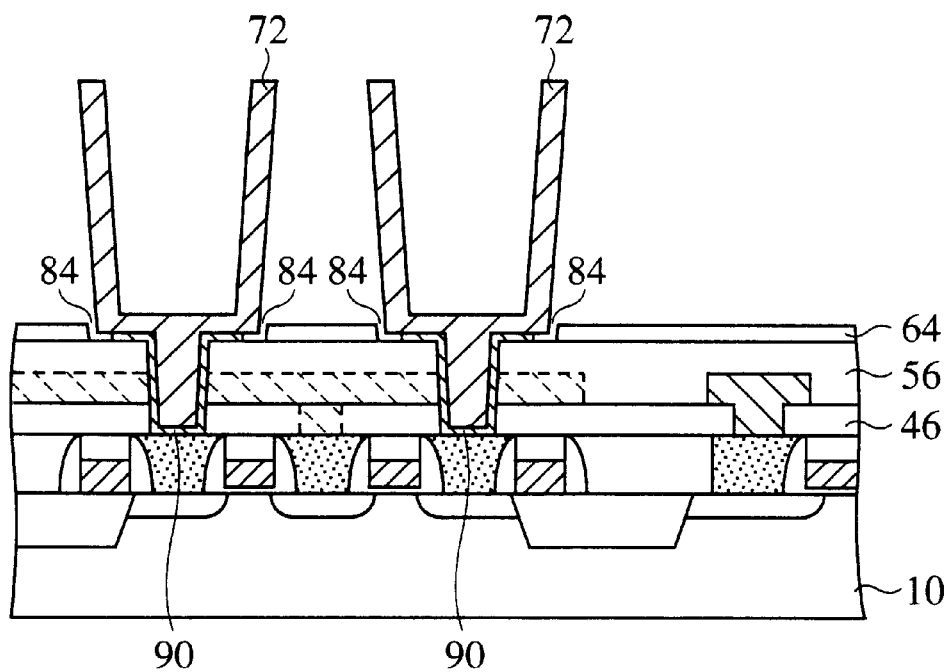
Figure 34B:
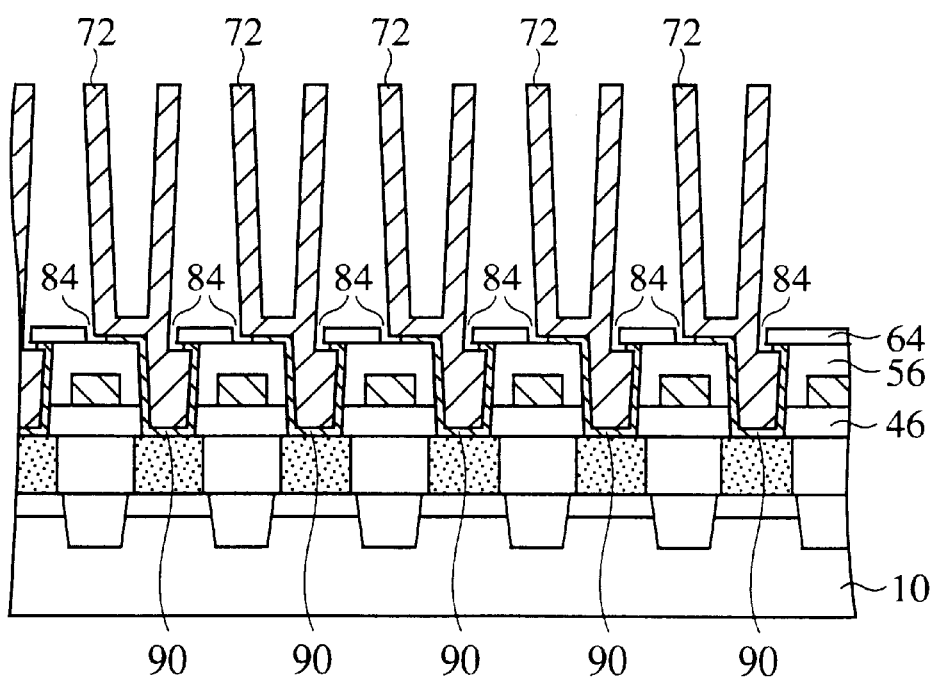

Then, the adhesion layer 90 is etched with, e.g., an aqueous solution containing sulfuric acid and hydrogen peroxide selectively with respect to the storage electrode 72, the etching stopper film 64 and the inter-layer insulation film 56 (FIG. 32B, FIG. 34B). This etching takes it into consideration that compatibility between the adhesion layer 90 and the capacitor dielectric film 74, which will be formed later, may be poor, and preferably the adhesion layer 90 is etched at least until a gap 84 is formed between the etching stopper film 64 and the storage electrode 72 is formed. The adhesion layer 90 may not be removed in a case that compatibility between the adhesion layer 90 and the capacitor dielectric film 74 is good.

Then, in the same way as in, e.g., the method for fabricating the semiconductor device according to the first embodiment shown in FIGS. 7A to 7B and FIGS. 12A to 12B, the capacitor dielectric film 74, the plate electrode 76, the inter-layer insulation film 78, the plug 82, etc. are formed.

Thus, a DRAM comprising memory cells each having one transistor and one capacitor is fabricated.

As described above, according to the present embodiment, the dummy plug is formed in the lower inter-layer insulation film, the dummy plug is removed after the opening to be used in forming the storage electrode is formed in the upper inter-layer insulation film, and the storage electrode is formed, partially buried in the contact hole from which the dummy electrode has been removed, whereby without an extra support for supporting the storage electrode, the storage electrode can be prevented from falling down or peeling off, and defective contact and breakage of the lower structure due to disalignment can be precluded.

[A Fifth Embodiment]

The semiconductor device and the method for fabricating the same according to a fifth embodiment of the present invention will be explained with reference to FIGS. 35, 36A–36B, and 37A–37B. The same members of the present embodiment as those of the semiconductor device and the method for fabricating the same according to the first to the fourth embodiments are represented by the same reference numbers not to repeat or to simplify their explanation.

FIG. 35 is a diagrammatic sectional view of the semiconductor device according to the present embodiment, which shows the structure thereof. FIGS. 36A–36B and 37A–37B are sectional views of the semiconductor device according to the present embodiment in the steps of the method for fabricating the same, which show the method.

First, the structure of the semiconductor device according to the present embodiment will be explained with reference to FIG. 35. FIG. 35 is the sectional view along the line A-A' in FIG. 1.

As shown in FIG. 35, the semiconductor device according to the present embodiment is characterized in that an inter-layer insulation film 66 used in forming a storage electrode 72 remains in a peripheral circuit region. The inter-layer insulation film 66 is thus left, whereby a global step between a memory cell region and the peripheral circuit region can be mitigated, and the step of planarizing an inter-layer insulation film 78 and the lithography step for forming an interconnection layer for a plug 82, etc. can be easy.

Next, the method for fabricating the semiconductor device according to the present embodiment will be explained with reference to FIGS. 36A–36B and 37A–37B. FIGS. 36A–36B and 37A–37B show on the right sides, sectional views of the peripheral circuit region in the steps of the method for the semiconductor device, and, on the left sides, show the sectional views along the line A-A' in FIG. 1.

Figure 36A:
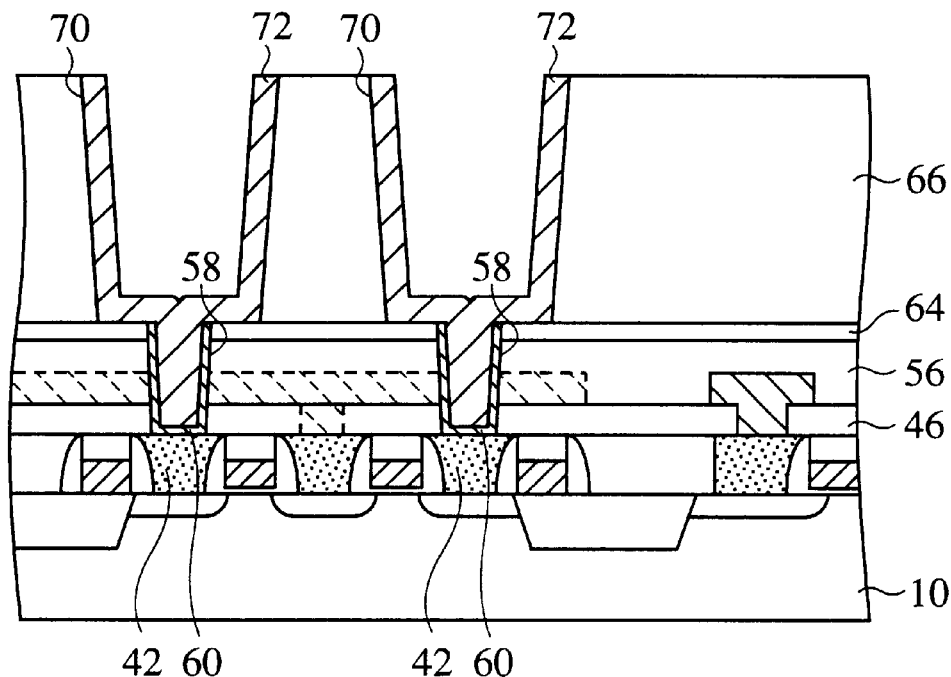

First, in the same way as in, e.g., the method for fabricating the semiconductor device according to the first embodiment shown in FIGS. 3A to 6A, a storage electrode 72 is formed along the inside wall and the bottom of opening 70 formed in the inter-layer insulation film 66 (FIG. 36A).

In the present embodiment, in the step of FIG. 4B, an etching stopper film 64 is formed on the inter-layer insulation film 56, a contact hole 58 is opened in the etching stopper film 64 and the inter-layer insulation films 56, 46 down to a plug 42, and a barrier metal 60 and a dummy plug 62 are formed in the contact hole 58.

Figure 36B:
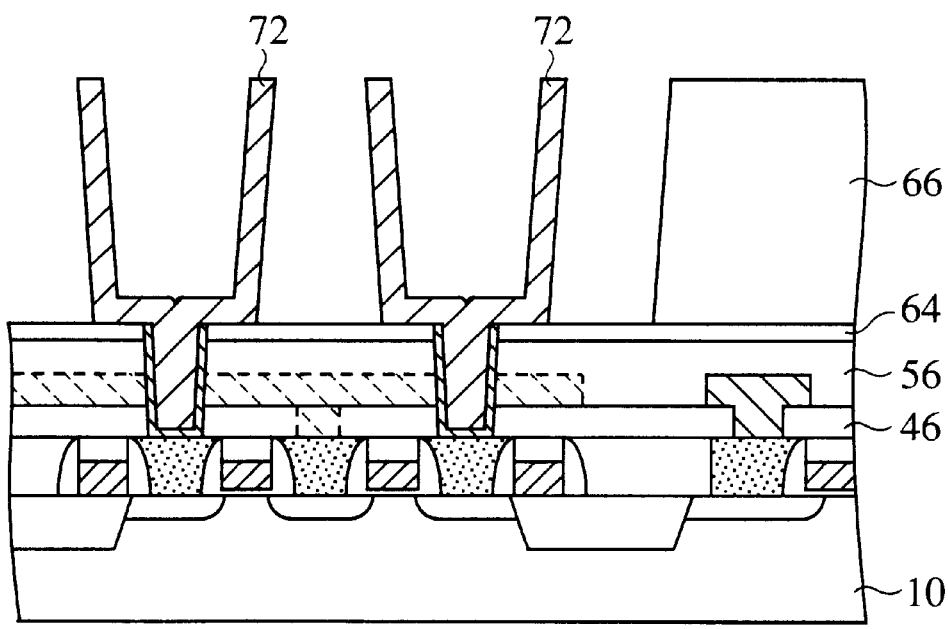

Then, the inter-layer insulation film 66 in the memory cell region is selectively removed by utilizing ooze of an etchant into between the inter-layer insulation film 66 and the storage electrode 72 or by utilizing a resist mask covering the peripheral circuit region (FIG. 36B). The method of etching the inter-layer insulation film 66 by utilizing ooze of an etchant is detailed in, e.g., the specification of Japanese Patent Application No. 2000-104361 and the specification of Japanese Patent Application No. 2000-185176, in which one of the inventors of the present application has took part in as a co-inventor.

For the selective removal of the inter-layer insulation film 66 in the memory cell region by utilizing ooze of an etchant into between the inter-layer insulation film 66 and the storage electrode 72, the storage electrode 72 and the inter-layer insulation film 66 are formed of materials which are poor in adhesion with each other so as to facilitate the ooze of the etchant into their interface. At this time, there is a risk that the etchant might intrude also into between the etching stopper film 64 and the storage electrode 72, and into between the inter-layer insulation film 52 and the storage electrode 72. However, the ends of the etching stopper film 64 are in contact with the barrier metal 60 having good adhesion with the etching stopper film 64, whereby the etchant does not ooze the lower layer below the etching stopper film 64 to etch the inter-layer insulation films 56, 46, etc.

In forming the storage electrode 72, which functions also as a contact plug connected to the plug 42 as in the semiconductor device according to the present embodiment, it is necessary in order to remove the inter-layer insulation film by utilizing ooze of the etchant into between the inter-layer insulation film 66 and the storage electrode 72 that the barrier metal (adhesion layer) is formed on the contact plug part but is not formed on the cylindrical projected part, or a selectively removable film is formed between the barrier metal and the inter-layer insulation film as described in the specification of Japanese Patent Application No. 2000-185176. In the present invention, however, the barrier metal 60 alone is left in the contact hole 58, and then the storage electrode 72 is formed, whereby the barrier metal 60 is formed selectively only in the contact plug part of the storage electrode 72. Thus, the present invention provides a very preferable structure for using the method of removing the inter-layer insulation film 66 by utilizing ooze of the etchant.

In the present embodiment, the contact hole 58 is formed after the etching stopper film 64 has been formed, for the purpose of preventing the etchant from oozing the lower layers below the etching stopper film 64. Accordingly, unless the method of removing the inter-layer insulation film 66 by utilizing ooze of the etchant into the interface is used, it is possible that, as in the first to the fourth embodiments, the etching stopper film 64 is formed after the contact hole 58, the barrier metal 60 and dummy plug 62 have been formed.

Next, a 10–30 nm-thick $Ta_2O_5$ film or BST film, for example, is deposited on the entire surface by, e.g., CVD method to form the capacitor dielectric film 74 of $Ta_2O_5$ or BST.

Figure 37A:
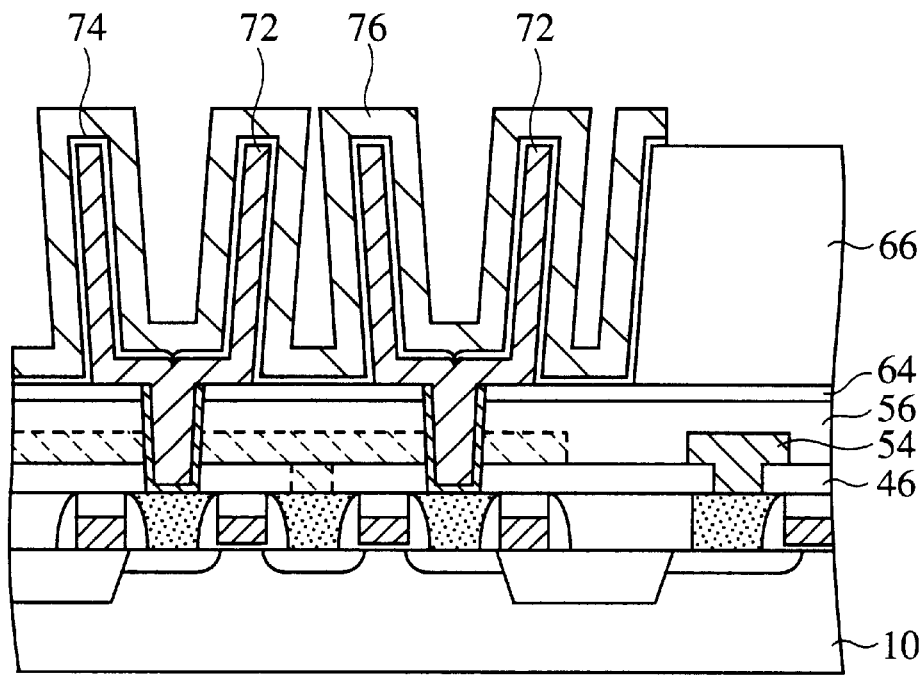

Then, a 50–300 nm-thick Ru film, for example, is deposited on the entire surface by, e.g., CVD method and patterned by the lithography and etching to form the plate electrode 76 of the Ru film (FIG. 7A, FIG. 37A).

Next, a 200–500 nm thick silicon oxide film, for example, is deposited on the entire surface by, e.g., CVD method, and the surface of the silicon oxide film is polished by CMP method to form the inter-layer insulation film 78 of the silicon oxide film having the surface planarized.

Next, the contact hole 80 is formed through the inter-layer insulation films 78, 66, the etching stopper film 64 and the inter-layer insulation film 56 down to the interconnection layer 54 by the lithography and etching.

Figure 37B:
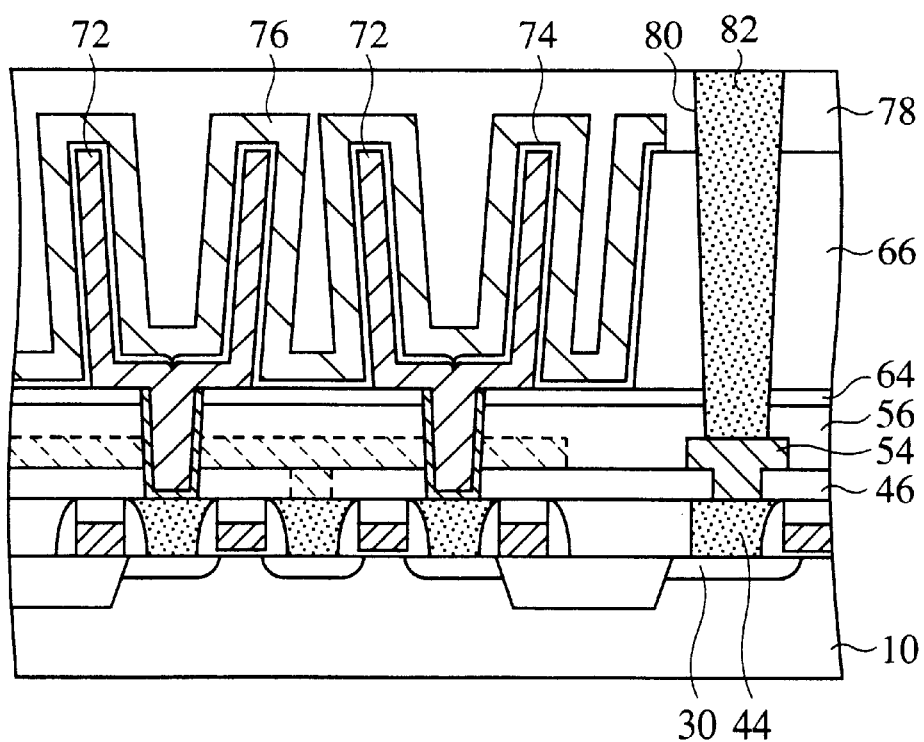

Next, a conducting film is deposited, and is removed flatly until the surface of the inter-layer insulation film 78 is exposed, to form the plug 82 buried in the contact hole 80 and connected to the interconnection layer 54 (FIG. 37B).

Thus, a DRAM comprising memory cells each having one transistor and one capacitor can be fabricated.

As described above, according to the present embodiment, the dummy plug is formed in the lower inter-layer insulation film, the dummy plug is removed after the opening to be used in forming the storage electrode has been formed in the upper inter-layer insulation film, and the storage electrode is formed partially buried in the contact hole from which the dummy plug has been removed. Accordingly, without an extra support for supporting the storage electrode, the storage electrode is prevented form falling down or peeling off, and defective contact and breakage of the lower structure due to disalignment can be precluded.

The inter-layer insulation film used in forming the storage electrode is left in the peripheral circuit region, whereby a global step between the memory cell region and the peripheral circuit region can be mitigated, which facilitates the step of planarizing the inter-layer insulation film and the lithography step for forming the interconnection layer for the plug, etc.

The semiconductor device according to the present invention has a structure which is suitable to utilize ooze of the etchant to remove the inter-layer insulation film, so that no lithography step is additionally necessary in the step of selectively removing the inter-layer insulation film in the memory cell region.

[Modifications]

The present invention is not limited to the above-described embodiments and cover other various modifications.

Figure 38A:
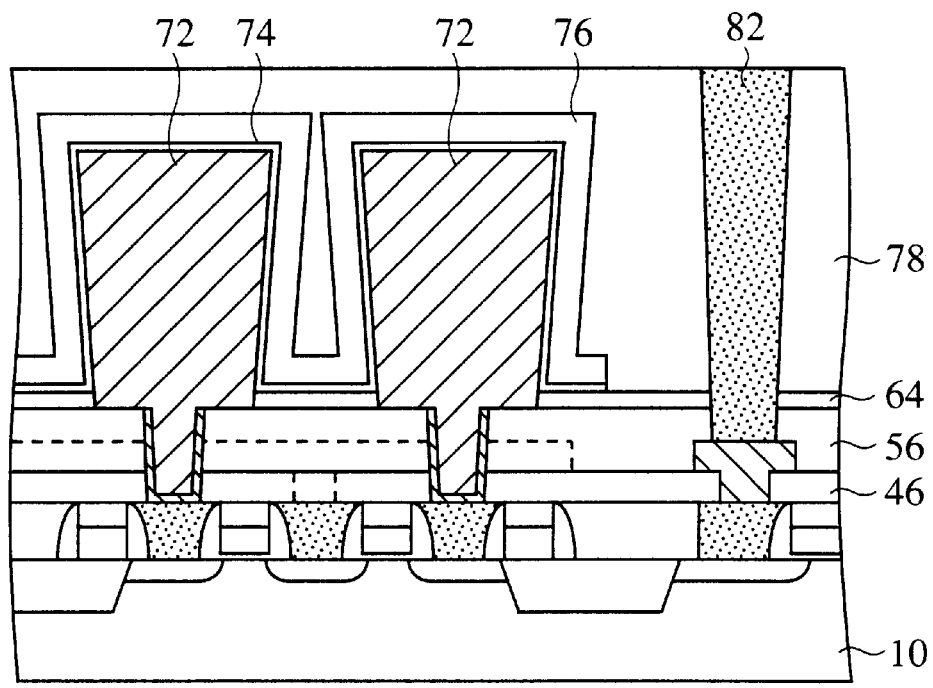
Figure 38B:
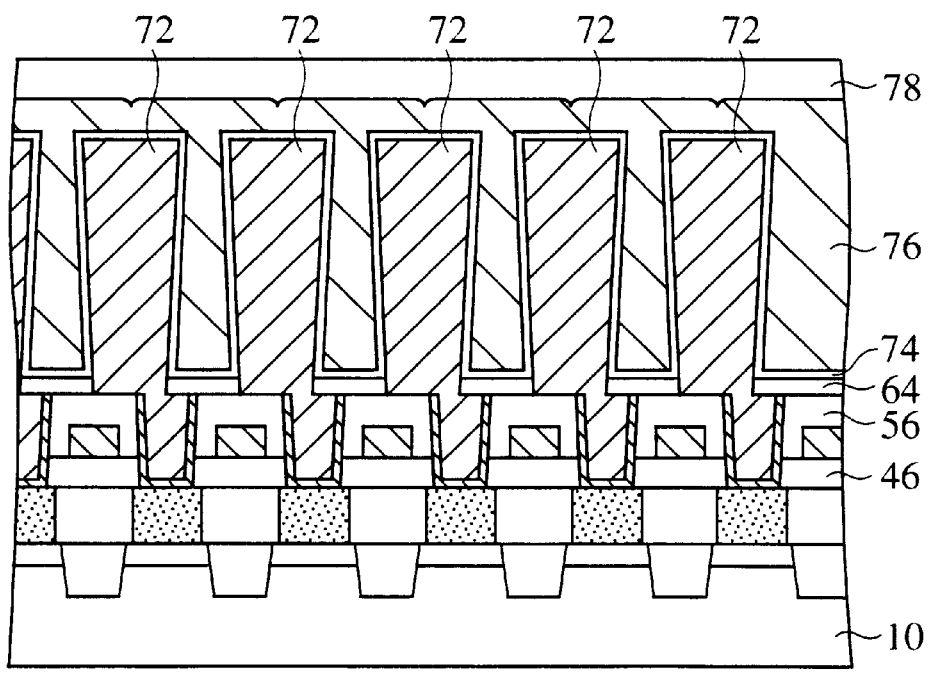

For example, in the first to the fifth embodiments, the present invention is applied to semiconductor devices including cylindrical storage electrodes. However, the present invention is applicable to semiconductor devices including column-shaped storage electrodes. In such case, a material forming the storage electrode 72 completely fills the opening 70 in the steps of FIG. 6A, etc. In a case that the semiconductor device and the method for fabricating the same according to the first embodiment has a column-shaped storage electrode, the semiconductor device has the structure shown in FIGS. 38A and 38B. FIG. 38A is the sectional view along the line A-A' in FIG. 1, and FIG. 38B is the sectional view along the line B-B' in FIG. 1 (in a case that disalignment took place).

In the first and the fifth embodiments, as exemplified in FIG. 4B, the barrier metal 60 and the dummy plug 62 are formed in the contact hole 58. However, the dummy plug 62 alone may be formed in the contact hole (FIG. 39A), and this structure can be used in a case that excessive reaction between a material forming the plug 42 and a material forming the storage electrode 72 does not take place. The barrier metal 60 may be formed only on the bottom of the contact hole 58 (FIG. 39B), and in such case, the barrier metal may be formed in advance on the tops of the plug 42.

Figure 39A:
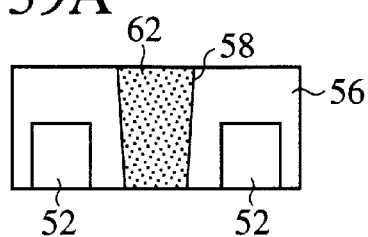
Figure 39B:
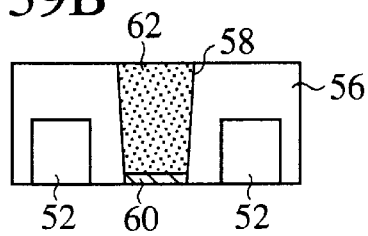
Figure 39C:
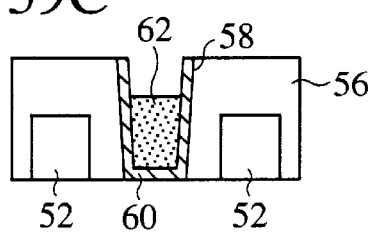
Figure 39D:
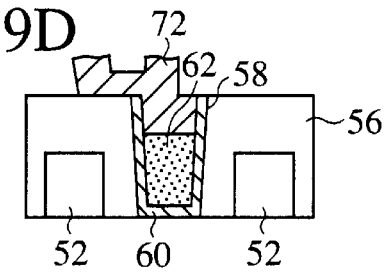
Figure 39E:
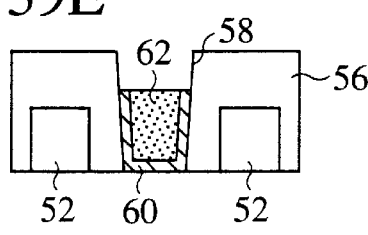
Figure 39F:
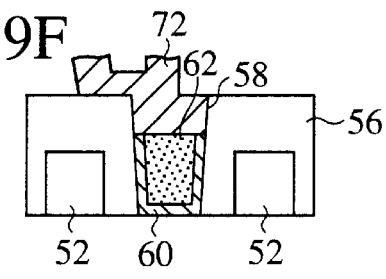
Figure 39G:
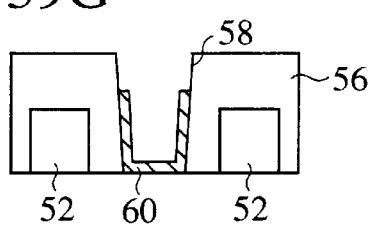
Figure 39H:
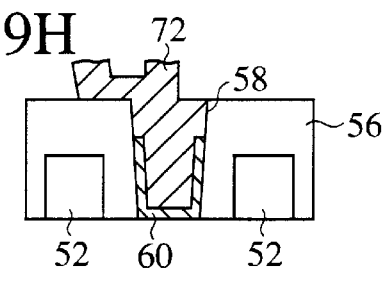
Figure 39I:
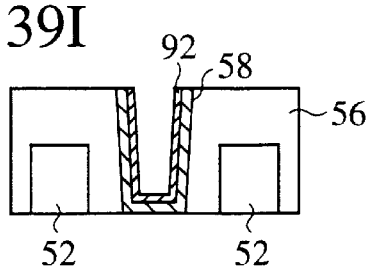

In the first and the fifth embodiments, all the dummy plug 62 in the contact hole 58 is removed, but all the dummy plug 62 may not be essentially removed. For example, as shown in FIG. 39C, the dummy plug 62 only in an upper region of the contact hole 58 is removed so that, as shown in FIG. 39D, the storage electrode 72 can contact with the dummy plug 62 and the barrier metal 60 in the contact hole 58, and in such case, a material forming the dummy plug 62 is preferably a material which does not unnecessarily react with a material forming the storage electrode 72. As shown in FIG. 39E, it is possible that the barrier metal 60 in an upper region of the contact hole 58 is removed to contact the underside of the storage electrode 72 with the dummy plug 62 and the barrier metal 60 as shown in 39F. As shown in FIG. 39G, the barrier metal 60 in an upper region of the contact hole 58 and all the dummy plug 62 are removed to contact the storage electrode 72 with the barrier metal 60 in the contact hole 58 as shown in FIG. 39H. In the second embodiment, as is in FIG. 39C, a part of the dummy plug 62 may be left in the contact hole 58.

In the first and the fourth embodiments, the etching stopper film 64 and the inter-layer insulation film 66 are concurrently patterned to form the opening 70 through the inter-layer insulation film 66 and the etching stopper film 64. However, it is possible that in the same way as in the fifth embodiment, the etching stopper film 64 is formed before forming the contact hole 58, the contact hole 58 is formed through the etching stopper film 64 and the inter-layer insulation films 56, 46, and then the barrier metal 60, the dummy plug 62, the inter-layer insulation film 66, etc. are formed. It makes the etching stopper film 64 unnecessary that the inter-layer insulation film 66 is formed of a material having etching characteristics different from those of materials forming the inter-layer insulation film 56, the barrier metal 60 and the dummy plug 62.

Figure 39J:
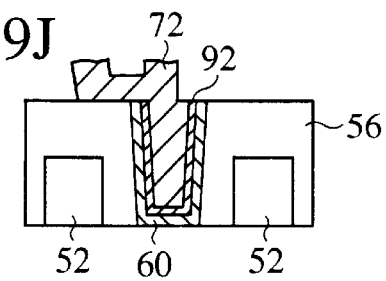
Figure 40:
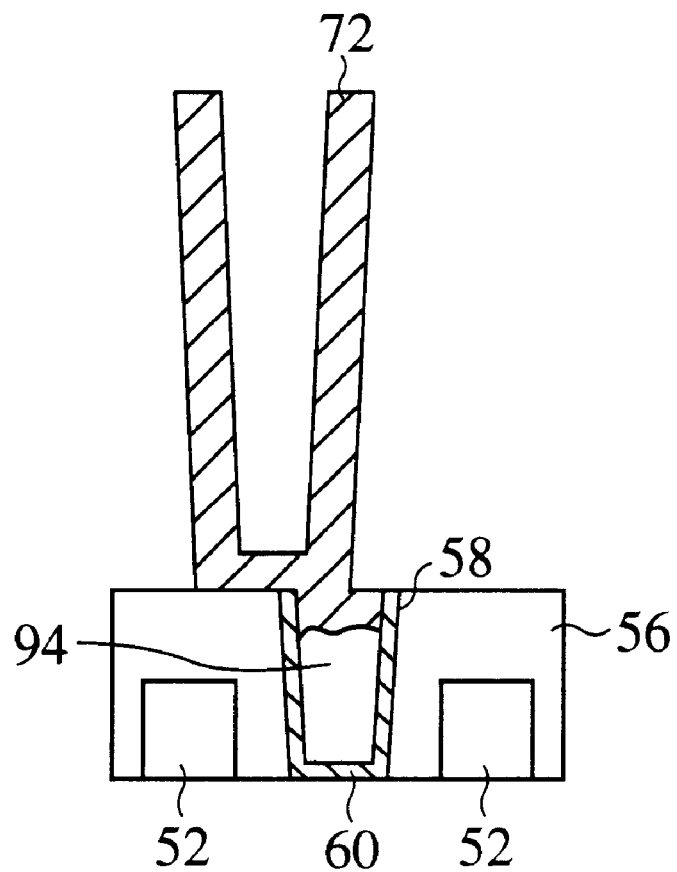
Figure 41A:
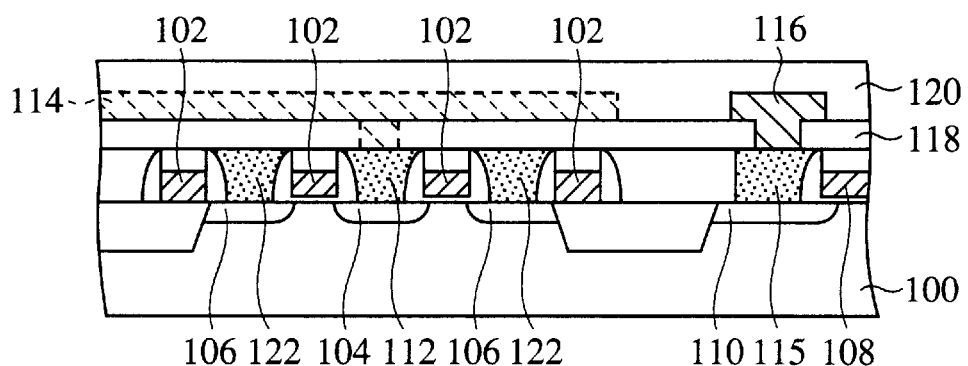
Figure 41B:
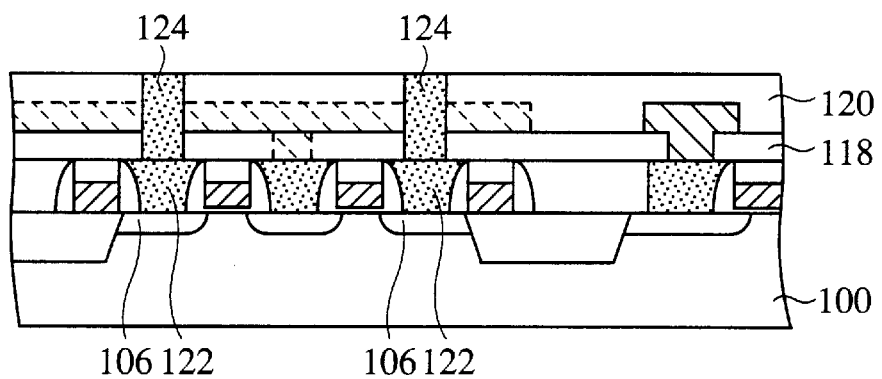
Figure 41C:
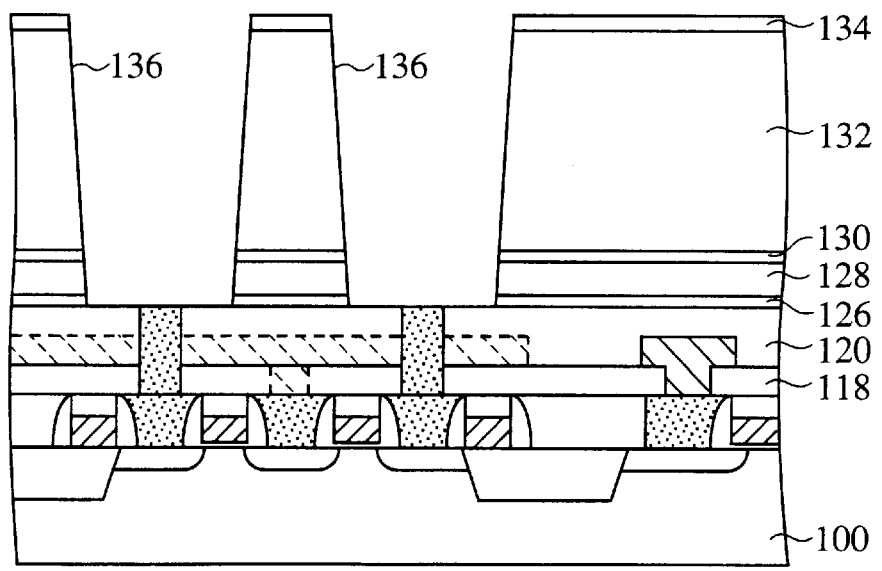
Figure 42A:
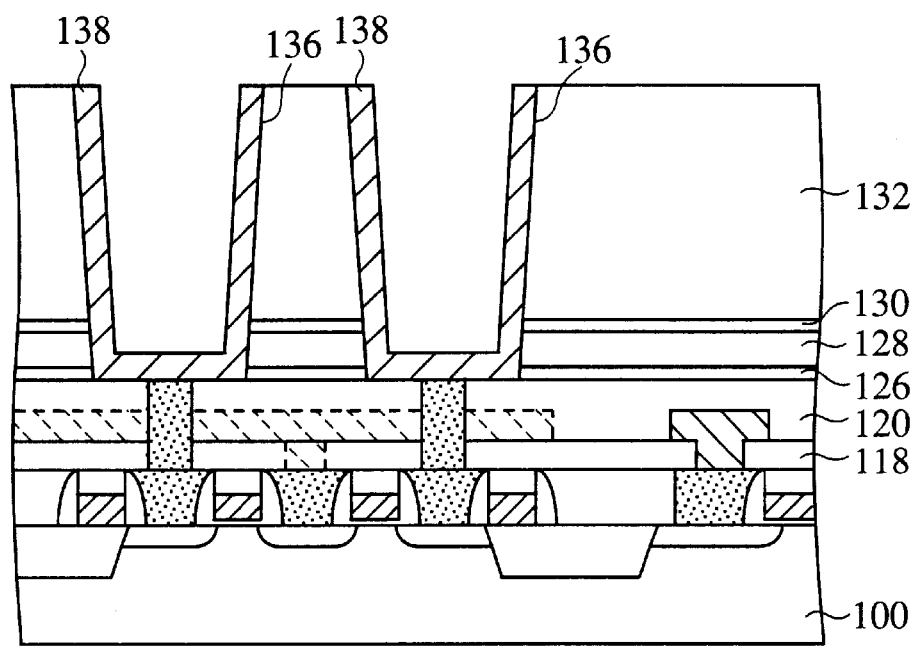
Figure 42B:
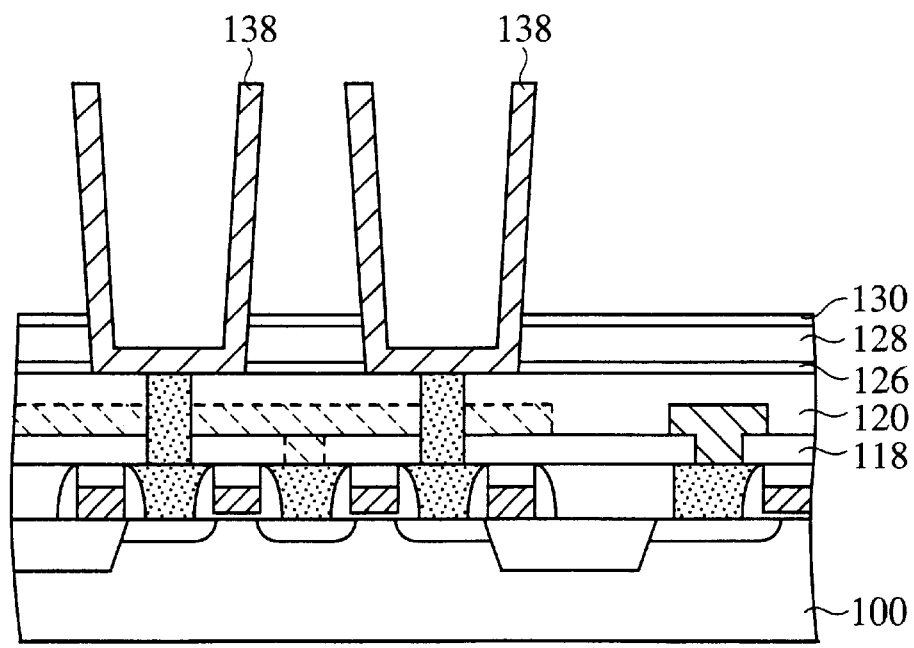
Figure 43A:
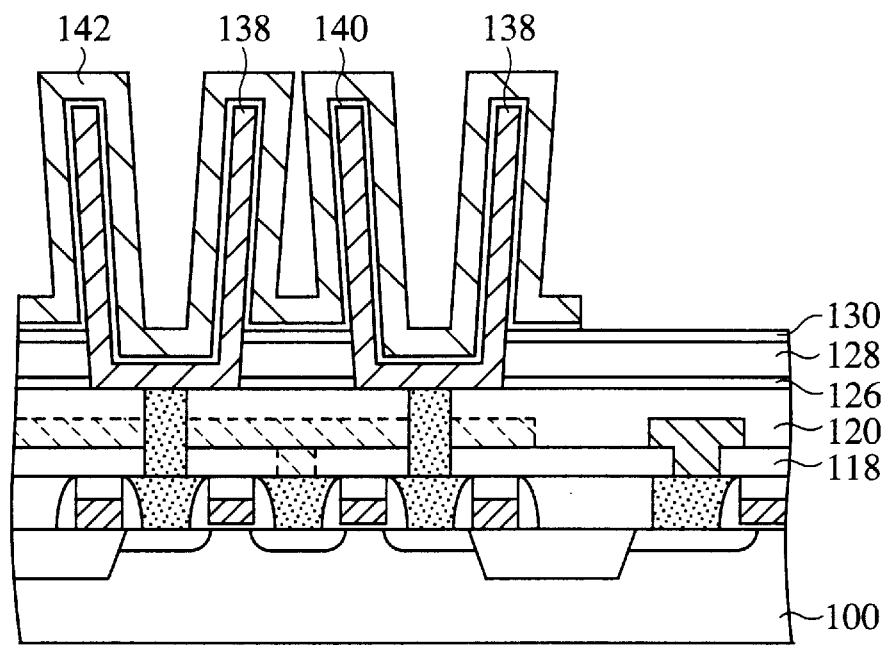
Figure 43B:
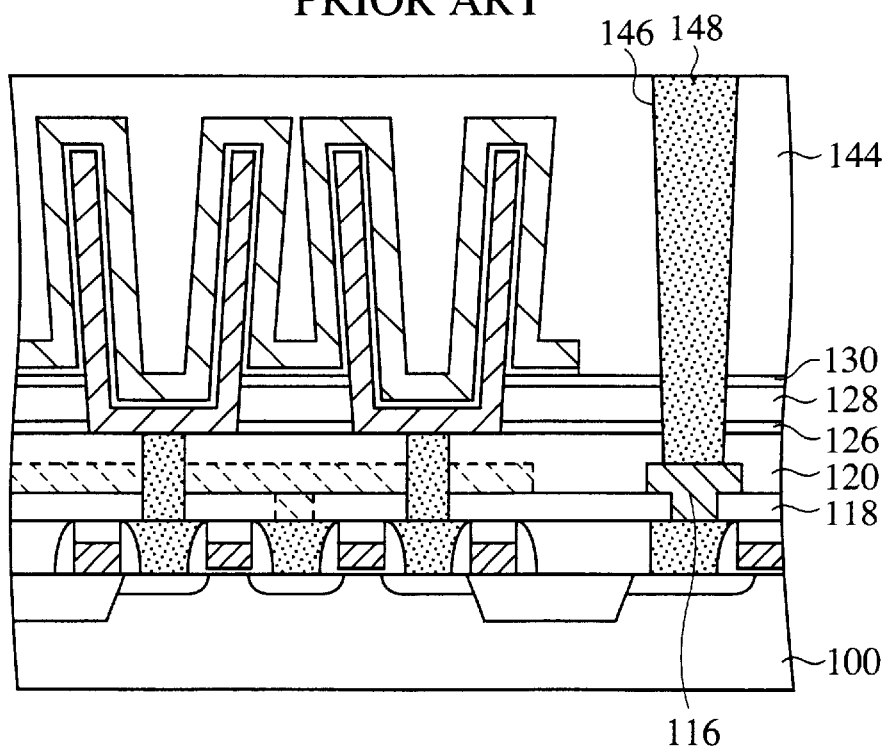
Figure 44A:
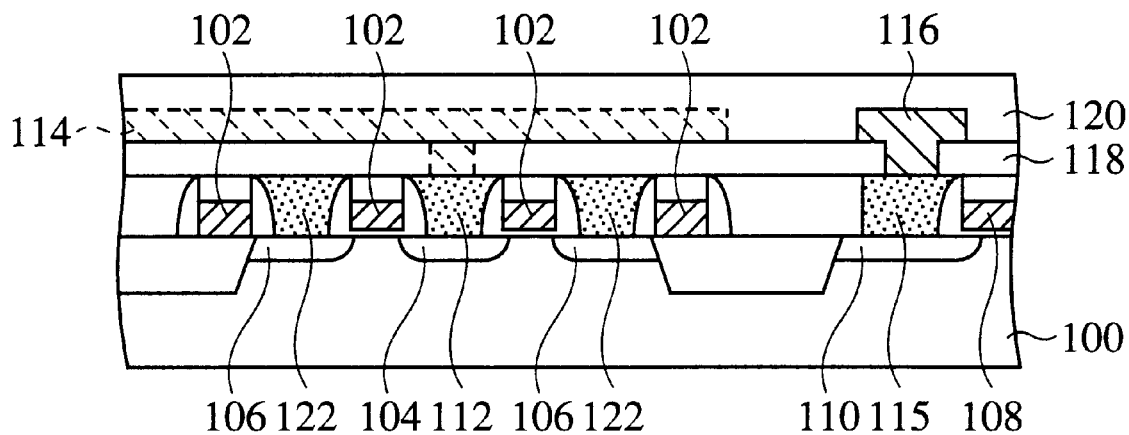
Figure 44B:
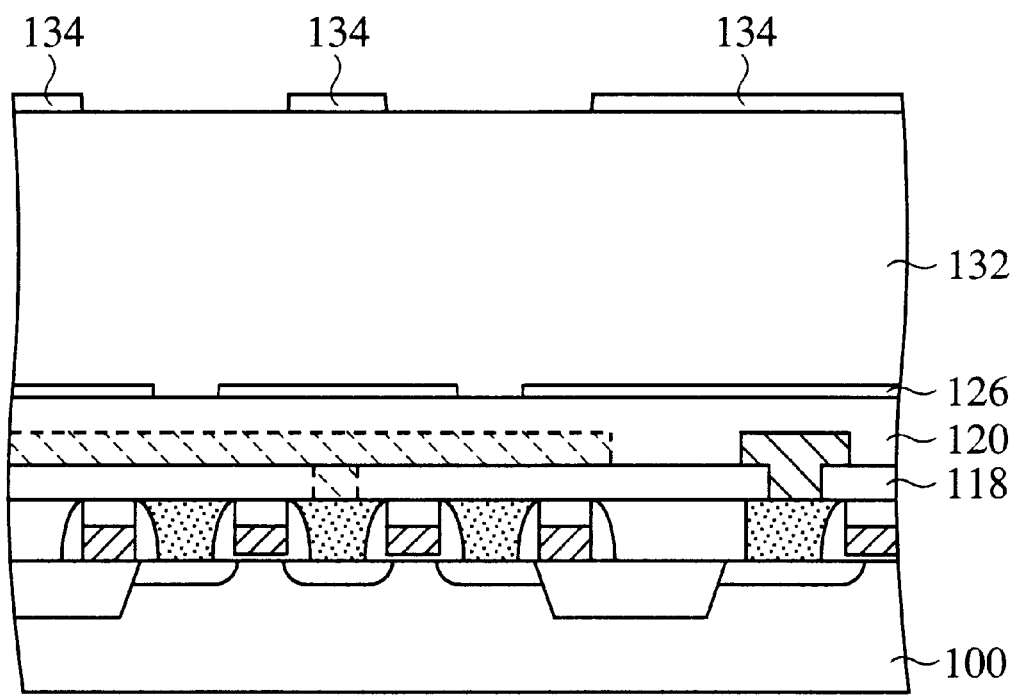
Figure 45A:
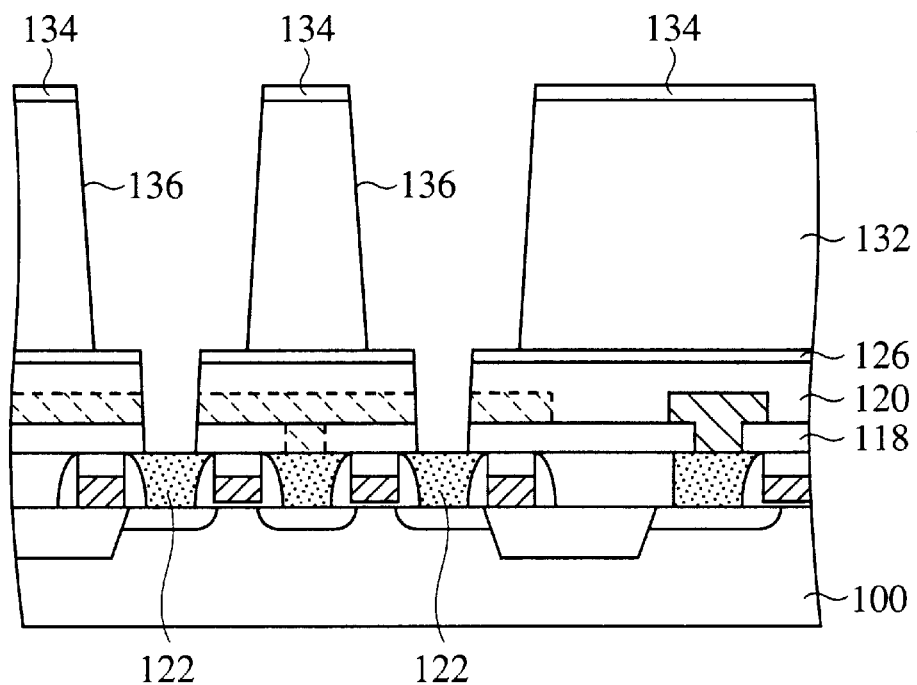
Figure 45B:
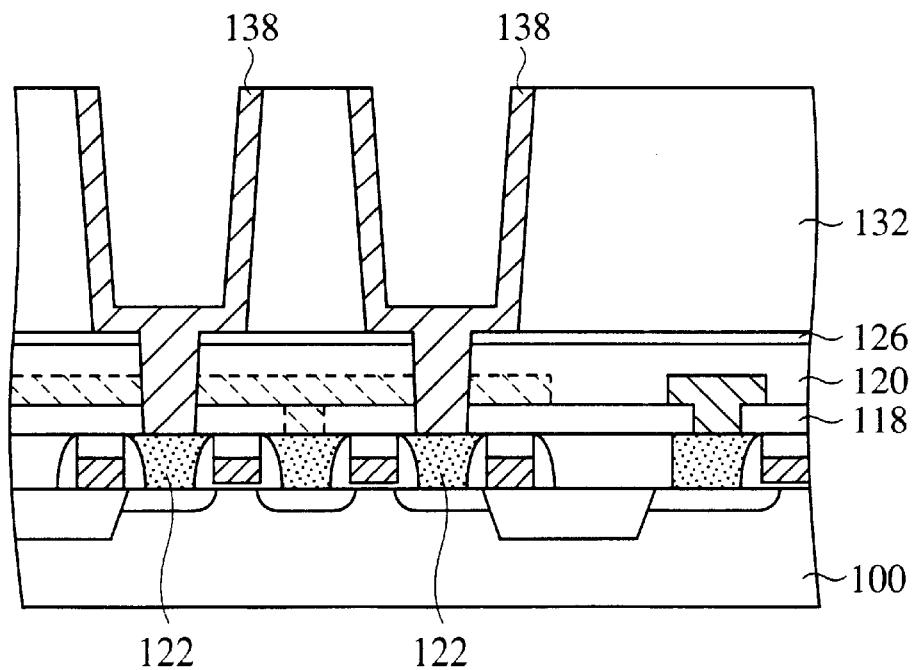
Figure 46A:
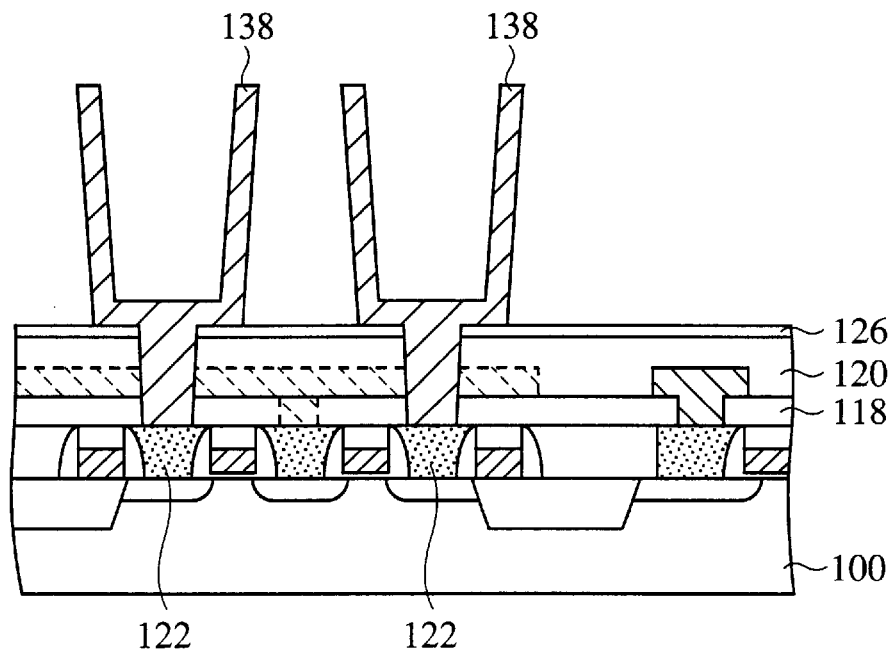
Figure 46B:
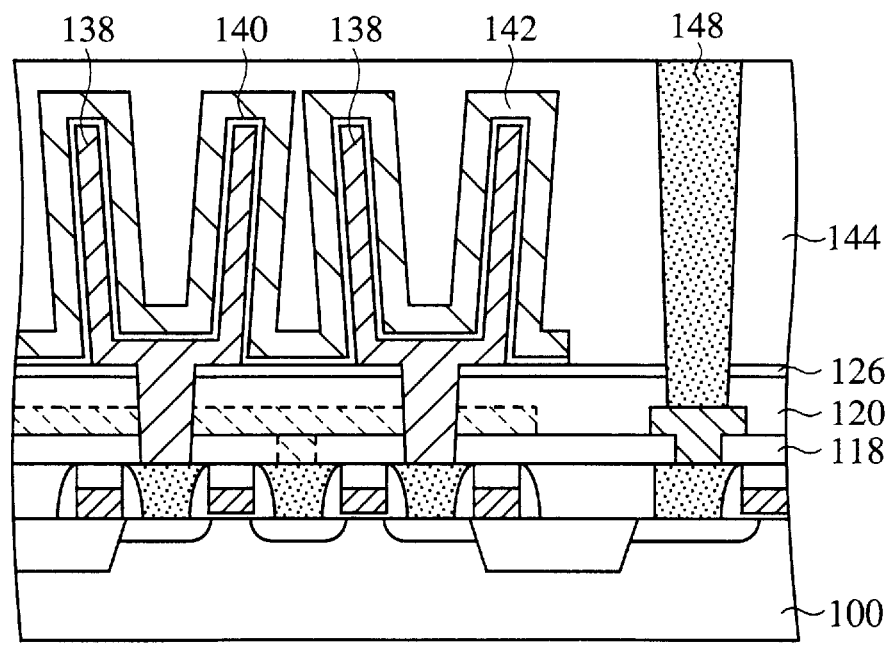

It is possible that a seed layer 92 to be a seed for forming the film of the storage electrode 72 is formed after the barrier metal 60 has been formed and before the dummy plug 62 is formed (FIG. 39I), for easy growth of a material forming the storage electrode 72 in the contact hole 58 in the step of growing the storage electrode 72 (FIG. 39J).

It is not essential to completely fill the contact hole 58 with a material forming the storage electrode 72 because electric connection between the storage electrode 72 and the plug 42 can be secured as long as the storage electrode 72 and the barrier metal 60 are at least partially connected to each other. That is, the present invention will have actually no problem even when the storage electrode 72 in the contact hole 58 has cavities, or, as exemplified in FIG. 40, the storage electrode 72 is formed only in an upper part of the contact hole 58 with the lower part of the contact hole left as a void 94.

In the above-described embodiments, the present invention is applied to capacitors of DRAMs. However, the present invention is not applied essentially to DRAMs but is applicable to semiconductor integrated circuit devices which require a number of capacitors. Specifically, the present invention is applied to ferro-electric random access memories (FeRAM) having the same constitution as DRAMs, and FeRAMs of high integration can be fabricated.

In the above-described embodiments, the present invention is applied to COB (Capacitor Over Bit Line) structure, in which a capacitor is positioned over a bit line. However, the present invention relates to the inter-layer insulation films of a capacitor and a peripheral circuit region, and is irrelevant directly to a position of a bit line. Accordingly, the present invention is applicable also to CUB (Capacitor Under Bit Line) structure, in which a capacitor is positioned under a bit line.

In the above-described embodiments, the present invention is applied to the step of forming the opening 70 for the storage electrode 72 to be buried in. However, the present invention is widely applicable to methods for fabricating semiconductor devices in which a contact hole is formed in a lower insulation film, and an opening which is larger than the contact hole is formed in an upper insulation film formed through an etching stopper film. For example, the present invention may be applied to opening via holes and interconnection grooves in dual damascene processes.

What is claimed is:

1. A method for fabricating a semiconductor device comprising the steps of:

forming over a substrate a first insulation film having a contact hole formed therein;

forming a dummy plug in the contact hole;

forming a second insulation film on the first insulation film with the dummy plug buried in;

forming in the second insulation film an opening for exposing at least a part of the dummy plug;

removing the dummy plug through the opening, the dummy plug being selectively removed with respect to the first insulation film and the second insulation film;

forming in the contact hole and the opening a first electrode after the step of removing the dummy plug, the first electrode being electrically connected to the substrate;

removing the second insulation film to expose an outer surface of the first electrode;

forming a dielectric film on the first electrode; and forming on the dielectric film a second electrode, opposed to the first electrode interposing the dielectric film therebetween.

2. A method for fabricating a semiconductor device according to claim 1, wherein in the step of removing the dummy plug, at least a part of the dummy plug is left on the bottom of the contact hole.

3. A method for fabricating a semiconductor device according to claim 1, further comprising, before the step of forming the dummy plug, the step of:

forming at least in an inside wall and a bottom of the contact hole a conducting film for improving adhesion between the first insulation film and the first electrode or prohibiting reaction between the first electrode and a film formed thereunder.

4. A method for fabricating a semiconductor device according to claim 1, further comprising, after the step of removing the dummy plug the step of:

forming on an inside wall and a bottom of the opening and an inside wall and a bottom of the contact hole a conducting film for improving adhesion between the first insulation film and the first electrode or prohibiting reaction between the first electrode and a film formed thereunder.

5. A method for fabricating a semiconductor device according to claim 4, wherein in the step of forming the conducting film, the conducting film is formed, extended over the first insulation film, and in the step of removing the second insulation film, the second insulation film is removed with the conducting film as a stopper.

6. A method for fabricating a semiconductor device according to claim 1, further comprising, between the step of forming the first insulation film and the step of forming the second insulation film, the step of forming a third insulation film having etching characteristics which are different from those of the first insulation film and those of the second insulation film, in which in the step of removing the second insulation film, the second insulation film is removed with the third insulation film as a stopper.

7. A method for fabricating a semiconductor device according to claim 1, wherein in the step of forming the first insulation film, the first insulation film having etching characteristics of at least a surface region which are different from those of the second insulation film is formed, and in the step of removing the second insulation film, the second insulation film is removed with the first insulation film as a stopper.

8. A method for fabricating a semiconductor device according to claim 1, wherein the substrate has a first region including a region where the first electrode and the second electrode are formed, and a second region which is different from the first region, and in the step of removing the second insulation film, the second insulation film in the first region is selectively removed.

9. A method for fabricating a semiconductor device comprising the steps of:

forming over a substrate a first insulation film having a contact hole formed therein;

forming a first conducting film in the contact hole along an inside wall and a bottom thereof, the first conducting film being for improving adhesion between the first insulation film and a second conducting film which is to be formed or prohibiting reaction between the second conducting film and a film formed thereunder;

forming a dummy plug in the contact hole having the first conducting film formed therein;

forming a second insulation film on the first insulation film with the dummy plug buried in;

forming in the second insulation film an opening down to the first insulation film, at least a part of the dummy plug being exposed in the opening;

removing the dummy plug through the opening, the dummy plug being selectively removed with respect to the first conducting film; and forming in the contact hole and the opening a second conducting film.

10. A method for fabricating a semiconductor device according to claim 4, further comprising, after the step of removing the second insulation film, the step of:

removing the conducting film so as to leave the conducting film only in the contact hole.

11. A method for fabricating a semiconductor device according to claim 5, further comprising, after the step of removing the second insulation film, the step of:

removing the conducting film so as to leave the conducting film only in the contact hole.

* * * * *